United States Patent [19]

DiGiacomo et al.

[11] Patent Number: 4,630,219

[45] Date of Patent: Dec. 16, 1986

[54] ELEMENT PLACEMENT METHOD

[75] Inventors: Angela DiGiacomo, San Jose, Calif.; Kantilal H. Khokhani, Wappingers Falls, N.Y.

[73] Assignee: International Business Machines Corporation, Armonk, N.Y.

[21] Appl. No.: 554,855

[22] Filed: Nov. 23, 1983

[51] Int. Cl.[4] .................................. G06F 15/60
[52] U.S. Cl. ........................... 364/488; 364/300; 364/489; 364/490; 364/491
[58] Field of Search ............... 364/300, 488, 489, 490, 364/491

[56] References Cited

U.S. PATENT DOCUMENTS

| | | | |
|---|---|---|---|
| 3,653,071 | 3/1972 | Hill et al. | 364/300 |
| 3,653,072 | 3/1972 | Ballas et al. | 364/300 |
| 3,654,615 | 4/1972 | Freitag | 364/491 |
| 3,681,782 | 8/1972 | Scanlon | 364/491 X |
| 3,702,004 | 10/1972 | Eskew et al. | 364/489 X |
| 4,093,990 | 6/1978 | Koller | 364/491 X |
| 4,377,849 | 3/1983 | Finger et al. | 364/300 X |
| 4,500,963 | 2/1985 | Smith et al. | 364/300 |

OTHER PUBLICATIONS

"The Design of Printed Circuit Layouts by Computer": by Dunne, Proceedings of the Third Australian Computer Conference, 1967, pp. 419-423.

Nishioka et al., "An Approach of Gate Assignment and Module Placement for Printed Wiring Boards", Systems-Computers-Controls, vol. 11, No. 3, pp. 54-65, 1980.

Soukup, "Circuit Layout", Proc. of the IEEE, vol. 69, No. 10, pp. 1281-1304, Oct. 1981.

T. Raymond, "LSI/VLSI Design Automation," *Computer*, vol. 14, No. 7, pp. 89-101, (Jul. 1981).

IBM Technical Disclosure Bulletin, vol. 17, No. 20, Mar. 1975, "Hierarchical Placement Method", W. E. Donath, pp. 3121-3125.

1981 IEEE, 18th Design Automation Conference, Nashville, Tenn., 6/29, 30 & Jul. 1, 1981, "Automatic Component Placement in an Interactive Minicomputer Environment", Charles F. Shupe, Bell Laboratories, Paper 9.3, pp. 145-152.

1981 IEEE, 18th Design Automation Conference, Nashville, TN, 6/29, 30 & Jul. 1, 1981, "Placement of Variable Size Circuits on LSI Masterslices", K. H. Khokhani, A. M. Patel, W. Ferguson, J. Sessa, D. Hatton, IBM Corp., Paper 20.3, pp. 426-434.

IEE 1981, European Conference on Electronic Design Automation, Brighton, Sussex, England, 1-4 Sept. 1981, "A System for Automatic Layout of Gat Array Chips", K. W. Laller, J. B. Hickson, Jr., R. K. Jackson, pp. 54-58.

No. 14, Design Automation Conference Proceedings, Jun. 20, 21, & 22, 1977, "The Chip Layout Problem: A Placement Procedure for LSI", K. H. Khokhani and A. M. Patel, pp. 291-297.

"A Class of Min-Cut Placement Algorithms", M. A. Breuer, Depts. of Electrical Engineering & Computer Science, University of Southern California, Los Angeles, Calif., pp. 284-290.

Design Automation of Digital Systems, Theory and Techniques, Prentice-Hall, Inc. Engelwood Cliffs, N.J., Chapter 5, Placement Techniques, Maurice Hanan & Jerome M. Kurtzberg, pp. 213-282.

*Primary Examiner*—Felix D. Gruber
*Assistant Examiner*—Edward R. Cosimano
*Attorney, Agent, or Firm*—Douglas A. Lashmit; Mitchell S. Bigel

[57] ABSTRACT

A method for placing a plurality of different size electronic elements having predetermined interconnection requirements thereamong, on a next level electronic package having an array of element placement positions thereon determines optimum placement in a three pass process. In the first pass, all of the elements are treated as if they are the same size, defined as a unit size, and are assigned to element positions on a unit size next level package, then their placement is optimized. These unit size elements are then replaced by macro size elements, which are approximately the actual size of the corresponding electronic elements. The macro size elements are then rearranged for optimal placement on a macro model image, taking their sizes and shapes into account. Finally, the macro size elements are replaced by actual size elements which are placed on an actual size next level package in element positions, and their placement is again optimized. By optimizing element placement in a three pass process, i.e., unit, macro and actual size, a more efficient placement process is obtained because the element placement program need not take all of the dimensional characteristics of the elements into account at once.

45 Claims, 69 Drawing Figures

NET LIST

| COMPONENT # | PIN # | PRIORITY OF NET | NET # | X,Y POSITION OF PIN FROM COMPONENT ORIGIN |
|---|---|---|---|---|
| 3 | 3 | 1 | 1 | 4, 2 |
| 1 | 2 | 1 | 1 | 0, 4 |
| 1 | 1 | 0 | 2 | 0, 2 |
| 5 | 1 | 2 | 3 | 0, 1 |
| 2 | 3 | 0 | 4 | 0, 6 |
| 1 | 3 | 1 | 1 | 0, 6 |
| 4 | 3 | 0 | 5 | 1, 2 |
| I/O | E | 0 | 7 | 10, 1 |
| 4 | 1 | 0 | 7 | 0, 1 |
| I/O | H | 0 | 6 | 16, 1 |
| 2 | 2 | 0 | 5 | 0, 4 |
| 2 | 1 | 0 | 6 | 0, 2 |
| 1 | 6 | 2 | 3 | 6, 6 |
| 5 | 3 | 0 | 4 | 1, 1 |
| 4 | 2 | 0 | 2 | 0, 2 |
| 2 | 4 | 2 | 3 | 0, 8 |

0-0 VOLTS
X-5 VOLTS

TOTAL # OF CHANNELS IN X/# MACRO IMAGE UNITS IN X=134/16 = 8.38

TOTAL # OF CHANNELS IN Y/# MACRO IMAGE UNITS IN Y= 82/10 = 8.2

TOTAL # OF CHANNELS IN X/# UNIT IMAGE UNITS IN X = 134/15 = 8.93

TOTAL # OF CHANNELS IN Y/# UNIT IMAGE UNITS IN Y = 82/4 = 20.5

NUMBER OF COMPONENTS  66

ACTUAL SIZE OF CARD  67X  41Y

DISTRIBUTION OF COMPONENTS

|   | $\Delta X$ | $\Delta Y$ | N=NUMBER OF COMPONENTS | $N\Delta X$ | $N\Delta Y$ |
|---|---|---|---|---|---|
| 1 | 7 | 14 | 4 | 28 | 56 |
| 2 | 1 | 1 | 8 | 8 | 8 |
| 3 | 4 | 9 | 24 | 96 | 216 |
| 4 | 4 | 10 | 12 | 48 | 120 |
| 5 | 4 | 12 | 5 | 20 | 60 |
| 6 | 11 | 11 | 1 | 11 | 11 |
| 7 | 4 | 1 | 4 | 16 | 4 |
| 8 | 6 | 1 | 8 | 48 | 8 |
|   |   |   | 66 | 275 | 483 |

EXAMPLE OF ACTUAL SIZED COMPONENTS ON A CARD

FIG. 12

NUMBER OF COMPONENTS                              66

ACTUAL SIZE OF CARD                               67X        41Y

DISTRIBUTION OF COMPONENTS

|   | ΔX | ΔY | N=NUMBER OF COMPONENTS | NΔX | NΔY |
|---|----|----|------------------------|-----|-----|
| 1 | 7  | 14 | 4                      | 28  | 56  |
| 2 | 1  | 1  | 8                      | 8   | 8   |
| 3 | 4  | 9  | 24                     | 96  | 216 |
| 4 | 4  | 10 | 12                     | 48  | 120 |
| 5 | 4  | 12 | 5                      | 20  | 60  |
| 6 | 11 | 11 | 1                      | 11  | 11  |
| 7 | 4  | 1  | 4                      | 16  | 4   |
| 8 | 6  | 1  | 8                      | 48  | 8   |
|   |    |    | 46                     | 203 | 463 |

AVERAGE X DIMENSION OF COMPONENT = $\frac{203}{46}$ = 4.41

AVERAGE Y DIMENSION OF COMPONENT = $\frac{463}{46}$ = 10.15

NUMBER OF COMPONENTS FITTING IN X DIMENSION = $\frac{67}{4.41}$ = 15.2

NUMBER OF COMPONENTS FITTING IN Y DIMENSION = $\frac{41}{10.15}$ = 4.1

UNIT SIZE REQUIRED        15X        4Y

EXAMPLE OF UNIT SIZE MODEL GENERATION

FIG. 13

|  ACTUAL  |  |  | MACRO SIZES |  | MACRO SIZES |  |  |
|---|---|---|---|---|---|---|---|
| ΔX | ΔY | N | ΔX | ΔY | NΔX | NΔY | NΔXΔY |
| 7 | 14 | 4 | 2 | 4 | 8 | 16 | 32 |
| 4 | 9 | 24 | 1 | 2 | 24 | 48 | 48 |
| 4 | 10 | 12 | 1 | 3 | 12 | 36 | 36 |
| 4 | 12 | 5 | 1 | 3 | 5 | 15 | 15 |
| 11 | 11 | 1 | 3 | 3 | 3 | 3 | 9 |
|  |  | 46 |  |  | 52 | 118 | 140 |

AVERAGE X DIMENSION OF COMPONENT = $\frac{52}{46}$ = 1.13

AVERAGE Y DIMENSION OF COMPONENT = $\frac{118}{46}$ = 2.43

MACRO IMAGE SIZE IN X DIRECTION = 15.2 * 1.13 = 16

MACRO IMAGE SIZE IN Y DIRECTION = 4.1 * 2.43 = 10

EXAMPLE OF MACRO SIZE MODEL GENERATION

FIG. 14

NET LIST

| COMPONENT # | PIN # | PRIORITY OF NET | NET # | X,Y POSITION OF PIN FROM COMPONENT ORIGIN |
|---|---|---|---|---|
| 3 | 3 | 1 | 1 | 4, 2 |
| 1 | 2 | 1 | 1 | 0, 4 |
| 2 | 4 | 2 | 2 | 0, 8 |
| 1 | 3 | 1 | 1 | 0, 6 |
| I/O | E | 0 | 3 | 10, 1 |
| I/O | H | 0 | 4 | 16, 1 |
| 2 | 2 | 0 | 3 | 0, 4 |
| 2 | 1 | 0 | 4 | 0, 2 |
| 1 | 6 | 2 | 2 | 6, 6 |

CLUSTERING AND REORDERING 22

FIG. 18A

CONNECTIVITY MATRIX

| SUMMED VALUES | | 1 | 2 | 3 | 4 | 5 | 6 | 7 | 8 | 9 | 10 | 11 | 12 | MAXIMUM CONNECTIVITY VALUE | MOST CONNECTED COMPONENT |
|---|---|---|---|---|---|---|---|---|---|---|---|---|---|---|---|
| 14.0 | 1 | x | 6.5 | x | 2.5 | x | 1.8 | 1.6 | 1.6 | x | x | x | x | 6.5 | 2 |
| 12.4 | 2 | 6.5 | x | 1.9 | 2.5 | x | x | x | x | 1.5 | x | x | x | 6.5 | 1 |
| 13.2 | 3 | x | 1.9 | x | 2.0 | 1.1 | 0.6 | 1.1 | 1.1 | x | 0.6 | 2.2 | 2.6 | 2.6 | 12 |
| 10.6 | 4 | 2.5 | 2.5 | 2.0 | x | x | x | x | x | x | x | 1.8 | 1.8 | 2.5 | 1 |
| 20.2 | 5 | x | x | 1.1 | x | x | 1.1 | 5.8 | 6.3 | 1.0 | x | 2.2 | 2.7 | 6.3 | 8 |
| 7.6 | 6 | 1.8 | x | 0.6 | x | 1.1 | x | x | x | 2.0 | 2.1 | x | x | 2.1 | 10 |
| 14.9 | 7 | 1.6 | x | 1.1 | x | 5.8 | x | x | 2.0 | x | x | 2.2 | 2.2 | 5.8 | 5 |
| 16.0 | 8 | 1.6 | x | 1.1 | x | 6.3 | x | 2.0 | x | x | x | 2.5 | 2.5 | 6.3 | 5 |
| 9.8 | 9 | x | 1.5 | x | x | 1.0 | 2.0 | x | x | x | 5.3 | x | x | 5.3 | 10 |
| 8.0 | 10 | x | x | 0.6 | x | x | 2.1 | x | x | 5.3 | x | x | x | 5.3 | 9 |
| 14.8 | 11 | x | x | 2.2 | 1.8 | 2.2 | x | 2.2 | 2.5 | x | x | x | 4.2 | 4.2 | 12 |
| 16.3 | 12 | x | x | 2.6 | 1.8 | 2.7 | x | 2.2 | 2.5 | x | x | 4.2 | x | 4.2 | 11 |

|  | SEED | COMPONENT # |
|---|---|---|
| 62 | A | 1, 2 |
|  | B | 8, 5, 7 |
|  | C | 10, 9 |
|  | D | 11, 12 |

|  | GROUP | COMPONENT # |
|---|---|---|
| 63 | A | 1, 2, 4 |
|  | B | 8, 5, 7, 3 |
|  | C | 10, 9, 6 |
|  | D | 12, 11 |

| SORTED VALUES | COMPONENT i | COMPONENT j |  |
|---|---|---|---|
| 6.5 | 1 | 2 | } 1, 2 |
| 6.5 | 2 | 1 |  |
| 6.3 | 8 | 5 |  |
| 6.3 | 5 | 8 | } 7, 8, 5 |
| 5.8 | 7 | 5 |  |
| 5.3 | 9 | 10 | } 9, 10 |
| 5.3 | 10 | 9 |  |
| 4.2 | 12 | 11 | } 11, 12 |
| 4.2 | 11 | 12 |  |
| 2.6 | 3 | 12 |  |
| 2.5 | 4 | 1 |  |
| 2.1 | 6 | 10 |  |

FIG. 18B

| SUM | | A | B | C | D |
|---|---|---|---|---|---|
| 8.37 | A | X | 3.39 | 3.25 | 1.73 |
| 11.79 | B | 3.39 | X | 3.39 | 5.01 |
| 8.37 | C | 3.25 | 3.39 | X | 1.73 |
| 8.47 | D | 1.73 | 5.01 | 1.73 | X |

FIG. 19A

| SORTED VALUES | GROUP i | GROUP j |
|---|---|---|
| 5.01 | B | D |
| 5.01 | D | B |
| 3.39 | A | B |
| 3.39 | B | A |
| 3.39 | B | C |
| 3.39 | C | B |
| 3.25 | A | C |
| 3.25 | C | A |
| 1.73 | A | D |
| 1.73 | D | A |
| 1.73 | C | D |
| 1.73 | D | C |

FIG. 19B

1 - 12 REPRESENT COMPONENTS

A - D REPRESENT GROUPS OF HIGHLY INTERCONNECTED COMPONENTS

1. ORDERING OF GROUPS BASED ON CONNECTIVITY

GROUPS ORDER   B, D, A, C ←———— 77

2. ORDERING OF COMPONENTS BASED ON ORDER OF GROUPS

COMPONENTS ORDER

| B | D | A | C |
   |---|---|---|---|
   | 8,5,7,3 | 11,12 | 1,2,4 | 10,9,6 |

3. REORDERING OF COMPONENTS WITHIN GROUPS

NEW ORDER

| B | D | A | C |
   |---|---|---|---|
   | 8,5,7,3 | 12,11 | 4,2,1 | 6,9,10 ←———— 79 |

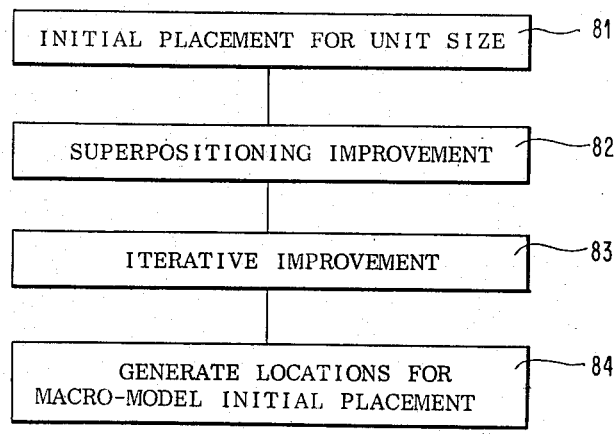
FIG. 22   PLACEMENT OPTIMIZATION: UNIT SIZE, 23
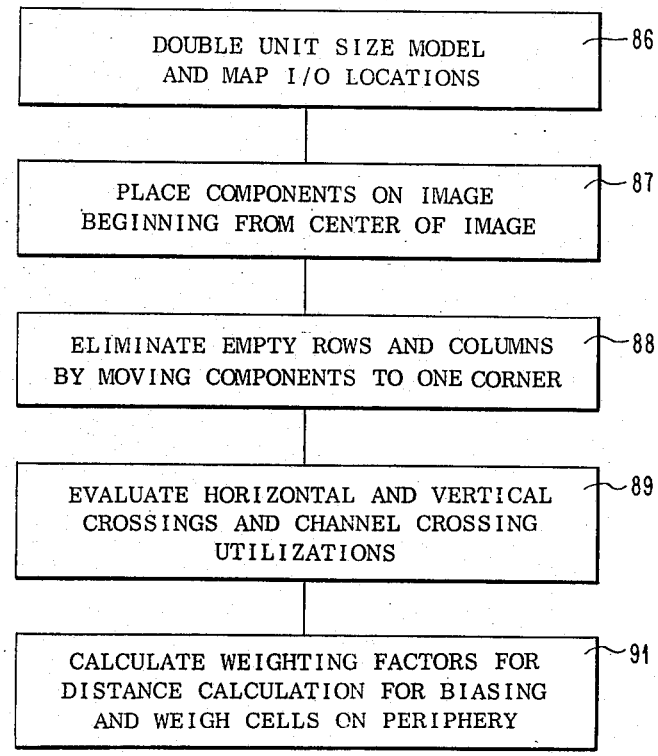
FIG. 23   INITIAL PLACEMENT FOR UNIT SIZE 81

| COMPONENT NO. | ACTUAL DIMENSIONS X | Y | X*Y | MACRO MODEL DIMENSIONS $X_m$ | $Y_m$ |
|---|---|---|---|---|---|
| 1 | 7 | 9 | 63 | 2 | 2 |
| 2 | 11 | 7 | 77 | 3 | 2 |
| 3 | 4 | 8 | 32 | 1 | 2 |
| 4 | 4 | 12 | 48 | 1 | 3 |
| 5 | 10 | 12 | 120 | 2 | 3 |
| 6 | 4 | 9 | 36 | 1 | 2 |
| 7 | 7 | 7 | 49 | 2 | 2 |
| 8 | 17 | 4 | 68 | 4 | 1 |
| 9 | 4 | 7 | 28 | 1 | 2 |
| 10 | 8 | 10 | 80 | 2 | 2 |
| 11 | 8 | 9 | 72 | 2 | 2 |
| 12 | 8 | 7 | 56 | 2 | 2 |
| TOTALS | $\Sigma X=92$ | $\Sigma Y=101$ | $\Sigma XY=729$ | $\Sigma X_m=23$ | $\Sigma Y_m=25$ |

SIZE OF IMAGE = 48X, 28Y       AREA OF IMAGE = 48 * 28 = 1344

TOTAL AREA UTILIZATION = $\frac{\Sigma XY * 100}{\text{AREA OF IMAGE}} = \frac{729 * 100}{1344} = 54.24\%$ AVERAGE X DIMENSION OF COMPONENTS = $\Sigma X$/NO. OF COMPONENTS = 92/12 = 7.66

AVERAGE Y DIMENSION OF COMPONENTS = $\Sigma Y$/NO. OF COMPONENTS = 101/12 = 8.42

X DIMENSION OF UNIT IMAGE = $\frac{\text{SIZE OF IMAGE IN X}}{\text{AVG. X DIMENSION OF COMPONENTS}} = \frac{48}{7.66} \approx 6$ Y DIMENSION OF UNIT IMAGE = $\frac{\text{SIZE OF IMAGE IN Y}}{\text{AVG. Y DIMENSION OF COMPONENTS}} = \frac{28}{8.42} \approx 3$ AVERAGE X DIMENSION FOR MACRO = $\Sigma X_m$/NO. OF COMPONENTS = 23/12 ≈ 2

AVERAGE Y DIMENSION FOR MACRO = $\Sigma Y_m$/NO. OF COMPONENTS = 25/12 ≈ 2

X MACRO IMAGE DIMENSION = X DIMENSION OF UNIT IMAGE * AVG.
    X DIMENSION FOR MACRO = 6*2 = 12

Y MACRO IMAGE DIMENSION = Y DIMENSION OF UNIT IMAGE * AVG.
    Y DIMENSION FOR MACRO = 3*2 = 6

FIG. 24

UNIT SIZE IMAGE REQUIRED - 6 x 3

UNIT SIZE IMAGE USED - 12 x 6

ACTUAL IMAGE SIZE - 48 x 28

COMPONENT LIST:

$$\underbrace{\underbrace{\frac{B}{8,5,7,3} \quad \underbrace{\frac{D}{12,11}} \quad \underbrace{\frac{A}{4,2,1}} \quad \underbrace{\frac{C}{6,9,10}}}}$$

9/40 = 23% TOTAL HORIZONTAL CROSSING UTILIZATION

10/36 = 28% TOTAL VERTICAL CROSSING UTILIZAITON

NET 1 - CONNECTING COMPONENTS A, B, C, Y ←—— 119
NET 2 - CONNECTING COMPONENTS D, E, Y ←—— 121

LOCATION GENERATION FOR MACRO MODEL INITIAL PLACEMENT, 84

NEW STARTING LOCATION CALCULATION FOR COMPONENT 1:

$$\text{NEW ROW} = \frac{\text{NO. OF MACRO ROWS}}{\text{NO. OF UNIT ROWS}} * (\text{ROW COORDINATE ON UNIT IMAGE} - 1) + 1$$

$$= \frac{6}{3} * (1-1) + 1 = 1$$

$$\text{NEW COLUMN} = \frac{\text{NO. OF MACRO COLUMNS}}{\text{NO. OF UNIT COLUMNS}} * (\text{COLUMN COORDINATE ON UNIT IMAGE} - 1) + 1$$

$$= \frac{12}{6} * (2-1) + 1 = 2 + 1 = 3$$

FIG. 35C

LOCATION GENERATION FOR ACTUAL MODEL INITIAL PLACEMENT

| COMPONENT NO. | STARTING LOCATION ON MACRO MODEL IMAGE | | SCALED LOCATION ON ACTUAL IMAGE | |
|---|---|---|---|---|
| | X MACRO (COLUMN) | Y MACRO (ROW) | X ACTUAL (COLUMN) | Y ACTUAL (ROW) |
| 1 | 2 | 1 | 5 | 1 |
| 2 | 4 | 1 | 13 | 1 |
| 3 | 7 | 1 | 25 | 1 |
| 4 | 9 | 1 | 33 | 1 |
| 5 | 11 | 1 | 41 | 1 |
| 6 | 1 | 3 | 1 | 10 |
| 7 | 7 | 3 | 25 | 10 |
| 8 | 9 | 4 | 33 | 15 |
| 9 | 1 | 5 | 1 | 19 |
| 10 | 3 | 5 | 9 | 19 |
| 11 | 9 | 5 | 33 | 19 |
| 12 | 11 | 5 | 41 | 19 |

RATIO OF SIDES IN X-DIMENSION = $\frac{\text{X-SIZE OF ACTUAL IMAGE}}{\text{X-SIZE OF MACRO MODEL IMAGE}} = \frac{48}{12} = 4$ RATIO OF SIDES IN Y-DIMENSION = $\frac{\text{Y-SIZE OF ACTUAL IMAGE}}{\text{Y-SIZE OF MACRO MODEL IMAGE}} = \frac{28}{6} = 4.6$

FORMULAS FOR SCALING UP OF LOCATIONS:

$X_{ACTUAL} = (X_{MACRO} - 1) * \text{RATIO OF X-SIDES} + 1$ $Y_{ACTUAL} = (Y_{MACRO} - 1) * \text{RATIO OF Y-SIDES} + 1$

FIG. 42A

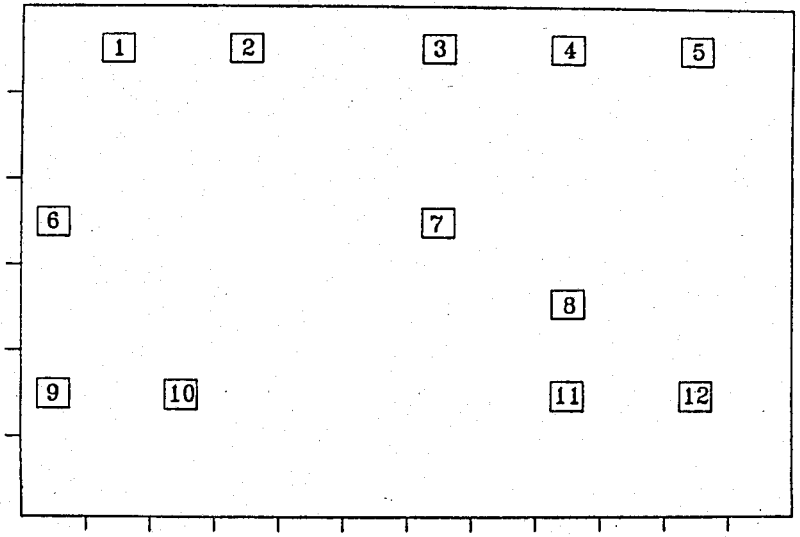

FIG. 42B

| COMPONENT NO. | X-Y DIMENSIONS OF COMPONENTS | | TENTATIVE LOCATION OF ACTUAL IMAGE AFTER SLIDING | | | |
|---|---|---|---|---|---|---|
| | X | Y | STARTING COLUMN | ENDING COLUMN | STARTING ROW | ENDING ROW |
| 1 | 7 | 9 | 5 | 11 | 1 | 9 |
| 2 | 11 | 7 | 13 | 23 | 1 | 7 |
| 3 | 4 | 8 | 25 | 28 | 1 | 8 |
| 4 | 4 | 12 | 33 | 36 | 1 | 12 |
| 5* | 10 | 12 | 39 | 48 | 1 | 12 |
| 6 | 4 | 9 | 1 | 4 | 10 | 18 |
| 7 | 7 | 7 | 25 | 31 | 10 | 16 |
| 8* | 17 | 4 | 32 | 48 | 15 | 18 |
| 9 | 4 | 7 | 1 | 4 | 19 | 25 |
| 10 | 8 | 10 | 9 | 16 | 19 | 28 |
| 11 | 8 | 9 | 33 | 40 | 19 | 27 |
| 12 | 8 | 7 | 41 | 48 | 19 | 25 |

\* DENOTES COMPONENTS MOVED DURING SLIDING

FIG. 45A

|    | 1 | 2 | 3 | 4 | 5 | 6 | 7 | 8 | 9 | 10 | 11 | 12 | 13 | 14 | 15 |
|----|---|---|---|---|---|---|---|---|---|----|----|----|----|----|----|
| 20 | 2 | 2 | 2 | 2 | 2 | 2 | 2 |   |   |    |    |    |    |    |    |
| 19 | 2 | 2 | 2 | 2 | 2 | 2 | 2 |   |   |    |    |    |    |    |    |
| 18 | 2 | 2 | 2 | 2 | 2 | 2 | 2 |   |   |    |    |    |    |    |    |
| 17 | 2 | 2 | 2 | 2 | 2 | 2 | 2 |   |   |    |    |    |    |    |    |
| 16 | 2 | 2 | 2 | 2 | 2 | 2 | 2 |   |   |    |    |    |    |    |    |
| 15 | 2 | 2 | 2 | 2 | 2 | 2 | 2 |   |   |    |    |    |    |    |    |
| 14 | 2 | 2 | 2 | 2 | 2 | 2 | 2 |   |   |    |    |    |    |    |    |
| 13 | 2 | 2 | 2 | 2 | 2 | 2 | 2 |   |   |    |    |    |    |    |    |
| 12 |   |   |   |   |   |   |   |   |   |    |    |    |    |    |    |
| 11 | 1 | 1 | 1 | 1 | 1 | 1 | 1 | 1 |   |    |    |    |    |    |    |
| 10 | 1 | 1 | 1 | 1 | 1 | 1 | 1 | 1 |   |    |    |    |    |    |    |
| 9  | 1 | 1 | 1 | 1 | 1 | 1 | 1 | 1 |   |    |    |    |    |    |    |
| 8  | 1 | 1 | 1 | 1 | 1 | 1 | 1 | 1 |   |    |    |    |    |    |    |
| 7  | 1 | 1 | 1 | 1 | 1 | 1 | 1 | 1 |   |    |    |    |    |    |    |
| 6  | 1 | 1 | 1 | 1 | 1 | 1 | 1 | 1 |   |    |    |    |    |    |    |
| 5  | 1 | 1 | 1 | 1 | 1 | 1 | 1 | 1 |   |    |    |    |    |    |    |
| 4  |   |   |   |   |   |   |   |   |   | 6  | 6  | 6  | 6  | 6  | 6  |
| 3  |   |   |   |   |   |   |   |   |   | 6  | 6  | 6  | 6  | 6  | 6  |
| 2  |   |   |   |   |   |   |   |   |   | 6  | 6  | 6  | 6  | 6  | 6  |
| 1  |   |   |   |   |   |   |   |   |   | 6  | 6  | 6  | 6  | 6  | 6  |

FIG. 45B

PLACEMENT OPTIMIZATION, ACTUAL SIZE, 26

| COMPONENTS IN A ROW | X SIZE | SPACE CALCULATED /216 | AVG. OF TWO BOUNDARIES /217 | FINAL /218 |
|---|---|---|---|---|
| 1 | 7 | 2 | >3 | 4 |
| 2 | 11 | 4 | >3 | 3 |
| 3 | 4 | 1 | >1 | 2 |
| 4 | 4 | 1 | >3 | 3 |
| 5 | 10 | 4 | | |
| | 36 | 12 | 10 | 12 |

203
204 ⟶ SUM OF X SIZES = 36       219

$$\text{EMPTY SPACE BETWEEN COMPONENTS} = \frac{(\text{TOTAL EMPTY SPACE}) * (\text{SIZE OF COMPONENT})}{(\text{SUM OF X SIZE COMPONENTS})}$$

$$\text{AVERAGE EMPTY SPACE BETWEEN COMPONENTS} = \frac{\text{TOTAL EMPTY SPACE}}{\text{BOUNDARIES BETWEEN COMPONENTS}} = \frac{12}{4}$$

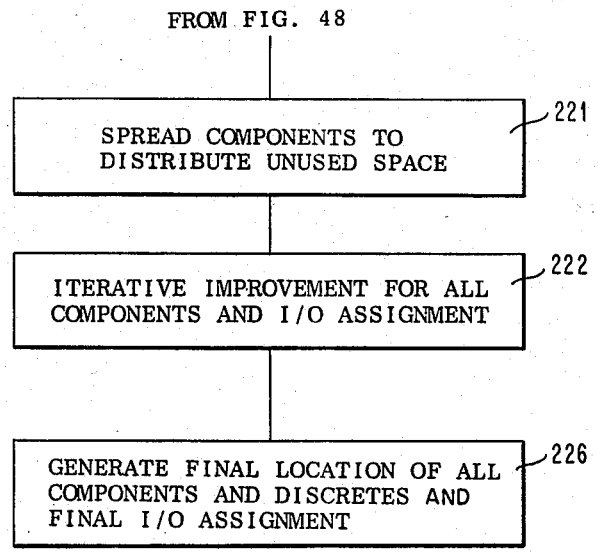

PLACEMENT OPTIMIZATION, ACTUAL SIZE (CONTINUED)

FIG. 53

ELEMENT PLACEMENT METHOD

BACKGROUND OF THE INVENTION

1. Technical Field

This invention relates to computer aided design and more particularly to an element placement method for optimally assigning a plurality of different size elements to element positions in an array of element positions.

In the present state of the art, computer aided design techniques are used in various phases of the design of an electronic system. Computer aided design may be used to design one or more elements of the electronic system. Then, element placement programs may be employed to place the different size elements on their next level package according to predefined interconnection requirements. The next level package may be viewed as defining an array of possible element placement positions thereon. Other computer aided design programs may be used for designing the specific wiring paths between the elements on their next level package.

Element placement programs are employed for generating an optimized placement of elements on their next level package. The elements to be placed may be macros, i.e., a group of related circuits for performing a given function, which are placed on a first level package, e.g., a large scale integrated circuit chip or a semiconductor wafer. Alternatively, the elements may be a plurality of different size electronic components, e.g., large scale integrated circuits, resistors, capacitors, etc., which are placed on a second level package, e.g., a printed circuit board or card, or a multilayer ceramic substrate. Also, the elements to be placed may be printed circuit boards or cards, which are placed on a third level package, e.g., a motherboard. An element placement program must generate an element layout which simplifies the routing of the element interconnections on the next level package and also obeys various physical, technology and other constraints. Physical constraints include the requirement that the elements must not overlap each other or extend over the side of the next level package. Technology constraints relate to the limited amount of wiring space which is available to make the many interconnections between the elements. Other constraints may relate to the preassigned position of input/output connections, test points and the like imposed by the system designer.

2. Background Art

Many element placement programs and techniques are known in the art. However, known placement programs and techniques often do not properly handle the complexity of placing a plurality of different size elements while satisfying wireability constraints. As the number and complexity of elements increase and the element packing density increases, the required computer running time for known automatic element placement programs becomes prohibitive. Moreover, the resulting placement is often not optimum in terms of component fit and rule violations.

An example of a known element placement technique is described in U.S. Pat. No. 3,654,615 entitled "Element Placement System" and assigned to the assignee of the present invention. Disclosed in an element placement system wherein the elements are first ordered according to the degree of electrical interconnectivity they have to other elements to be placed on the second level package. The element with the highest degree of connectivity is assigned a location a central portion on the second level package, then the next element is assigned adjacent to the first, and elements continue to be assigned one by one until all of the elements are assigned.

Another example of a known element placement program is described in U.S. Pat. No. 3,681,782 entitled "Machine Process for Positioning Interconnected Components to Minimize Interconnecting Line Length". Disclosed is an element placement program which breaks the elements into nets having two components, three components, etc. and successively places the nets on the next level package until all the nets have been placed.

An overview of element placement techniques is provided in Chapter 5 of *Design Automation of Digital Systems-Theory and Techniques*, Vol. 1, by M. Hanan and J. M. Kurtzberg, edited by M. A. Breur (Prentice Hall, 1972). While the above examples illustrate known element placement programs, there is a present need for more versatile placement programs (i.e., programs which place a plurality of different size elements automatically and efficiently) so that the highly complex combinatorial problem of placing these elements may be solved.

SUMMARY OF THE INVENTION

It is therefore an object of the invention to provide an element placement program for assigning a plurality of different size elements having a predetermined relationship thereamong, to element positions in an array of element positions.

It is another object of the invention to provide an element placement program which requires less computer execution time than prior art element placement programs.

It is yet another object of the invention to provide an element placement program which optimizes placement to enhance wireability of the placed elements on the next level package.

These and other objects are provided by an element placement program which obtains its efficiency by determining optimum placement of elements in a three pass process. In the first pass, all of the elements are treated as if they are the same size (defined as unit size), and optimum placement for the unit size elements is determined by assigning the unit size elements to element positions in an array of element positions, according to the predetermined interconnection requirements thereamong. Then, the optimally placed unit size elements are replaced by macro size elements which bear rough approximations to the actual element sizes. The macro size elements are rearranged for optimal placement, taking their sizes and shapes into account. Finally, the optimally placed macro size elements are replaced by actual size elements, and the placement is again optimized to take the exact sizes into account.

By optimizing element placement in a three pass (unit, macro and actual size) process, the placement program of the present invention obtains maximum efficiency. This is because the program need not take all the dimensional characteristics of the elements into account at once. Moreover, the iterative technique of unit, macro and actual size element modelling assures that the final placement arrived at is indeed optimized.

A specific method for practicing the present invention will be described wherein the elements to be placed are electronic components of various sizes, shapes and complexities, e.g., large scale integrated circuits, discrete capacitor and resistor packs, etc. The electronic components are assigned to component mounting positions on a second level package which is a card containing wiring planes for electrically connecting the components. However, it will be understood by those having skill in the art that the method is equally applicable to any placement of different size electronic elements on a next level electronic package, and is also applicable to many commercial and industrial situations wherein a plurality of different size interrelated elements are formed into a structural pattern within the confines of a predetermined array.

According to the invention, actual, macro and unit size models are formed of the components and of the card. The actual size model of the components and the card is formed from input information to the element placement program. For the card, the actual size model includes the dimensions of the card, and the location of input/output vias in a grid, the grid of vias defining an array of component placement positions on the card. For each component, the dimensions, pin numbers and pin locations are supplied, as well as a net list which defines the interconnections to be made between components.

The unit and macro size models for the components and the card are formed. For unit modelling, each component has the same size and shape, defined as one unit in the horizontal and vertical directions. The size of the unit model card is sufficiently large to accommodate all the unit size components and is obtained by dividing the height and width of the actual size card by the average height and width of the actual size components. For macro modelling, each component's size is roughly proportional to its actual size, and is obtained by dividing the actual size by a scale factor, the scale factor being the most common component height or width. The size of the macro model card is sufficiently large to accommodate all the macro size components, and is obtained by multiplying the unit card dimension by the average height and width of the macro size components. Prior to unit and macro model formation, small components may be deleted from the component set, to simplify placement at the unit and macro level. These small components may then be reinserted during the actual model placement step.

According to the invention, the unit size components are optimally placed on the unit size card. Known placement optimization techniques may be employed. The technique employed here sorts the components as a function of their connectivity to other components so that the most highly connected components are first placed on the unit size card. Sorting is performed by forming clusters (i.e., groups of highly interconnected components) from seed components which act as nuclei in formation of clusters. An ordering of the groups is then carried out, to generate an order of components based on interconnectivity of the groups.

The unit size components are then initially placed on the unit size card, one by one, in the order generated above, using a constructive placement technique. In constructive placement, the component with the highest connectivity to another component is placed at a predetermined starting location on the unit card. For each subsequent component, the cost of placing the component at various locations is calculated, and the location with minimum cost is selected. The initially placed unit size components are rearranged using a superpositioning technique which evaluates the cost of placing a component at various locations, considering the connections of the component to be placed with previously placed components and with components which are not yet placed. Well known pairwise interchange iterative improvement techniques are then used to further optimize placement.

The macro size components are then placed on the macro size model card, in element positions which correspond to the optimized placement positions of the corresponding unit size components on the unit size card. The placed components are then slid in the horizontal and vertical directions to eliminate overlap. The initial placement of the macro size components is then optimized via superpositioning and pairwise interchange iterative improvement techniques as was done for the unit size components.

The actual size components are then placed on the actual size model card, in element positions which correspond to the optimized placement positions of the corresponding macro size components on the macro size card. The placed components are then slid in the horizontal and vertical directions to eliminate overlap. Any small components which were removed for the unit and macro model phase are reintroduced and placed. The components are then spread to distribute unused space. The initial placement of the actual size components is then optimized via pairwise interchange iterative improvement techniques as was done for the macro size components.

The final actual size component placement data may then be routed to an automatic component placement machine for placing the components on the card in accordance with the optimized mode. Alternatively, the final placement data may be sent to an automatic wiring program which computes the actual wiring paths between the optimally placed components on the card.

BRIEF DESCRIPTION OF THE DRAWINGS

FIG. 12 illustrates an example of actual size components to be placed on a card.

FIG. 13 illustrates removal of small components and unit size model generation.

FIG. 14 illustrates an example of macro size model generation.

FIGS. 18A-18C illustrate a sample connectivity matrix, and a table of sorted values, and a table of seeds for components.

FIGS. 19A and 19B illustrate a sample connectivity matrix and a table of sorted values for groups of components.

FIG. 22 illustrates the detailed steps of placing the unit size components on the unit size card.

FIG. 23 illustrates the detailed steps in initial placement for unit size.

FIG. 24 illustrates unit and macro size models for a 12 component example.

FIGS. 35A-35C illustrate scaling up from unit to macro model components.

FIGS. 42A and 42B illustrate scaling up of a macro model to an actual size model.

FIG. 45A illustrates two dimensional mapping of actual size components.

FIG. 45B illustrates the final placement of components on the macro model image.

FIG. 49 illustrates a calculation of empty space between actual size components.

FIG. 53 illustrates further steps for placement optimization of the actual size model.

DETAILED DESCRIPTION OF THE INVENTION

1. Computer Aided Design System

Figure 1:
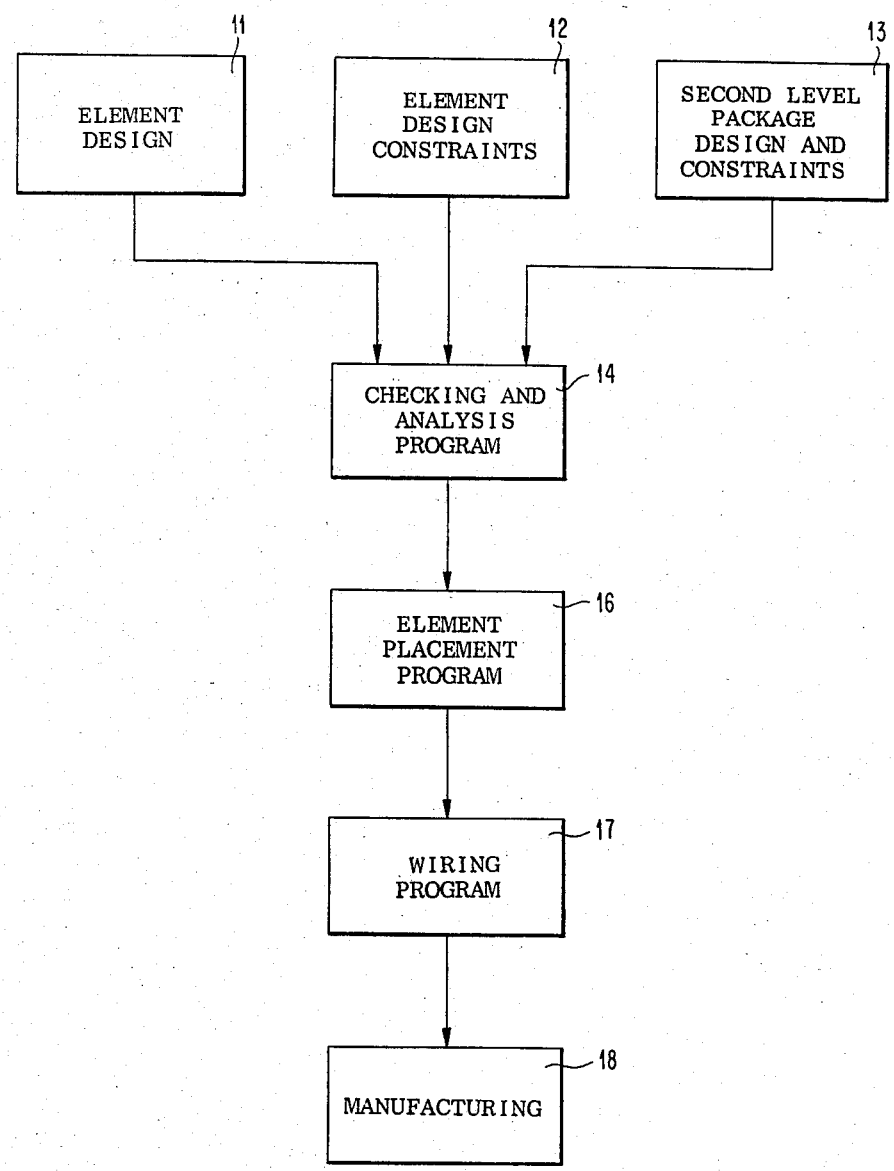
FIG. 1 illustrates a computer aided design system which includes an element placement program according to the present invention.

Referring now to FIG. 1, there is illustrated a highly schematic representation of a computer aided design system which includes an element placement program according to the present invention. In order to design an electronic system, each element thereof is designed or specified. Associated with the design are various design constraints which define, e.g., the interconnection of the elements. A next level package is also designed or specified. Associated with the design of the next level package are various design constraints which define, e.g., spaces reserved for input/output terminals. In the computer aided design system of FIG. 1, the element designs 11, element design constraints 12 and the next level package design and constraints 13 are all input to a checking and analysis program 14 which ensures that the designs and constraints 11-13 do not violate predefined design rules and are compatible with one another.

Once it is ensured that a functional design is present, an element placement program 16 according to the present invention may be employed for automatically determining optimized placement of the elements on the next level package. After element placement is optimized, a wiring program 17 determines the actual wiring interconnection paths between the optimally placed elements on the next level package. After wiring is determined, the element placement data and wiring data may be employed for manually placing the elements on the next level package and wiring the elements. Alternatively, the element placement and wiring data may be fed to a computer aided manufacturing system 18 which automatically places the requisite elements on the next level package according to the optimal placement derived by element placement program 16 and automatically creates a wiring network according to the wiring data derived by wiring program 17.

2. Overview of the Element Placement Program of the Present Invention

Figure 2:
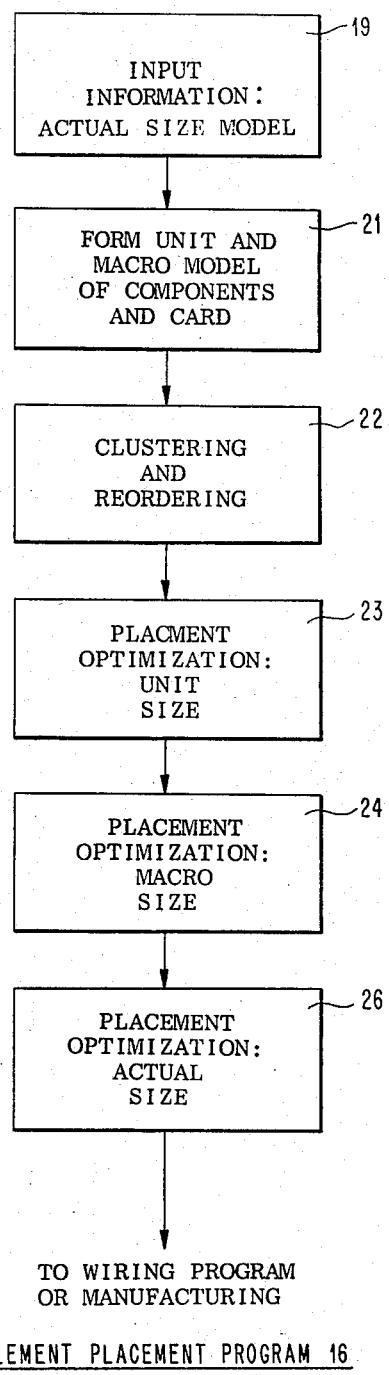
FIG. 2 illustrates an overview of the method performed by an element placement program according to the present invention.

Referring now to FIG. 2, there is illustrated an overview of the method performed by an element placement program 16 (FIG. 1) according to the present invention. As stated above, the elements to be placed will be referred to as components, which may include integrated circuits and discrete devices, and the second level package will be referred to as a card. Element placement program 16 accepts input information (block 19 in FIG. 2) regarding to the dimensions of each component, and the input/output interconnection arrangement between components, the dimensions of the card and the permissible element positions thereon and component interconnections, as well as other constraints for the components and the card. The input information is for the actual size model of the components and the card. From the actual size model, a unit and macro model of the components and the card is formed (block 21). The components are then clustered and reordered (block 22). Clustering is the process of identifying the components which are highly interconnected with each other and forming groups of such components. Reordering involves the positioning of each individual component within the groups, relative to those in the same group. Clustering and reordering ensure that the most highly connected components are placed close to each other on the unit size card.

The unit size elements are then optimally placed on the unit size card (block 23). The optimally placed unit size components and unit size card are replaced with the equivalent macro size components and macro size card and the placement is again optimized (block 24). Finally, the optimally placed macro size components and card are replaced by the equivalent actual size components and card and the placement is again optimized (block 26). The placement data is supplied to the wiring program 17 (FIG. 1) or to the manufacturing system, 18 (FIG. 1) for layout of the components on the card as determined by the element placement program.

In succeeding sections of this specification, each of the blocks of FIG. 2 will be described in sufficient detail so as to enable those skilled in the art to make and use an element placement program according to the present invention.

3. Input Information

Referring again to FIG. 2, all of the required information about the card and the components to be placed thereon is gathered and written into a file by input information block 19. The input information forms an actual size model of the components and the card. The required input information and examples thereof will now be described.

Figure 3:
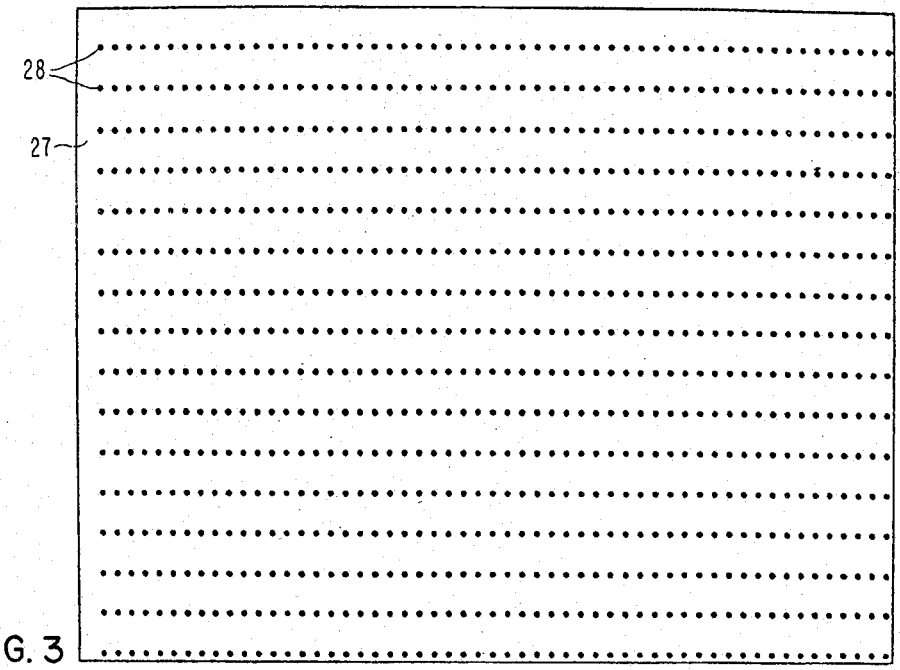
FIG. 3 illustrates a representation of a card and the element positions thereon.
Figure 4:
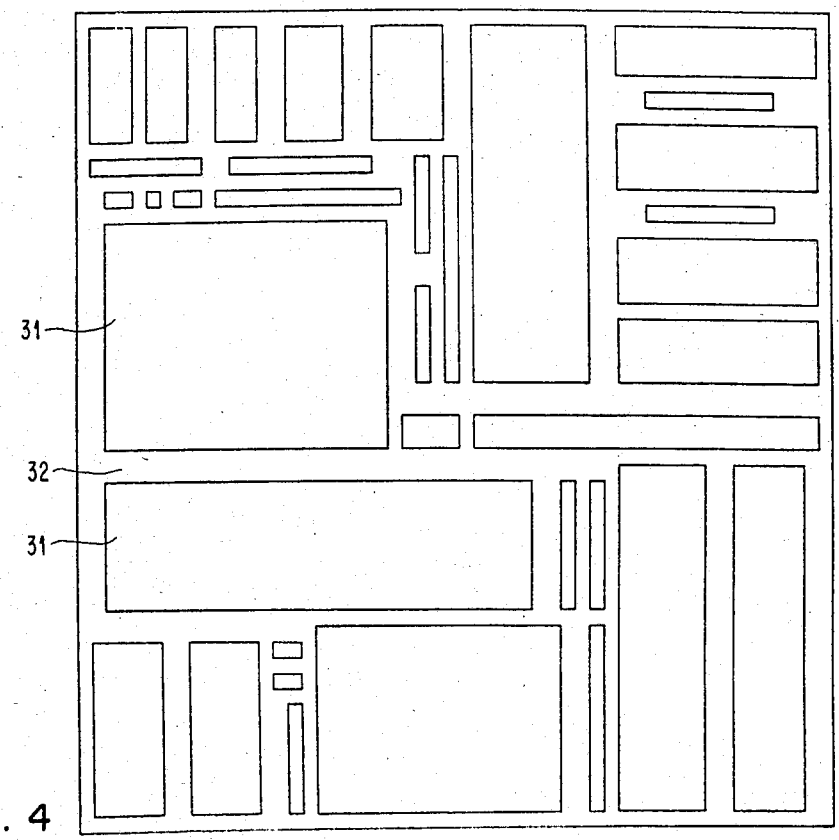
FIG. 4 illustrates a tile fitting problem.
Figure 5:
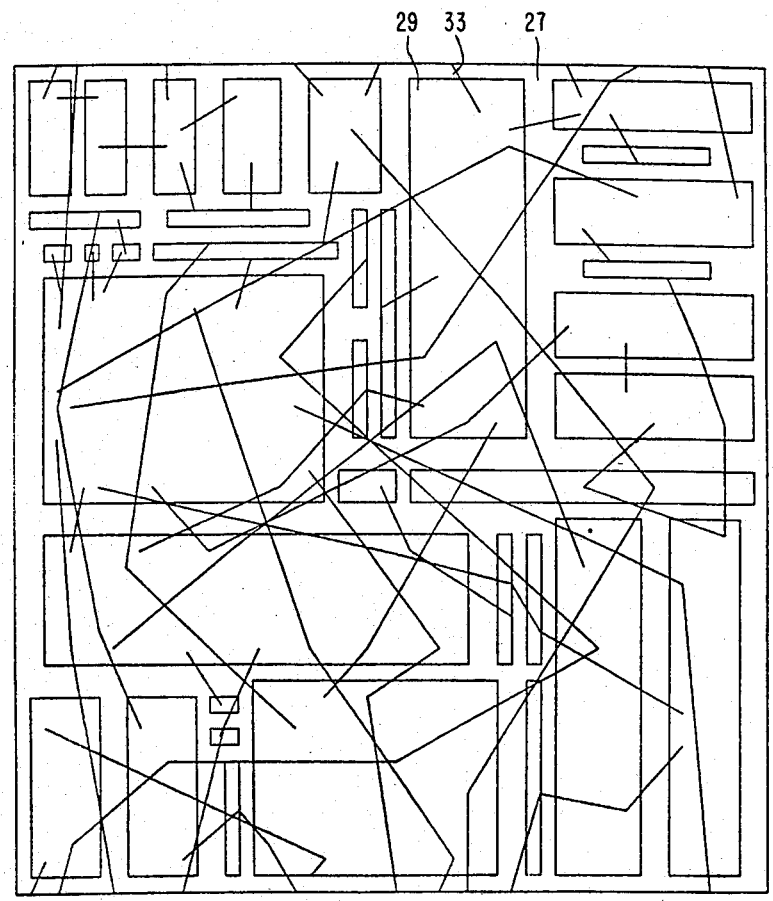
FIG. 5 illustrates a card having interconnected components thereon.
Figure 6:
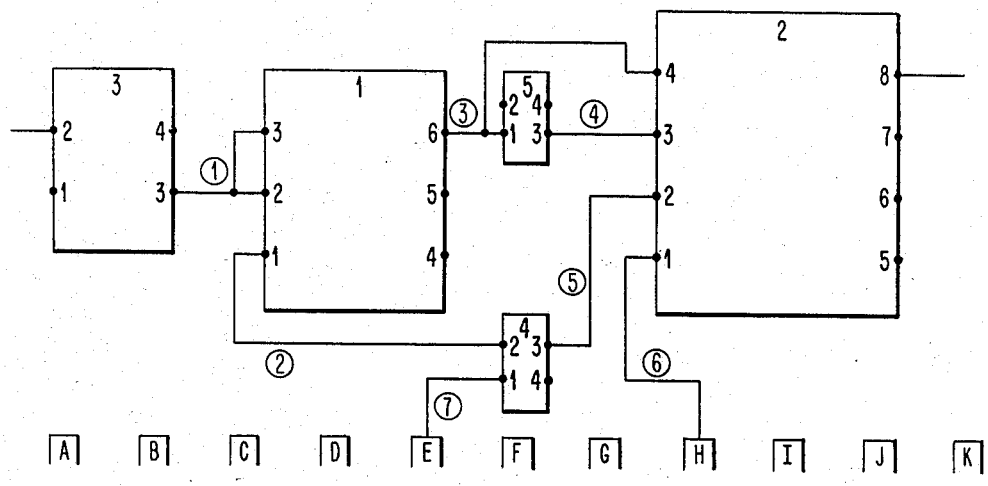
FIG. 6 illustrates a net list.

One part of the input information is a description of the card and the possible component placement positions thereon. FIG. 3 illustrates a representation of a card 27 and the grid of input/output vias 28 upon which components can be placed. The grid of input/output vias define a plurality of possible component positions on the card. The dimensions of the grid and the X-Y location of vias 28 is supplied. Also supplied are the dimensions of each component to be placed on card 27. The grid description and element dimension descriptions define a classical "tile fitting problem" as shown in FIG. 4, i.e., the problem of optimally packing a plurality of differently shaped tiles 31 into a predefined area 32. However, the problem of placing components on a card is more complex than the classical tile fitting problem in that a list of interconnections, also referred to as a net list, is also provided. The net list defines the interconnections which are to be made between components. Components have to be placed in such a way that the probability of wiring these connections based on the resultant placement is optimized. FIG. 5 illustrates schematically the card 27, components 29 and the interconnection requirements 33 between components. FIG. 6 illustrates the information that is saved in the net list. Components and their pins are numbered, and all pin-to-pin connections are described, as is the position of each pin on each component relative to the component origin. Input/output points (A-K) are specified relative to the card origin. Due to physical and electrical constraints, some nets are more critical than others and must be kept as short as possible. In this case, the designer may specify which of these nets are the most important by giving a priority number to the net as shown in FIG. 6. A net priority of zero is given if a net is not considered to be critical, and having values are assigned to the most critical nets up to a maximum of 10. The specific details of the use of net priority is explained in the Clustering and Ordering section below.

Figure 7:
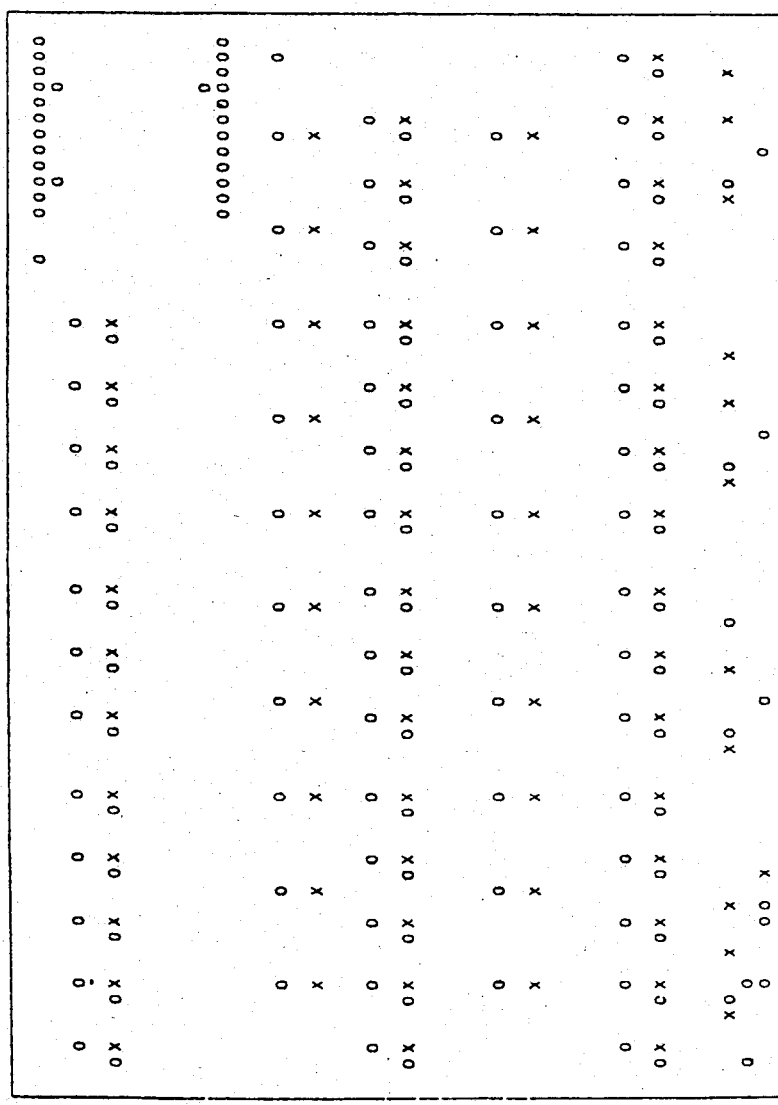
FIG. 7 illustrates a card having predefined voltage supply points.
Figure 8:
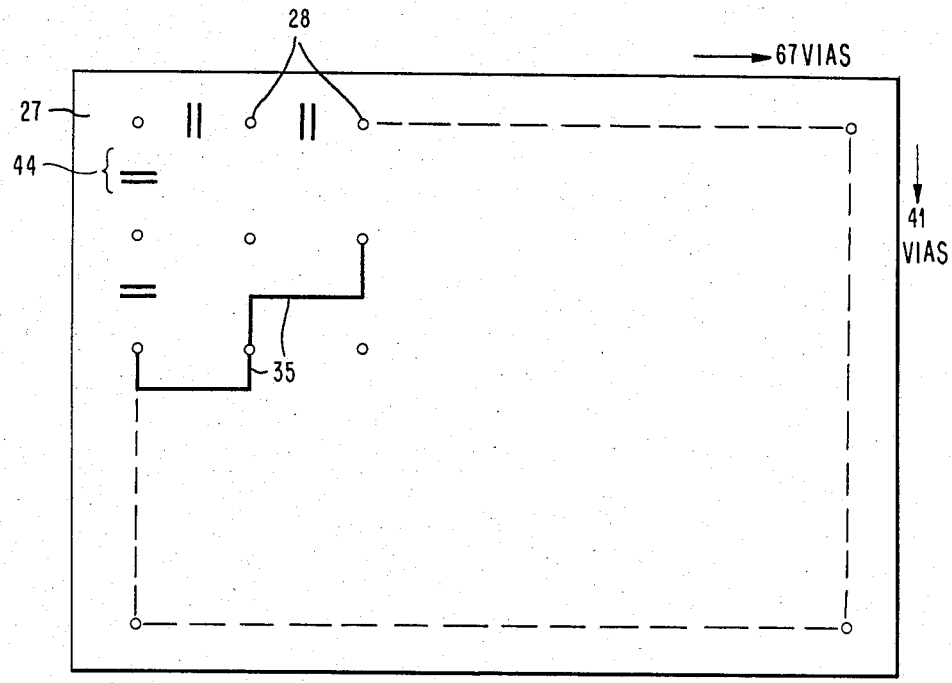
FIG. 8 illustrates information about the number and location of wiring channels.

There is other input information which further complicates the placement problem. For example, referring to FIG. 7, the grid upon which elements may be placed may be restricted due to the characteristics of the second level package. Certain components may only be able to be placed at those locations where a correct voltage supply is provided, so that the voltage supply locations must be specified. In FIG. 7, a plurality of voltage supply location points are specified for two supply voltages. Referring to FIG. 8, information about the number and location of wiring channels 44 between each original grid position 28 is also provided to the element placement program. This information is used in conjunction with the net list in order to analyze and optimize the wireability of the resulting placement, as will be described more particularly below.

Figure 9:
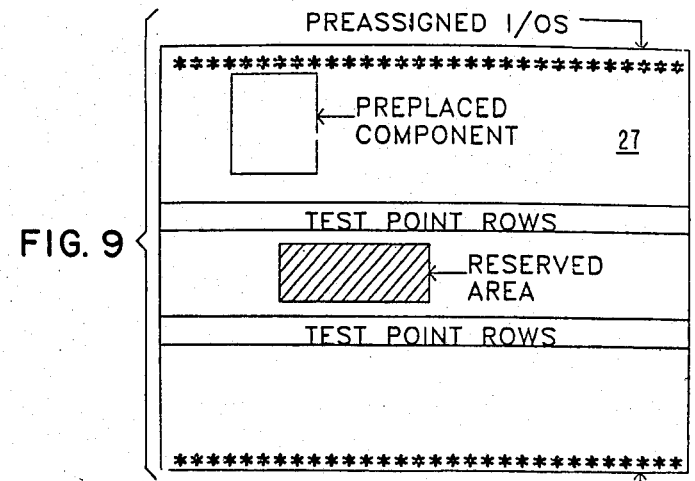
FIG. 9 illustrates a card having preassigned input/output points, preplaced components, test point rows and reserved areas.

Card 27 may also include a predetermined number of preassigned input/output (I/O) points, as shown in FIG. 9. Preassigned I/O information is used by the placement program to place the components which require interconnections to other cards near the I/O points. Card 27 may also include reserved areas which are also unavailable for component placement. Such reserved areas may be holes in the card or mechanical mounting points for the card. Card 27 may also include test points. Test points may be additional areas unavailable for placement in some designs or may be used as input/output points in other designs. Finally, the designer may need to specify the final placement position for certain components (i.e., preplaced components) while allowing the rest of the components to be placed by the element placement program. All of this information is conveyed to the automatic placement algorithm as part of the input information of block 19 (FIG. 2). This information may be provided by interactive data entry at a computer terminal or may be provided by the computer aided design system in the form of a data base.

4. Unit and Macro Model Forming

Figure 10:
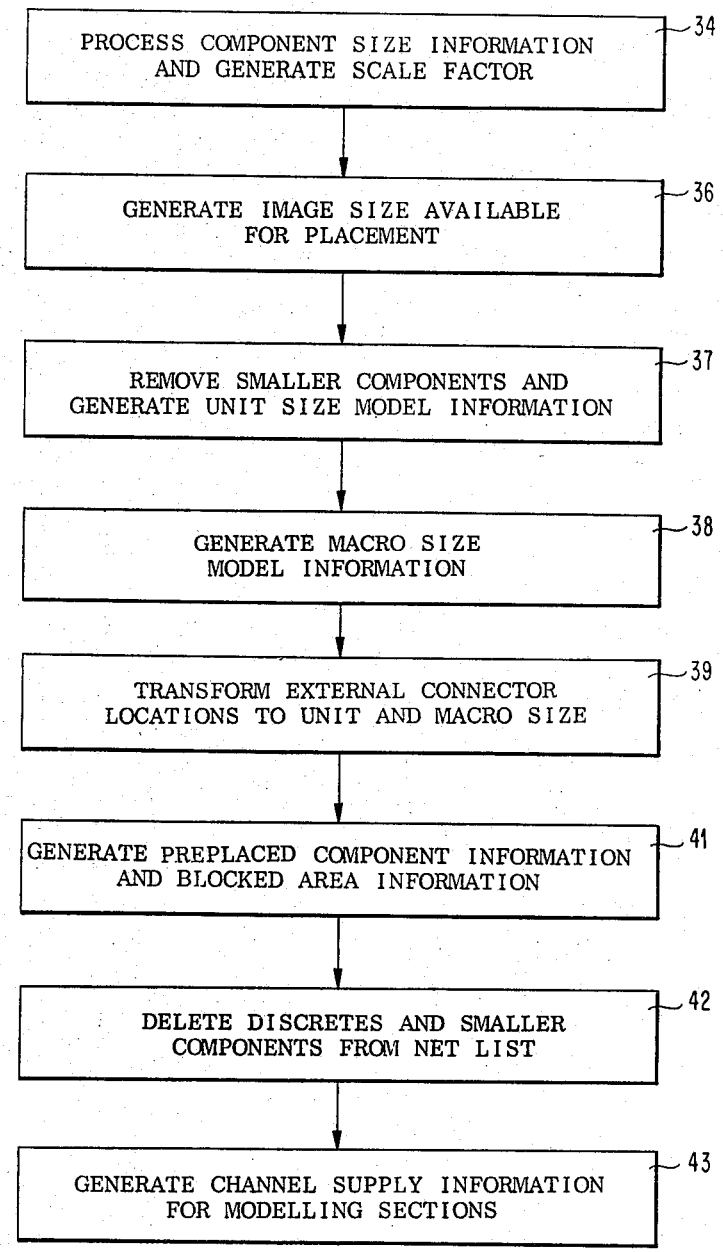
FIG. 10 illustrates the detailed steps in forming the unit and macro models.

Referring now to FIG. 10, the detailed steps in forming the unit and macro models of the components and the card (block 21 in FIG. 2) will be described. It will be understood by those having skill in the art that the unit and macro models need not be formed at this point in the processing but rather can be formed immediately prior to their optimization (boxes 23 and 24 of FIG. 2).

Figure 11:
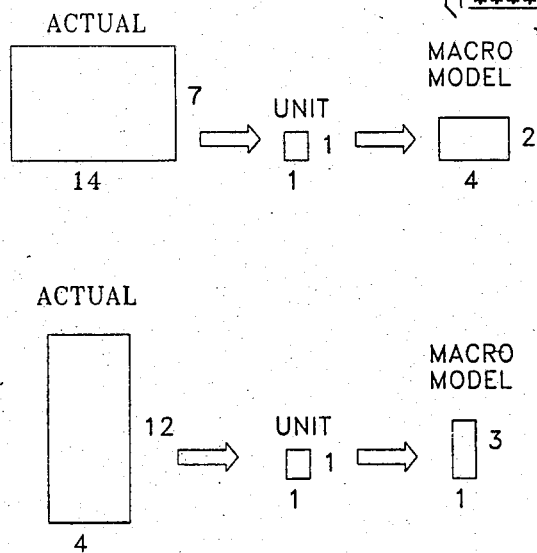
FIG. 11 illustrates the concept of unit and macro modelling.
Figure 15:
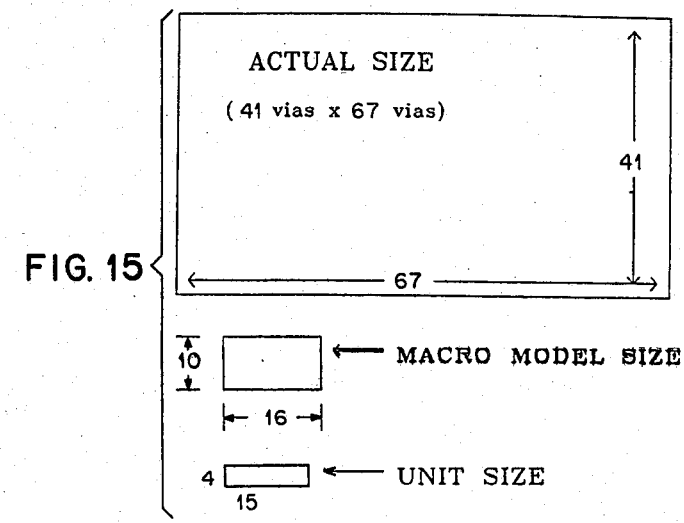
FIG. 15 illustrates the unit and macro model cards for the example of FIGS. 13 and 14.

The concept of unit and macro modelling is illustrated schematically in FIGS. 11 and 15. In this example, the actual sizes of the components, in grid coordinates defined for the specified card, are 14×7 (i.e., 14 grid units in the X direction and 7 grid units in the Y direction) and 4×12 (i.e., 4 grid units in the X direction and 12 grid units in the Y direction). For the unit model, both of these components are 1×1 (i.e., 1 grid unit in the X and Y directions). For macro modelling purposes the sizes are 4×2 and 1×3, respectively, with a scale factor of 4. The manner in which the macro model sizes and scale factor are computed will be described below.

Referring again to FIG. 10, the first step in unit and macro model forming is to process the component size information in order to generate a scale factor (block 34). In order to illustrate the processing which occurs in this and subsequent steps, data exemplifying a typical mix of components and a card is illustrated in FIG. 12. FIG. 12 illustrates a mixture of components to be placed on a grid with 67 grid points in the X direction and 41 grid points in the Y direction. Sixty-six components are to be placed, the components being of eight different sizes, the distribution of which is also illustrated in FIG. 12. Block 34 (FIG. 10) sets the scale factor to be the most common component size in either the X or Y dimension. For the example of FIG. 12, it will be seen that a scale factor of 4 is used for this component mix. If the component mix includes two or more most common dimensions, then the lowest value is chosen. Also, if the component mix is widely different in sizes, i.e., no more than 20% of the components are of the same size, then a default scale factor of 4 is utilized.

Referring again to FIG. 10, the program then generates the image size available for placement (block 36). If any rows or columns of grid positions are not available for placement the total number of rows and columns available for placement are reduced accordingly. Any reserved areas shown in FIG. 9 are taken into consideration during the unit and macro modelling steps by reserving an appropriately scaled area on the card image and making this area unavailable for placement.

Referring again to FIG. 10, the smaller components are removed and the unit size model is generated (block 37). The smaller components are removed from processing in the unit and macro modelling steps. This is done to simplify the overall placement problem and to remove insignificant placement problems during initial optimization in order to generate a relational placement based on connectivity of the larger components. The components removed are those with an X or Y grid dimension of one before any unit or macro modelling has taken place.

FIG. 13 illustrates removal of the smaller components and the calculation of the unit size model for the card. After small component removal (indicated in FIG. 13 by a line drawn through the removed components), the average height and width are calculated to be 4.41 and 10.15 grid units, respectively. Based upon the actual size of the grid (67×41), and the average size of the components, the number of components that can be placed in the X direction is 15 and that in the Y direction is 4 (rounded off to the nearest integer). Accordingly, the unit image size is 15×4. Of course, the unit size of each of the components will be taken as 1×1. It will also be noted that if any of the components are specified as required to be in a certain rotation, then this rotation is taken into consideration. The ΔX and ΔY values have to be interchanged to account for the rotation of a component in a 90° or 270° rotation.

Referring again to FIG. 10, the macro size model information is then generated (block 38). FIG. 14 illustrates macro model generation for the example of FIG. 13. The macro sizes of the components are calculated by dividing the actual sizes by the scale factor and rounding to the nearest integer. The average X and Y dimensions of the macro models are then calculated to be 1.13 and 2.43, respectively by dividing the sum of the macro sizes (i.e., NΔX and NΔY) by the total number of components (N) as shown in FIG. 14. The macro card size is calculated by multiplying the unit size dimension by the average dimension of the macro size components and rounding to the nearest integer. Thus, the macro image size is calculated to be 16×10. FIG. 15 summarizes the card images in the actual, macro and unit size models.

Referring again to FIG. 10, the next step is the transforming of external connector locations to unit and macro size (block 39). The external connector positions (i.e., I/O connections) on the original card are transformed into relative positions on the unit and macro images of the card based upon the ratio of X and Y dimensions of images. Some I/O positions may be specified by the designer (pre-assigned I/O's) because they must plug into the motherboard at the correct voltage supply point. Since a component connection to an I/O implies that a wire will have to be generated, these connections must be taken into account during the modelling placement phases. Then (block 41), preplaced component information and reserved area information is generated for the macro and unit size cards. Thus, if any components are preplaced and have to be kept in preassigned locations on the actual card, these locations are transformed into relative locations on the unit and macro modelling card images. Similarly, any reserved areas (illustrated schematically in FIG. 9), are also transformed into an unavailable area in the modelling images. If the area reserved or preassigned is smaller than 1 unit of modelling, then this reserved or preassigned area is ignored during unit and macro modelling, and is considered only during placement of actual size components (FIG. 2, block 26). During actual size placement, none of the components are placed such that the reserved area is overlapped.

Figure 16:
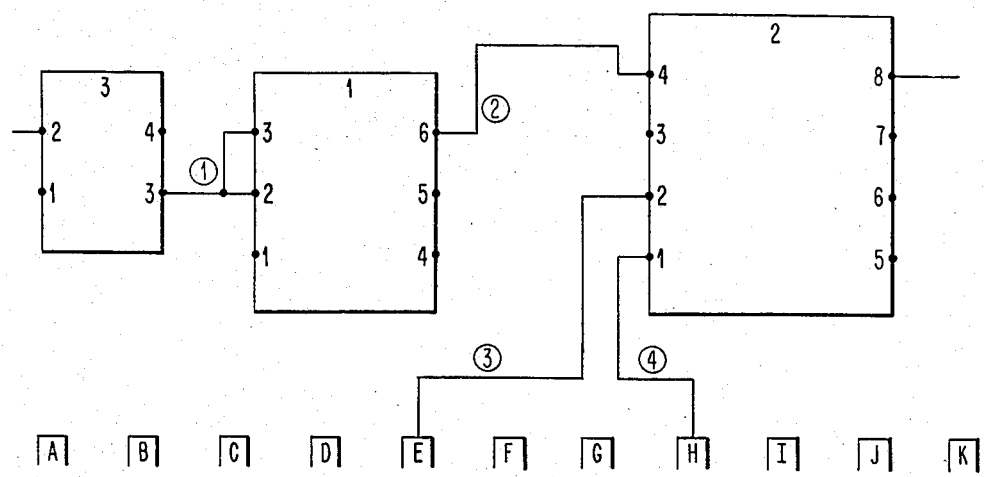
FIG. 16 illustrates the net list of FIG. 6 after removal of small components.

Processing continues at block 42 (FIG. 10) where the discrete and smaller components are removed from the net list. The deleted components from the unit and macro modelling set (FIGS. 13 and 14) are temporarily removed from the original net list and a new net list is generated. If the component being deleted is connected to an input/output connection in one net and is also connected to a component in another net, the component to be deleted is replaced by the connected component in the first net. Similarly, if more than one component is connected to the component to be deleted, then the component with the most I/O connections is chosen as a replacement component in the I/O net. This is carried out for nets in which the components to be deleted are connected to an I/O only. FIG. 16 shows the net list of FIG. 6 after the small components have been removed, with the appropriate changes made to the net list.

Next, (block 43, FIG. 10) the number of horizontal and vertical wiring channels (paths into which wires can be placed) available between original grid positions 28 are summed up across the height and width of card 27. FIG. 8 illustrates a typical wiring path at 35 and typical wiring channels at 44. To generate macro and unit channel supply information, the number of horizontal and vertical wiring channels per unit X and unit Y dimension of the image is computed by dividing the total number of channels in X and Y by the number of image units (macro and unit size) in each direction.

This completes the description of the unit and macro model forming portion of the present invention block 21, FIG. 2). For unit size, there are 60 locations available for placing 46 components (see FIGS. 13 and 15).

For macro model section, the area required by components is 140 and the available area is 160. The total number of defined grid points are 160. Thus, the area available is about 10% higher than required for unit modelling and about 15% higher than required for macro modelling based upon the area actually needed for components to be placed. This excess area aids in the fitting problem as described below.

It will be understood by those having skill in the art that once the unit and macro models are formed, conventional placement optimization techniques may be employed for optimally placing the unit elements on the unit card, replacing the optimally placed unit elements with corresponding macro elements, optimally placing the macro elements on the macro card, replacing the optimally placed macro elements with corresponding actual elements, and optimally placing the actual elements on the actual card. The placement optimization techniques described below provide better placements with the three pass technique.

5. Clustering and Reordering

Figure 17:
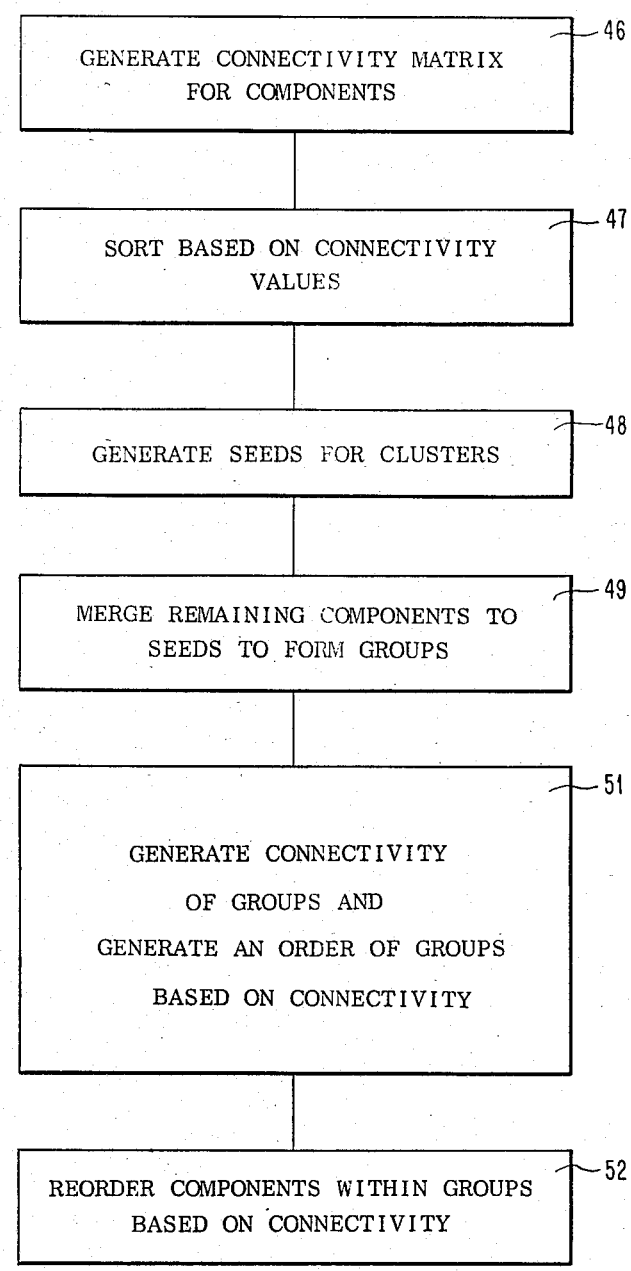
FIG. 17 illustrates the detailed steps in clustering and reordering.

Referring now to FIG. 17, the detailed steps in clustering and reordering (block 22, FIG. 2) the components to be placed on the card will be described. Prior to placing the unit, macro and actual size components on the corresponding card (blocks 23-26, FIG. 2), the interconnections between the components are analyzed and groups of highly interconnected components are formed. Seeds are formed from a connectivity matrix and groups or clusters of components are formed. These groups or clusters are ordered based on their connectivity. Then, within each group, the components are reordered based on their connectivity to already picked groups. This order is then used to place the unit size components on the unit size image. The process of clustering and ordering highly interconnected components reduces the amount of wiring needed to connect their signal nets when these components are placed together. However, it will be understood by those having skill in the art that placement order may be generated through other well known clustering techniques or may be random.

FIG. 17 illustrates the steps which take place in clustering and reordering. For purposes of illustration, it will be assumed that twelve components have to be placed on a card, although it will be understood by those having skill in the art that any number of components may be placed, the calculations all being as described below. A net list, as exemplified in FIG. 16, is formed to describe the electrical connections between the twelve components. Clustering and reordering begins by analyzing the net list and generating a connectivity matrix for the components (block 46).

Referring now to FIG. 18A, a sample connectivity matrix for twelve components is illustrated. Each entry in the matrix is generated from equations (1) and (2) as described below:

$$C_{ij} = \sum_1^k (1.5/(n-1) + 1.0 * NPR/(n-1)) \quad (1)$$

$$C_{ij} = C_{ij} + 0.5 * \left(\frac{k}{m_i} + \frac{k}{m_j}\right) + 0.5 * \left(\frac{Io_i}{m_i} + \frac{Io_j}{m_j}\right), \quad (2)$$

where,
$C_{ij}$ = connectivity value between components i and j. The connectivity values form the entries of the connectivity matrix shown in FIG. 18A, with i and j running from one to twelve.

k = number of nets connecting components i and j. This value is obtained by scanning the net list and keeping a count of which net numbers contain a pin from both component i and component j.

n = number of connecting points in the whole net k (e.g., in FIG. 16, net 2 has 2 connecting points, as do nets 3 and 4; net 1 has 3 connecting points). This number is obtained by counting the number of entries in the net list having the same net number as the net being calculated.

$m_i$, $m_j$ = total number of nets in which component i (or j) appears (e.g., in FIG. 16, component 3 appears in only one net; component 2 appears in 3 nets). This value is obtained by scanning the net list and keeping a count of the different net numbers in which component i (or j) has a connecting point.

$Io_i$ = number of I/O's to which component i is connected (e.g., in FIG. 16, component 1 does not have any I/O's).

$Io_j$ = number of I/O's to which component j is connected (e.g., in FIG. 16, component 2 is connected to two I/O's).

NPR = the net priority flag assigned by the user for critical nets for components to be placed together (priority listings for the nets of FIG. 16 are illustrated with priority 2 being highest and 0 being no priority).

The multiplier values 1.5, 1.0 and 0.5 are determined experimentally, with the above values giving best experimental results known to the inventors. However, it will be recognized by those having skill in the art that it is possible that better results could be obtained with different values.

The connectivity value Cij for each entry in the connectivity matrix (FIG. 18A), is calculated according to equation (1) above. As will be understood by those having skill in the art, equation (1) represents a weighted sum of all common nets between components i and j. If there are no common nets between components i and j, i.e., the value of Cij in equation (1) is zero, then equation (2) is not evaluated and Cij is zero for that matrix entry, indicating that the components are unconnected. If on the other hand, Cij as calculated in equation (1), is not equal to zero, then the calculations in equation (2) are added to the connectivity value computed in equation (1). In equation (1) the number of common nets between components i and j were evaluated. Equation (2) adds to this the ratio of nets between components i and j and the total nets associated with each component and the number of I/O's for each component in order to obtain the total connectivity between components i and j. This calculation is carried out for all components in the net list and a connectivity matrix as shown in FIG. 18A is generated.

Referring back to FIG. 17, once the connectivity matrix has been generated (block 46), a sort is performed based on the connectivity values (block 47). The sort is performed as follows: from the connectivity matrix (FIG. 18A) the maximum connectivity value is obtained by scanning across each row of the matrix. The "Maximum Connectivity Value" column 58 of FIG. 18A illustrates the result of the scan for the twelve component example. Also, the associated component number for the maximum connectivity value is generated, as illustrated in the "Most Connected Component" column 59 of FIG. 18A. Finally, the sum of all of the connectivity values across each row is also generated as shown in the "Summed Values" column 61 of FIG. 18A. The maximum connectivity values 58 are then sorted in order of decreasing connectivity values and a table illustrated in FIG. 18B is generated. Referring to FIG. 18B, the table lists the maximum connectivity value for each component and the component that is highly connected to it. Sorted values 66 are obtained by sorting the maximum connectivity values 58 in descending order. Because $C_{ij}$ is always equal to $C_{ji}$ (two components i and j are always equally connected to each other), the same connectivity value will often appear twice in the sorted values column. The listings for component i and component j in FIG. 18B are the component numbers i and j from which the maximum connectivity value 58 was obtained for that row.

Referring again to FIG. 17, after the sort is performed (block 47), seeds are generated for component clusters (block 48). Seeds are groups of two or more components that are highly connected to each other as described below. Remaining components with low connectivity to other components are merged with the seeds generated in block 48 to which they are most highly connected (block 49) to form groups of components. Connectivity between groups is generated and an ordering of these groups from highest to lowest connectivity is produced (block 51). Finally, individual components within each group are ordered based on connectivity (block 52).

Thus, for example, analysis of the stored connectivity values (FIG. 18B) shows that components 1 and 2 are highly interconnected to each other and that if they are placed together the amount of wire needed to connect them will be minimized. Thus, from the sorted values 66, the two most highly interconnected components are picked as the first seed, here, component 1 and component 2. The next component in the sorted list is 8. It's connectivity matrix row (FIG. 18A) is searched for the highest value to find the component to which it is most highly connected. This analysis shows component 8 to be most highly connected to component 5, so the row for component 5 is similarly searched for its highest connectivity value. Since component 5 is most highly interconnected with components 7 and 8, a new seed is formed for components 5 and 8. Next in list 66 of FIG. 18B is component 7. Its connectivity to components in the first seed (components 1, 2) and in the second seed (components 5, 8) is analyzed. The connectivity row for component 7 is searched and its highest connectivity is found to be to component 5, and component 7 should therefore be merged with the seed containing component 5. Thus, the second seed consists of components 5, 7, 8.

The above described process of picking up the next candidate from the sorted list and either merging it to an existing seed or creating a new seed is carried out until the sorted value in list 66 reaches a value less than or equal to 2.8. This value is for the particular constants used in Eq. (1) and Eq. (2) and may have to be changed if different constants are employed. The seeds generated for the example of FIG. 18A are illustrated in FIG. 18C at 62.

After the above described cut-off point in connectivity value, no more seeds are generated. The cut off point indicates that the components left are not very highly interconnected to any one component. Thus, the left over components can be merged with existing seeds. If no seeds are formed because all components are very lightly interconnected, then the method outlined below for ordering groups is used to order all the components, and the components are placed in that order without going through the process of ordering of components within groups.

Figure 20:
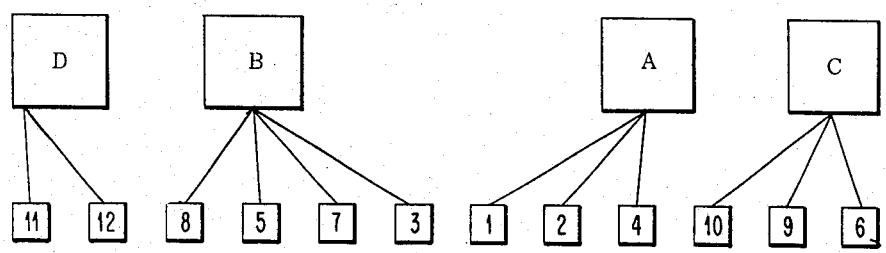
FIG. 20 illustrates groups of interconnected components.

Referring again to FIG. 17, the remaining components are merged to the seeds in order to form groups (block 49). In the previous step (block 48) the seeds have been generated. Now, for each of the remaining components, the sum of the connectivity values between each of the remaining components and all the components in each seed is computed. For example, component 4 and the components in seed A have connectivity values $C_{14}$ (or $C_{41}$) and $C_{24}$ (or $C_{42}$) of 2.5 and 2.5. The sum of these values is 5.0, which represents the interconnectivity of component 4 to seed A. Similarly, the interconnectivity values of component 4 to seeds B, C and D are computed. Component 4 is then merged into the group to which it is most highly interconnected; in this example, seed A. This process is carried out for all the remaining components, in the order of the connectivity to other components (FIG. 18B at 66). If there is a tie in connectivity value, a choice is made to pick one with the least components in the group. If there is still a tie, than an arbitrary choice is made. As illustrated in FIG. 18C at 63, groups A, B, C and D have been formed from seeds A, B, C and D and the list of components in each group is generated. FIG. 20 illustrates the groups and components.

Figure 21:
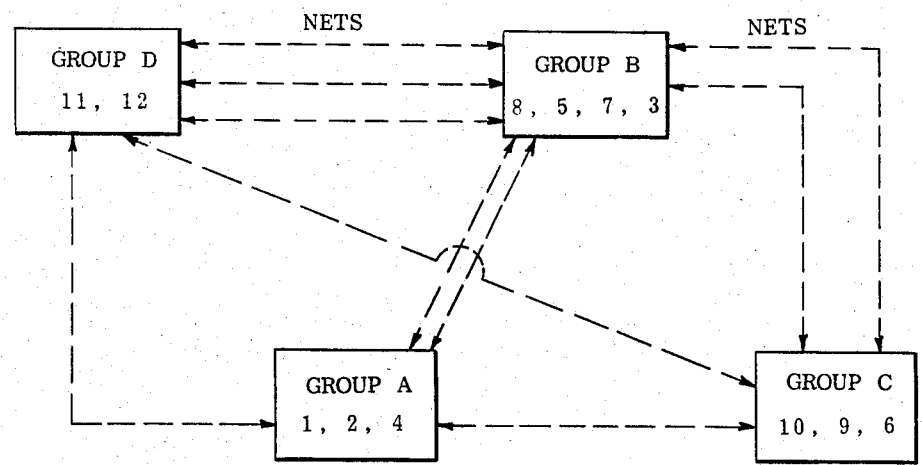
FIG. 21 illustrates nets connecting groups of components.

Referring again to FIG. 17, the connectivity of the groups is generated and the order of groups based on connectivity is generated (block 51). FIG. 19A shows a connectivity matrix for the groups formed in the clustering phase. The nets connecting groups A, B, C, D are shown in FIG. 21. The calculations are the same as those performed for the component-to-component connectivity matrix, except that for this matrix the interconnectivity between the groups is computed. These values are sorted as before, as shown in FIG. 19B. In FIG. 19A, groups B and D are shown to have the highest interconnectivity to each other with group B having the highest summed value, so B is picked first followed by D (see FIG. 19B). Next the connectivity of the remaining groups to the already picked group is calculated by summing the values in the rows corresponding to the already selected group. In the example of FIG. 21, the values for the remaining groups A and C are computed by adding the values in row A, column B+row A, column D=3.39+1.73=5.12. Similarly for C; row C, column B+row C, column D=3.39+1.73=5.12. Since these values are equal, an arbitrary choice of A is made producing the final ordering of the groups shown in FIG. 21 at 77.

After the group order is established, the components within each group are reordered (FIG. 17, block 52) based on connectivity. The same algorithm as was outlined for ordering of groups is now applied to the individual components within the groups to produce the final ordering shown in FIG. 21 at 79. For Group B, which is the first group, the order is kept as it was generated during seeding and merging because the most highly interconnected components were picked in the original merging process. Then, the most highly interconnected component to already picked components is determined. The connectivity between components in Group D and Group B shows that component 12 is highly connected to components in Group B and should be placed before component 11. Thus, rearrangement of components within the groups is carried out based on their connectivity to already chosen ones.

It will be understood by those having skill in the art that ordering of components can also be accomplished without creating seeds and clusters or groups. Also, different clustering techniques or ordering techniques can be used to generate the above order. Different clustering and ordering techniques are illustrated in Chapter 5 of *Design Automation of Digital Systems—Theory And Techniques,* cited above. Even a random order can be used for placement onto the unit image as outlined below. The quality and time taken to optimize may vary depending upon the ordering and clustering technique employed, but steps outlined below still can be followed to optimize placement. Now that the steps of clustering and reordering have been accomplished, the clustered and reordered components will be placed on the unit image (FIG. 2 at 23).

6. Placement Optimization: Unit Size

Referring now to FIG. 22, the detailed steps of placing the unit size components on the unit size card (block 23, FIG. 2) will be described. FIG. 22 summarizes the processing steps for unit size placement and optimization. Unit size placement and optimization generally involves the four major steps of generating initial placement (block 81), improvement of placement by superpositioning (block 82), iterative improvement (block 83) and generating locations for macro-model initial placement (block 84). Processing for each of these steps will be described in detail below.

Referring now to FIG. 23, the detailed steps in initial placement are illustrated. Processing begins with the unit size model, a simple example of which was illustrated in FIG. 13. In order to better illustrate the processing involved in the unit size placement optimization, the unit size model for the twelve component example of FIGS. 18A–18C, 19A, 19B, 20 and 21 will be employed. FIG. 24 illustrates the unit and macro size models for the twelve component example of FIGS. 18A–21. The unit sizes and macro model sizes of components and unit and macro image sizes are calculated as described in the "Unit and Macro Model Forming" section above.

Figure 25A:
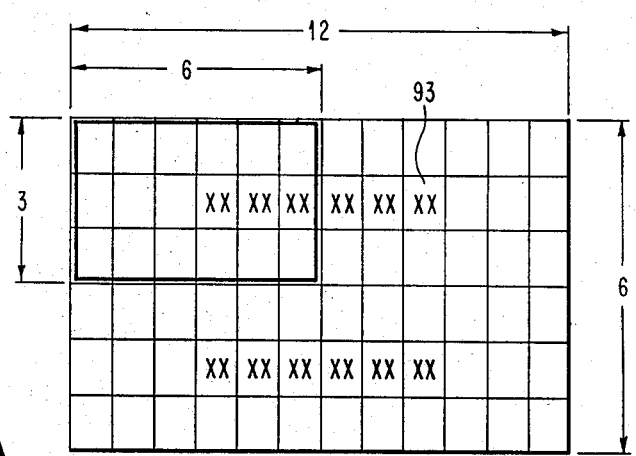
FIGS. 25A and 25B illustrate a doubled unit size card.

Referring again to FIG. 23, the first step is to double the X and Y dimensions of the unit size card and to map down I/O locations onto the double size unit card (block 86). Doubling of the unit size card is carried out to permit the interconnected components to be placed freely during initial placement based on the interconnections thereof; this will produce a placement with the components in the correct locations relative to each other, but possibly distorted or falling off the actual unit image. This initial placement phase begins in the middle of the double-sized unit image, eliminating the need to determine a "seed" location as a starting point on the unit image. The doubled unit size card and the mapped I/O locations 93 thereon are illustrated in FIG. 25A for the twelve component example of FIG. 24.

Figure 25B:
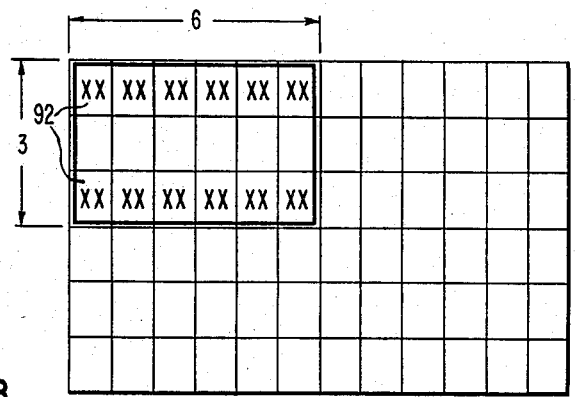

The I/O locations for the unit image are as shown in FIG. 25B. The I/O locations 92 of the unit image are mapped onto the double unit size card by shifting towards the center of the double image by ½ the number of rows and columns of the unit image as illustrated in FIG. 25A. In the example, the unit size image is 3 units X and 6 units Y, so each I/O is shifted 3*½=1.5 in the X direction and 6*½=3 in the Y direction. Mapping of I/O's is carried out because connections to I/O's are considered during weighted distance calculation for placing components as described below.

Referring again to FIG. 23, the next step of placing components (block 87) by a constructive placement technique is described. The order in which components are placed was generated earlier during clustering and ordering (FIG. 21, block 79). If there is a preplaced component on the original image, its corresponding location is generated on the unit image and then the location is shifted in the manner described above for I/O locations. Also, if there is a blocked area which has been converted to a unit image, it is also correspondingly translated to locations on the double image card and these locations are flagged such that they are not available for placement of components. If there are any preassigned components, then the cost for placing the next unplaced candidate component is evaluated and this candidate component is placed at the location with least cost as described more particularly below.

Ordered components are placed one by one on double the unit image in the order generated in the clustering and reordering phase. The most highly connected component in the first group, i.e., #8 of Group B in the example of FIG. 21, is placed in the center of the double image (see FIG. 26, at 96). A location occupied by a component is unavailable for placing other components. The next component to be placed is #5 from same group B.

The zero center of gravity is calculated for the candidate component based on its connections to already placed components. The detailed calculations for zero center of gravity are described below with regard to Eqs. (10) and (11) and FIG. 30. A list of available locations is created by expanding from zero center in $-X$, $-Y$, $+X$, $+Y$ directions by one unit at a time until a minimum of twenty locations are obtained or until no more locations are available. This available locations are called candidate locations.

The cost of placing the component #5 is calculated for the list of candidate locations using Eqs. (3) and (4) as described below.

$$\text{Cost} = \sum_1^p \frac{(Hwt * ABS(X_i - X_c) + Vwt * ABS(Y_i - Y_c))}{\# \text{ of connections to all placed components and I/O's in each net}} \quad (3)$$

$$\text{Cost} = \text{Cost} + \text{Loccost} \quad (4)$$

where, p=all nets associated with candidate component that include a connection to an an already placed components or to an already assigned I/O.

$X_i$=column location of already placed component or preassigned I/O or nearest I/O to the candidate location if candidate component has a connection to an I/O which was not preassigned.

$Y_i$=row location of already placed component or preassigned I/O or nearest I/O to the candidate location if candidate component has a connection to an I/O which was not preassigned.

Xc=candidate column location for candidate component being placed for which cost is being evaluated;

Yc=candidate row location for candidate component being placed for which cost is being evaluated;

Hwt,Vwt-horizontal and vertical weights, respectively, for biasing length. These are values determined after an initial placement is made and will be explained during wireability analysis after the initial placement step is explained. They will both be set to 1.0 in the initial phase, and therefore will have no effect on the calculation of cost here. They are used to bias placements in horizontal or vertical direction, once the channel demand utilizations are known, after initial placement.

loccost-cost associated with occupying a location.

Figure 26:
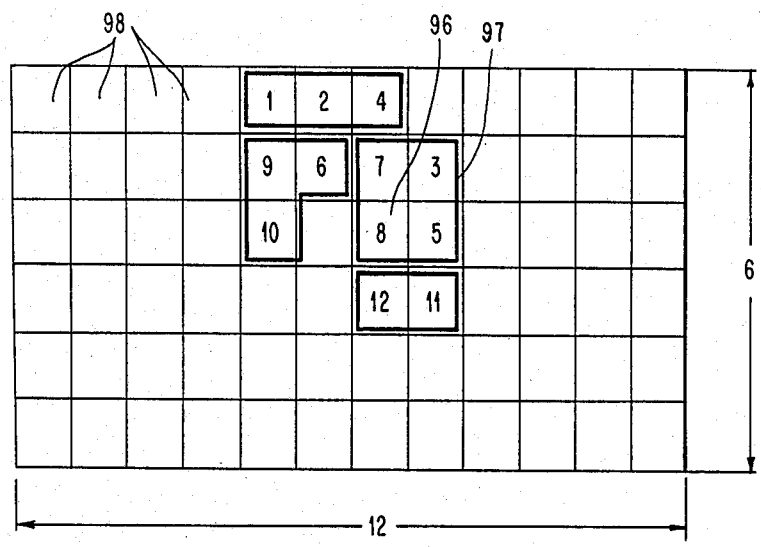
FIG. 26 illustrates initial placement of unit size components.

This is also determined after an initial placement and is explained after wireability analysis. It is set to 0.0 in this initial phase and hence will have no effect on the calculation of cost for the first phase. The cost of occupying a location is added to the total cost when it is desired that the location should not be occupied by a component. Any reserved areas or areas occupied by preplaced components are unavailable locations and cannot be in the candidate location list. The location with the minimum cost is picked as a candidate location for the component to be placed. If there is a tie in cost, an arbitrary choice is made. For candidate component #5, the location chosen for it is shown in FIG. 26 at 97.

The above described process of placing one component at a time is carried out in the order generated in the clustering and ordering phase. All the components are processed in this way and a location is generated for each of them. This technique is known as constructive placement and is also described in Chapter 5 of *Design Automation of Digital Systems—Theory and Techniques*, cited above, and in an article entitled *The Chip Layout Problem—A Placement Procedure for LSI* by K. H. Khokani and A. P. Patel, 14th Design Automation Proceedings, 1977, p. 291-297. An initial placement generated through this process is shown in FIG. 26. Referring to FIG. 26, it is apparent that the placement has assumed a different shape than the desired 6 by 3 unit image. If component 8 was placed with a seed location on unit image, the solution generated through this constructive phase would generally be of lower quality. Doubling the unit card image removes this drawback and permits components to be placed according to their connectivity.

Referring again to FIG. 23, after component placement on the double unit size card (block 87), empty rows and columns are removed and placement is shifted to upper left corner (block 88). The number of total empty columns from the left corner of image are determined. In the example of FIG. 26, four columns are empty as shown at 98. For each component a location exists based on its placement. Each location has a row and column associated with it. The new locations are generated by the following equations:

$$\text{Column}_{(new)} = \text{Column}_{(old)} - \text{empty columns} \quad (5)$$

$$\text{Row}_{(new)} = \text{Row}_{(old)} - \text{empty rows} \quad (6)$$

Empty rows and columns are from the upper left corner and locations in these rows and columns do not have any components placed in them. Row$_{(old)}$ and column$_{(old)}$ refer to the row and column of component locations before moving and row$_{(new)}$ and column$_{(new)}$ refer to locations after moving.

Thus, in the example of FIG. 26, all component locations are shifted 4 columns to the left by subtracting 4 from the X (column) value of each component's location. If there are any totally empty rows from the left upper corner, the number of empty rows is subtracted from the Y (row) value of each component's location. Unshifted components and their locations are shown in FIG. 26, with the corresponding placement after shifting illustrated in FIG. 27. This step is carried out because the final objective in the unit size phase is to generate an optimized placement on the unit image, and an area 6×3 from the upper left corner 100 represents unit image for this example.

After empty rows and columns are eliminated (block 88, FIG. 23), the channel crossings and total channel crossing utilizations in the horizontal and vertical directions for this placement are evaluated (block 89). This step is also called wireability evaluation.

The channel supply is the number of tracks available for wiring. For the input example described in FIG. 8 and in the processing of data for unit model and macro model sections earlier, the number of horizontal and vertical tracks available for wiring for each grid point of the image under consideration is determined. The total number of tracks avaialable across each row or each column is obtained by adding up the available tracks across each row (in the horizontal direction) and each column (in the vertical direction). See FIG. 28A at 102, 103. The example shown in FIG. 28A is smaller in size, for illustrative purposes.

Figure 28A:
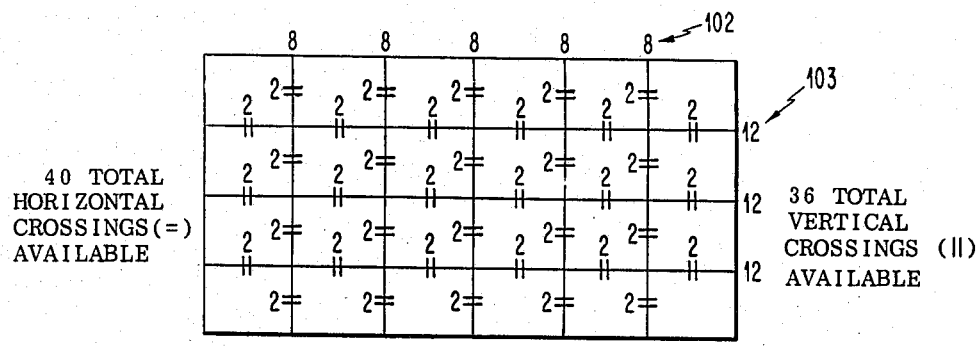
FIGS. 28A-28C illustrate channel supply calculations.

Also as shown in FIG. 28A, the total channel supply (or available tracks for wiring) in the horizontal direction is obtained by summing the tracks available for each row (calculated above). Similarly, the total vertical channel supply in vertical direction is obtained by summing the tracks for each column (calculated above).

A net list (FIG. 16) defines the connections between components. Now that all components are placed, one can evaluate the paths needed to connect them by wires. Each component has a row and column for the location it occupies. Paths are generated for each net on the image. The routes these paths must follow are generally dependent upon technology constraints. Certain technologies permit a Steiner tree, some require minimum spanning tree and some require a source to sink type of tree. These trees depend upon the process and ground rules used during manufacturing set-up. These trees are described in Chapter 5 of *Design Automation of Digital Systems—Theory and Techniques*, cited above.

An example of a minimum spanning tree will be shown. The Manhattan distance between two points is calculated as follows:

$$\text{Distance} = ABS(X_1 - X_2) + ABS(Y_1 - Y_2) \quad (7)$$

where $X_1$, $Y_1$ are column and row for component 1 location and $X_2$, $Y_2$ are column and row for component 2 location, and ABS is the absolute value function.

Figure 28B:
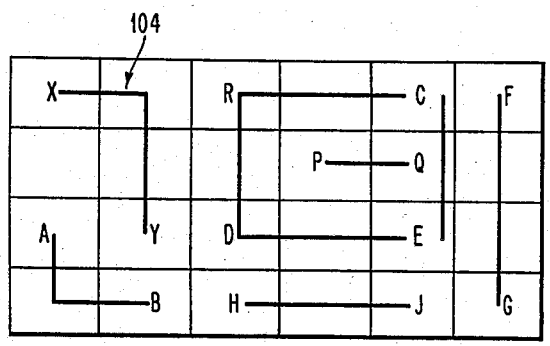

Row and column locations of components connected in a net are generated in a list. Row and column coordinates for each of these points are summed. The component with the lowest sum of row and column coordinates is picked as the starting point. The Manhattan distance is calculated from this point to all other points in the list, using Eq. (7), and the next connecting point chosen is the one with the shortest Manhattan distance from the starting point. A running total of length is kept by adding each calculated Manhattan distance. The rest of the list is processed to produce the minimum spanning distance connecting all points in the net. For each connection, the number of units needed in the X and Y direction is also known based on the Manhattan distance calculated for each connection. Examples of the above described processing are shown in FIG. 28B. The above steps are carried out for the nets connecting all components. These paths are just tentative paths to evaluate the quality of placement and to guide through the rest of the steps outline below.

Figure 28C:
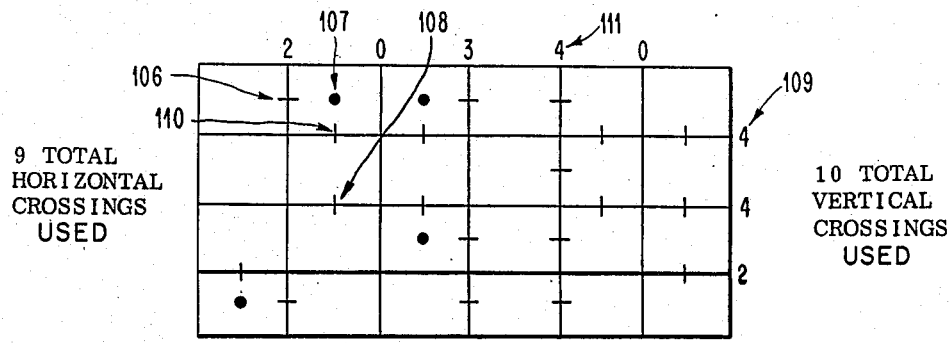

FIG. 28B shows some of the connections for minimum spanning tree. Components X and Y are connected by a path shown in FIG. 28B at 104. Referring to FIG. 28C, this path requires one unit of horizontal channel demand at the column 1, row 1 crossing 106, one unit of vertical channel demand at the column 2, row 1 crossing 110, and one unit of vertical channel demand at th column 2, row 2 crossing 108. A via 107 is required at the intersection of columns 2, row 1. This is done for all the nets connecting all the components. Some of the other connections are shown in FIG. 28B for the paths C-R-D-E; F-G; A-B; etc., with the corresponding channel demands for these paths as shown in FIG. 28C.

Using the connection tree as shown in FIG. 28B, the horizontal and vertical crossing of each grid point boundary for all connections made are generated. The sum of all crossings for each row 109 and column 111 is computed, by adding the values across each row and each column. Also, the sums of all horizontal crossings and vertical crossings are calculated. These values, shown in FIG. 28C as total horizontal and vertical crossings used, respectively, are used to calculate the total horizontal and vertical channel crossing utilizations (FIG. 28C) based on the total available supply of channels (FIG. 28A). It is evaluated by generating the ratio of demand/supply of channels and multiplying by 100 to obtain the percentage utilizations in the horizontal and vertical directions. In the example of FIGS. 28A–28C, the total horizontal crossing utilization is calculated by dividing the sum of all horizontal crossings used $(2+0+3+4+0)=9$ by the total horizontal crossings availabe, i.e., $9/40=0.23$ or 23%. Similarly, the total vertical crossing utilization is calculated $(10/36=0.28$ or 28%).

The values for total horizontal and vertical channel crossing utilizations are used to calculate Hwt and Vwt, the horizontal and vertical weight for biasing length. Hwt and Vwt are used to further optimize the placement as described below.

If horizontal utilization is higher, then Eq. (8) below is used. If vertical utilization is higher, then Eq. (9) below is used. If horizontal and vertical utilizations are equal, then Hwt and Vwt are both set to 1.0 again.

$Hwt=Hwt+Rmultp*ABS$ (Difference in utilizations)

$Vwt=1.0$ (8)

$Vwt=Vwt+Rmultp*ABS$ (Difference in utilizations)

$Hwt=1.0$ (9)

Rmultp has been experimentally set up as 0.02. It is possible that better placement could result with other values in the range of (0.01–0.3). Hwt and Vwt, are used in the cost function (Eq. (3)) to bias placements in horizontal or vertical direction during the superpositioning improvement and iterative improvement phases as described below.

The locations on the periphery of the desired unit image (FIG. 27 at 99, 101) are assigned a higher cost. An additional cost of 5 units is added to the row and column locations adjacent to and outside the boundary of the unit image. The cost for a location outside the boundary of the unit image is increased by an amount equal to the Manhattan distance of the location from the unit boundary. This additional cost is added in Eq. (4). Loccost for all locations within the unit boundary will be 0.0. These cost values are used in superpositioning and iterative improvement as described below.

Referring again to FIG. 22, once the initial placement for unit size (block 81) has been accomplished, the step of superpositioning improvement is carried out (block 82). This step has been implemented because during the constructive placement phase (block 81) each component is assigned one location at a time. Thus, when a component's cost is being calculated, only the connections to already placed components are accounted for. Quite often half or more of a component's connections are not considered because these connections are to unplaced components. Superpositioning overcomes this shortcoming. Also, since a placement has been already generated, the weighting factors generated earlier (i.e., Hwt and Vwt) can be used in the calculation of cost (Eq. (3)), to bias the placement and thus produce a better solution.

Figure 27:
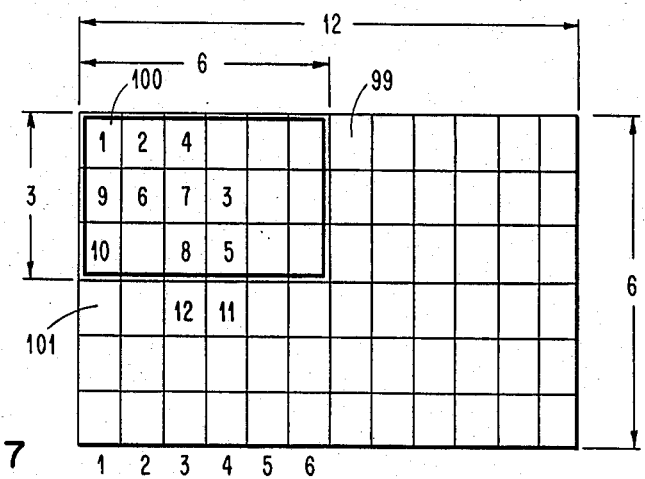
FIG. 27 illustrates the shifted placement of unit size components.
Figure 29:
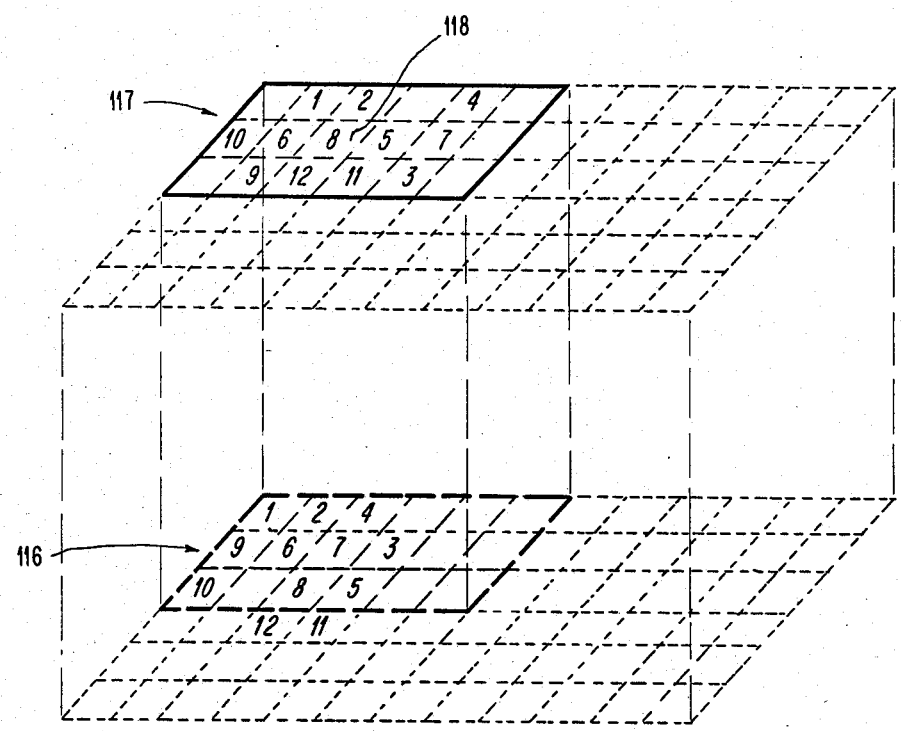
FIG. 29 conceptually illustrates superpositioning.

Superpositioning begins with the placement generated in the initial placement step (block 81) as exemplified in FIG. 27. FIG. 29 illustrates the initial placement at 116 and the improved placement generated by superpositioning is shown at 117. The superpositioning algorithms are described below.

Another image (FIG. 29 at 117) is assumed to lie above the initial placement image (FIG. 29 at 116) with the same dimensions. No components are placed on image 117 initially. Superpositioning involves picking candidates sequentially from the ordered list of components generated during clustering and ordering, evaluating the picked component's zero center of gravity, generating a list of locations in a window, calculating the cost of placing the components in those locations based on Eqs. (3) and (4) above, and picking a location with the least cost. A detailed example is illustrated in FIG. 30.

Figures 30, 31:
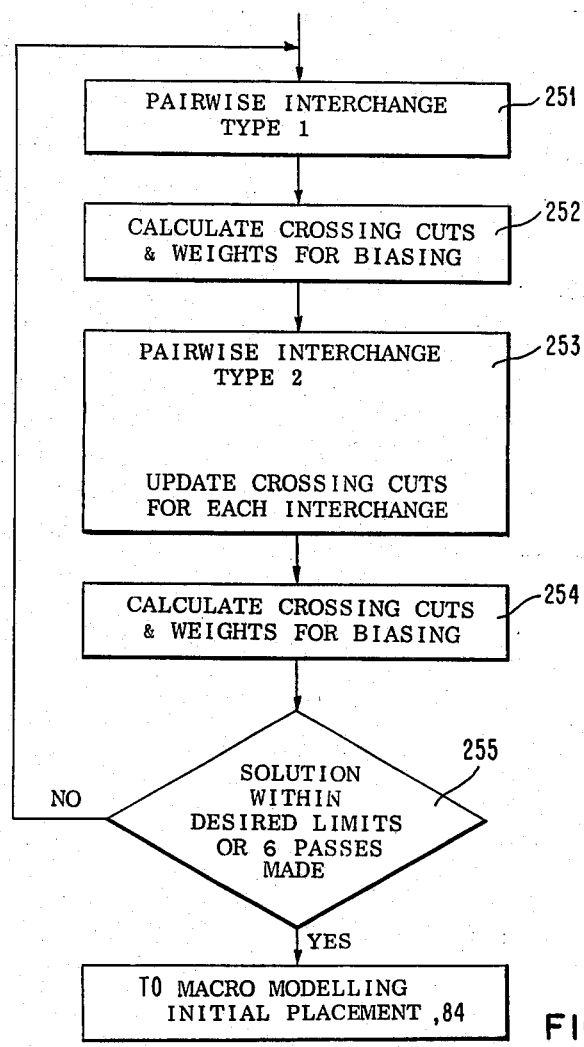
FIG. 30 illustrates a calculation of zero center of gravity.
FIG. 31 illustrates the interchange passes for iterative improvement.

Referring to FIG. 30, a calculation of each component's zero center of gravity 113 with respect to other components connected to it by nets is made, because if a component is placed near its zero center, its placement will be optimized. The net list shown in FIG. 16 is used to identify all the nets connected to a candidate component and all of the components in each net. When this information is known, the zero center of gravity is calculated in two steps:

Step 1: Calculate the center of gravity for each net having a connection to the candidate component using the following formula:

$CG_X=(X_1+X_2+\ldots+X_n)/n$ (10)

$CG_Y=(Y_1+Y_2+\ldots+Y_n)/n$ where, $CG_X$=the row center of gravity coordinate for a net
$CG_Y$=the column center of gravity coordinate for a net
$X_i$=the row coordinate of the ith component connected to the candidate component
$Y_i$=the column coordinate of the ith component connected to the candidate component
n=the number of connections in the net Step 2: Calculate the zero center of gravity for the candidate component as follows:

$ZCG_X=(CG_X(1)+CG_X(2)+\ldots+CG_X(m))/m$ (11)

$$ZCG_Y = (CG_Y(2) + CG_Y(2) + \ldots + CG_Y(m))/m$$

where,
$ZCG_X$ = the row zero center of gravity coordinate
$ZCG_Y$ = the column zero center of gravity coordinate
m = the number of nets in which the candidate component appears The zero center of gravity 113 is calculated for a component Y at location 122 as shown in FIG. 30. Consider net 1 (119) connecting component Y and components A, B, C. Consider net 2 (121) connecting component Y and components D and E. The center of gravity 114 connecting components A, B, C is evaluated by summing the row and column locations of components A, B, C and dividing the result by three. Similarly for net 2, the center of gravity 112 is calculated. Now to calculate the zero center 113, the row and column of center of gravity of net 1 and net 2 are summed and divided by 2 since two nets are involved. Locations within a window or a rectangular area (5×5) from the zero center of gravity 113 are chosen as target locations for which cost of placing candidate component is evaluated. If no locations are available within the window, then the window is enlarged in −X, −Y, +X, +Y directions by 1 unit at a time, until at least 10 locations are available or until all locations have been searched.

For the twelve component problem (FIG. 29 at 116), the first component in the ordered list (i.e., component 8) is picked as a candidate component. Its zero center of gravity is calculated and the costs of placing it in the target locations superimposing image 117 are evaluated using Eq. (3). The values of Hwt and Vwt calculated earlier (FIG. 23, block 91) are used to bias the placement. Also, Eq. (4) is evaluated in order to add the cost associated with occupying a location assigned earlier. The location with the least cost is picked and the component is assigned that location. In case there is a tie in cost associated with least cost locations, an arbitrary choice is made. The result for component 8 is illustrated in FIG. 29 at 118.

Now the next component (i.e., component 5) from the ordered list is picked. Its zero center is evaluated as described above. For its connections to component 8, the new location assigned to it during the superpositioning phase is used. Again the cost for placing component 5 is calculated using Eqs. (3) and (4). For the components already placed on the superimposing image, the new locations are used during cost calculations, otherwise the old locations on the original image are used. Again, the location with least cost is assigned to component 5.

The above described procedure is carried out until all components from the ordered list are placed on the superimposing image. This new placement has generally more balanced channel utilizations because the values of Hwt and Vwt based on original placement are used to bias cost during placement. Also, the quality of placement is better because all connections for a component are considered during this phase.

The total horizontal and vertical crossings available (FIG. 28A), horizontal and vertical utilizations (FIG. 28C), and weighting factors Hwt and Vwt (Eqs. (8) and (9)) are evaluated as described previously for the new placement. These will be used during the iterative improvement phase to be described below.

Referring again to FIG. 22, after the superpositioning improvement (block 82) is accomplished, pairwise interchange techniques (FIG. 31) are employed to obtain iterative improvement (block 83). Pairwise interchange techniques are well known. See, for example, Chapter 5 of *Design Automation of Digital Systems—Theory and Techniques*, cited above, *The Chip Layout Problem—A Placement Procedure for LSI*, cited above, and *Placement of Variable Size Circuits on LSI Masterslices*, by K. H. Khokani et al., 18th Design Automation Conference Proceedings, 1981, p. 426–434. The interchange technique utilized here is similar to the zero ground approach described in *Placement of Variable Size Circuits on LSI Masterslices*, cited above and also similar in certain respects to force directed interchange referred to in Chapter 5 of the above cited book. Basically, a pairwise interchange involves evaluating cost of placement of two components in their current locations and recalculating their cost after swapping their locations. If there is a weighted gain in the new locations, then a swap is made and new locations are assigned to two components. This is carried out for all components on all locations. FIG. 31 illustrates the steps of pairwise interchange.

Referring now to FIG. 31, a window or rectangular area (5×5) near the zero center is utilized. First the zero center is evaluated for a component, as described above. Then, the cost of pairwise interchange in the target locations in the window is calculated according to Eq. (13), below. The swap with the best gain is carried out. This process is carried out for all components once. This is called interchange type 1 (block 251) with Eqs. (3) and (4) as the cost function, as described below.

Up to this point, the placement has only worked with unit size components and was based on the average size of components as calculated earlier in the modelling steps. Now an additional function called the probability of fitting function is added to account for the size variation among components and to increase the probability of fitting all components across each row or column when expansion to macromodel and actual size image takes place.

First, the total space utilization (area of the card occupied by components) is calculated as shown below. By multiplying the width and height (X and Y dimensions) of each component and adding the total together, the total area occupied on the image by components can be calculated. By dividing this total by the total area available on the card (FIG. 24), total area utilization can be calculated. For the twelve component example it is 54.24% (FIG. 24). It is desirable to leave empty space between components to enhance wireability, so a value of area used, halfway between the maximum possible and actual area used, is calculated as a target goal.

Desired occupancy across row or column = (12)

$$\frac{\text{actual occupancy} + \text{full occupancy}}{2} = 77\% \text{ or } .77$$

The probability of fitting cost function is described below. It involves summing the actual dimension of components across a row or a column and assigning a higher cost of occupying a location if the sum of the dimension of components occupying a row or column exceeds the desired goal of occupancy as calculated above. This function facilitates expansion to other images without too much perturbation.

Thus, based on the placement of components after superpostitioning (illustrated in FIG. 29 at 117), the total width required across each row can be obtained by adding individual widths of components placed in that row. For example, for row 2, the actual widths of components 10, 6, 8, 5, 7 are added. The total is 46. The total dimension of actual image is 48 and is still within limits. The desired percentage value can be multiplied by the actual X and Y dimensions of the card to determine the maximum number of units in each direction to use:

0.77*48 (X dimension) = 37 units maximum in X, 0.77*28 (Y dimension) = 22 units maximum in Y.

These values will be known as the XLIMIT and YLIMIT.

The probability of fitting cost function is now introduced to take into account the actual sizes of the components on the actual image.

$$Cost_n = (Cost\ (Eq.\ (3)+(4)) + DWT1*(ROWSUM-XLIMIT) + DWT2*(COLSUM-YLIMIT) \quad (13)$$

where, $Cost_n$ = the cost of target location taking into account the component sizes on the actual card image and the total area utilized by all the components.

DWT1, DWT2 = the dimension weights used to bias the cost for heavily populated rows. Their values are:
= 0 is ROWSUM/COLSUM < the limits for the row/column containing the target location
= 1.5 if ROWSUM/COLSUM > the limits for the row/column containing the target location;
= 5.0 if ROWSUM/COLSUM > dimensions (X or Y) of the card.

ROWSUM, COLSUM = the sum of actual dimensions across the row or column for target location.

This added cost function tends to distribute components based on their dimensions and also prevents the placement from exceeding the X or Y dimension across a row or column, and increases the probability of fitting components on card when mapped on to the macro model and actual images, while still retaining optimized placement at lower levels of modelling.

At the completion of the above described interchange type 1 pass, the total horizontal and vertical crossings available (FIG. 28A), the horizontal and vertical utilizations (FIG. 28C), and weighting factors Hwt and Vwt (Eqs. (8) and (9)) are evaluated as described previously for this placement (FIG. 31, block 252). These will be used in the interchange type 2 pass as described below.

At this point an interchange type 2 pass (FIG. 31, block 253) is carried out. As before, some form of tree structure (Steiner, minimum spanning, half perimeter, etc.) is used to specify the connections to be made. As in the interchange type 1 pass, a window about the zero center for each component is used as the search area for the component interchanges. The difference in this pass is a modification of the cost function as specified below. Note that the minimum spanning tree is used in this example. The cost is calculated as follows:

$$Cost_c = \sum_{1}^{n} MST\ Length \quad (14)$$

$$Cost_c = Cost_c + \sum_{1}^{n} (Xcrossing - X\ upper\ value) * Cwt + \quad (15)$$

-continued $$\sum_{1}^{n} (Ycrossing - Y\ upper\ value) * Cwt$$

Then the actual sizes of the components on the actual image are taken into account by using the probability of fitting function previously described in Eq. (13), as follows:

$$Cost_c = Cost_c + DWT1*(SUMROW-YLIMIT) + DWT2*(SUMCOL-XLIMIT) \quad (16)$$

where, n = number of nets for a component

MST length = minimum spanning length evaluated as described earlier

Cwt = weighting factor for crossing cut biasing. A value of 2.0 is used based on experiments X upper value = 90% of the maximum crossing cut in the X direction obtained in a fashion similar to that explained in wireability evaluation.

Y upper value = 90% of the maximum crossing cut in the y direction obtained in a fashion similar to that explained in wireability evaluation.

X crossing = actual crossing cut at the column boundary associated with the location of the components (evaluated as explained in wireability evaluation).

Y crossing = actual crossing cut at the row boundary associated with the location of the components (evaluated as explained in wireability evaluation).

The probability of fitting function is already described earlier for an interchange of type 1.

Figure 40A:
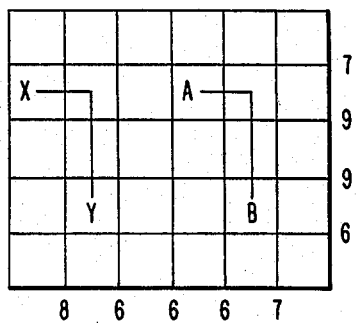
FIGS. 40A-40C illustrate a calculation for cost, channel crossings and total crossing cuts during iterative improvement.
Figure 40B:
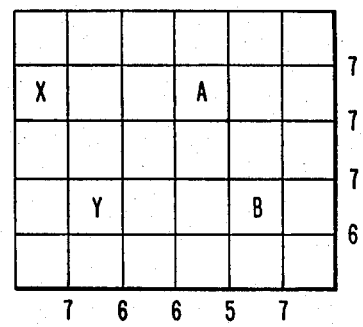

During an interchange of type 2, the cost defined in Eq. (16) is calculated for the two components to be interchanged in their current locations (see FIG. 40A). Then the channel crossings for the paths for the nets associated with these two components are removed from the total crossing cuts at the row, column boundaries (see FIG. 40B). Based on the swapped locations of the two components, the channel crossings for the paths of the nets associated with the two components, crossings cuts are added to the row, column boundaries the paths cross (see FIG. 40C).

Figure 40C:
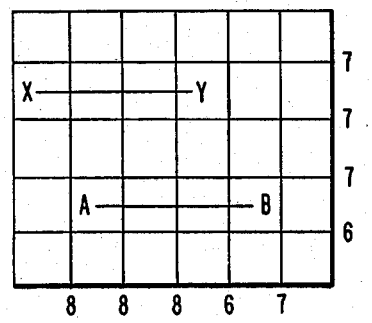

The cost of probability of fitting function is added to the cost. Next, the cost based on current location and cost based on swapped location are compared and if there is a net gain, the components are swapped, and the channel crossing cuts are updated to reflect their swap. Thus, the crossing cuts in FIG. 40C are now the crossing cuts to be used for next swap of candidates.

The steps involved in type 2 interchange are similar to those described in type 1 interchange pass, i.e., evaluate zero ground, generate a list of locations in the window, evaluate cost as per this new function, pick the one with maximum gain and then update crossing cuts across boundaries.

This interchange of type 2 is carried out for all components once in its pass. This crossing cut optimization tends to more evenly distribute the demand across each boundary and thus it enhances wireability.

The two interchange types are intermixed. The wireability evaluation, crossing utilizations and Hwt, Vwt are recalculated after every interchange pass (FIG. 31 at 252, 254). A minimum of four passes is carried out and if the channel utilizations exceed 50%, an additional two passes are carried out (FIG. 31, block 255). It has been observed experimentally that when channel crossing utilizations exceed 50%, the probability of successful automatic wiring decreases and hence additional interchange passes are performed to improve placement. Also, it has been observed that making more than two additional passes at the unit level does not generally improve placement quality significantly.

Figure 32:
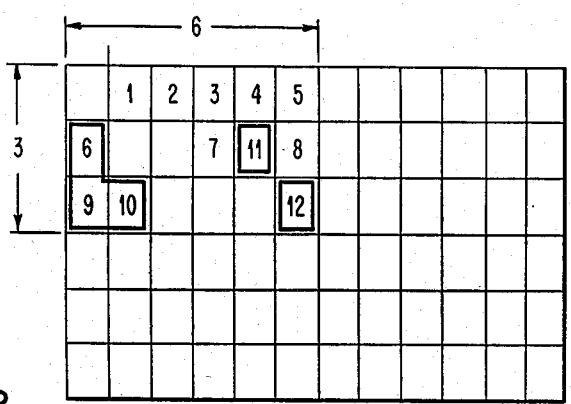
FIG. 32 illustrates final optimized placement for the unit model.

After the above described iterative improvement process, a final placement is obtained on the unit level (FIG. 32), which has been optimized for crossing cuts, and for probability of fitting and for distribution of empty space. The advantage of modelling at this level is that all components are interchangeable even though they may vary in dimensions. The desired result is to obtain a good relational placement, which can be utilized to generate optimized final placement. Also, if the components do not vary in size by more than 20% in each direction, then already a very good optimized placement has been obtained with a high degree of probability that when actual placement on the final image is generated, it will be similar to this relational placement.

Figure 33:
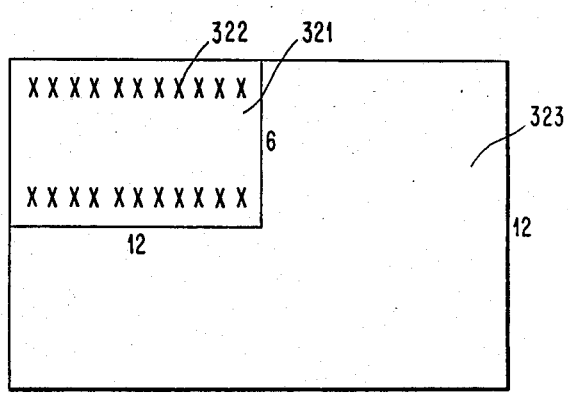
FIG. 33 illustrates a double size macro model image.

Referring again to FIG. 22, the final step in unit size placement optimization is that of generating locations for the macro model initial placement (block 84). The macro model image size is available from earlier calculations (see FIG. 24). As shown in FIG. 33, the macro model image 321 is doubled in size to that shown at 323, for purposes of initial placement of macro model components in a manner which is similar to that performed on the unit image (FIG. 23, block 86). The double image has twice the number of rows and columns and four times the number of grid positions available for placing components. I/O locations are converted to locations on the macro model boundary (FIG. 33 at 322) in the same manner as was done on the unit image (FIG. 23, block 86).

Figure 34:
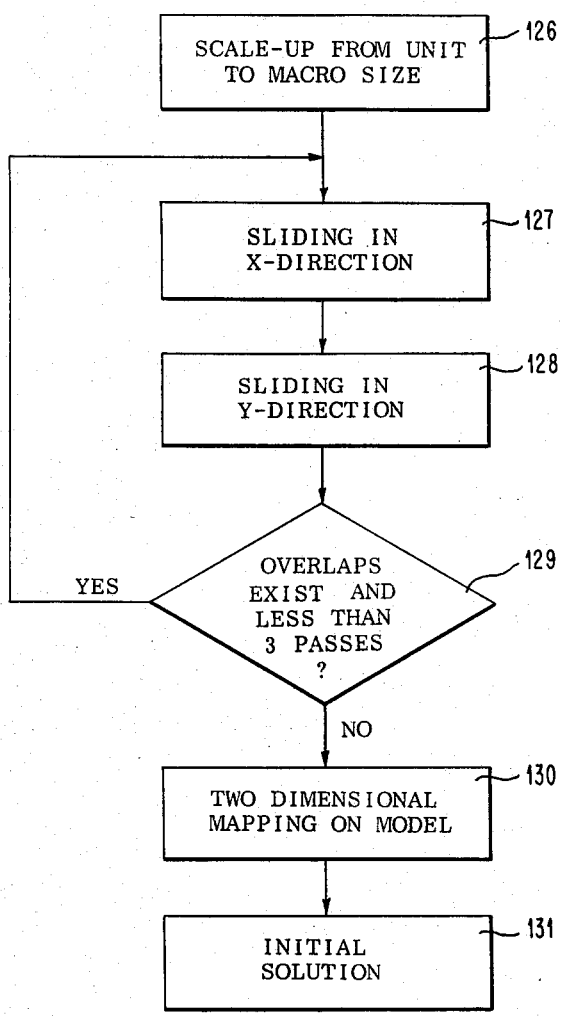
FIG. 34 illustrates the detailed steps of location generation for macro model initial placement.

Referring now to FIG. 34, an overview of the steps for generating an initial placement for the macro model phase is illustrated. Initial placement involves scaling up of locations from unit size to macro model size images (block 126), analysis of overlap situations for macro model size and sliding in X and Y direction (blocks 127 and 128) to remove overlap and to generate tentative locations, and two dimensional mapping down of the macro model components by generating a window near the component's tentative location and placing the components thereon (block 131). It will be noted that the steps described in FIG. 34 are also utilized in generating an initial solution on the actual image from the final optimized macro model placement. The differences will be described below with regard to optimization of the actual image.

The scaling up of locations from the unit image to the macro model image (FIG. 34, block 126) will now be described. FIG. 35A illustrates the locations for all components on unit image for the twelve component example. Since the scale factor as calculated earlier is two in row and column direction (see FIG. 24), the locations are scaled up by factor of two for each component. The formulas employed and sample calculations for component 1 are shown in FIG. 35C. The location for component 1 is row=1, column=2 using the upper left corner as the origin (see FIG. 35A at 135). Thus, component 1 scales up into a corresponding starting location of row=1, column=3 (FIG. 35B at 138) and occupies an area of 2×2 on the macro model image. In a similar fashion, tentative starting locations can be calculated for all components, as are shown pictorially in FIG. 36.

Referring again to FIG. 34, sliding of these tentative locations (block 127) is carried out to take into consideration the macro model sizes of components. Sliding is the process of moving the macro size components a few grid positions up, down, to the left, or to the right in order to remove component overlaps that may exist because the relative locations are converted based on the ratio of the sizes of macro and unit models while individual components have different ratios based on their dimensions. Analysis of one row at a time for the X dimension of components (see FIG. 36 at 132) is carried out to determine if there is any overlap of components and to determine if any empty space across the row is available to slide components. Macro model sizes of all components are known in the X dimension and their starting position X-coordinate is also known. The end locations occupied by each component is thus calculated by adding the X dimension to the starting location and subtracting 1 from the result.

The sliding process begins at the upper left corner of the image. A scan across the first row is done until the first component is located. Its size is X units is then added to the starting location to find the opposite side of the component. The scan then continues until the next component is located. If it overlaps the first component, the amount of overlap is noted. Scanning continues across the entire row, and the total amount of overlap is obtained. If the total is zero, no sliding is performed. Otherwise, starting with the left most component, sliding is performed. If there is room between the card edge on the left and the first component, the first component is slid over to the left edge. The rest of the row is processed to remove overlaps by sliding to the left (if possible), or to the right if sliding to the left generates an overlap. Sliding for columns proceeds in a similar fashion.

Figure 36:
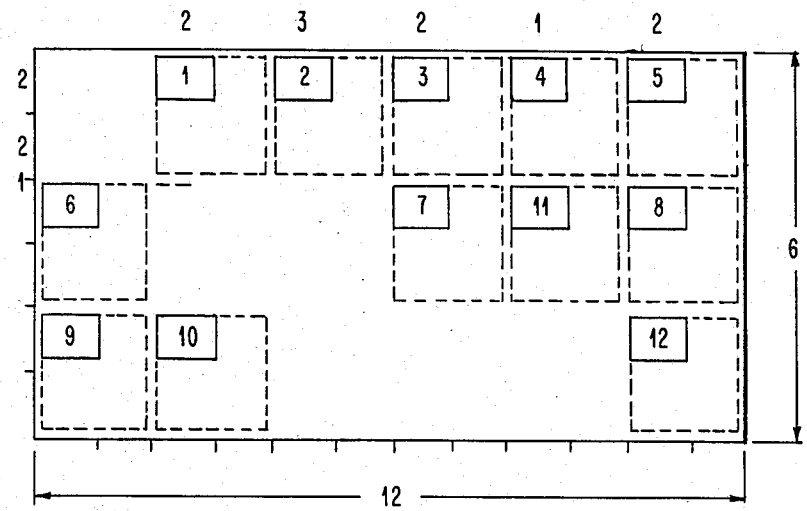
FIG. 36 illustrates tentative starting locations for macro model components.
Figure 37A:
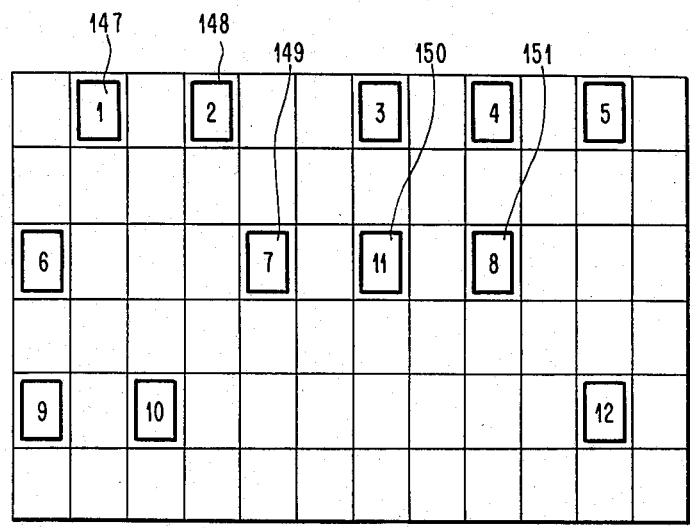
FIGS. 37A and 37B illustrate sliding of components to eliminate overlap.

For the twelve component example of FIG. 36, the above calculations show that across the first row, component 2 overlaps component 3. Analysis of the space across row 1 shows that the sum of the X dimension of the components is 9 and the total slots available are 12, so there is empty space within the macro model image to slide components. Further analysis of empty space shows there are two slots available before component 1, and one slot to slide component 4 towards 5. Since space is available toward the edge of the image, the first step is to slide component 1 by one slot since the overlap of component 2 and 3 is by one slot. Thus, components 1 and 2 have new tentative locations, as shown in FIG. 37A at 147, 148, to eliminate the overlap across row 1.

For the second row, analysis shows that component 8 extends over the edge of the macro model card and also that there is empty space available across that row. Thus, the first step is to move component 8 inside by two slots. Now component 8 overlaps component 11, so component 11 is moved two slots. Now it overlaps component 7, so component 7 is moved toward the left two slots. This removes all overlaps in X direction for that row and new tentative locations are created as shown in FIG. 37A at 149, 150, 151 for components 7, 11 and 8, respectively. Similar analysis for the next row shows no movement is necessary.

It will be noted that if there is no empty space across a row or a column to fit all components, then tentative locations are allowed to fall outside the macro model card image. This may happen for very dense cards due to the rounding off errors in generating macro model sizes for components. The probability function for fitting (i.e., Eq. (13)) ensures that the sum of the actual dimensions of all components across a row or column is smaller than the total space available across a row or column.

Figure 37B:
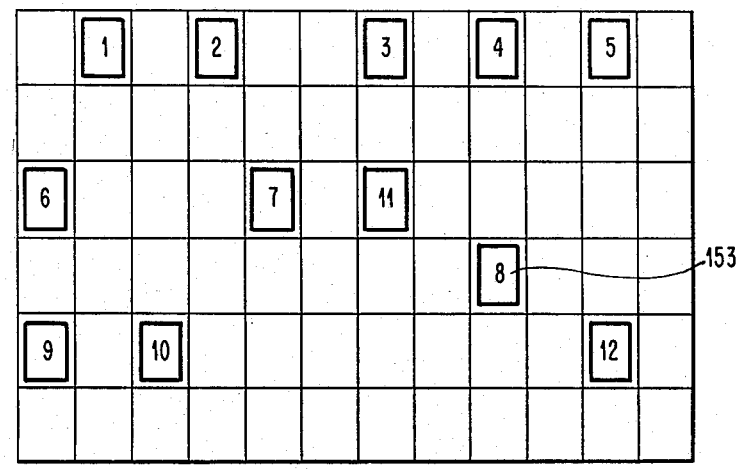

Referring again to FIG. 34, the step of sliding in Y direction (block 128) is carried out in a similar fashion to that in X direction. Analysis of one column at a time is performed, beginning from the upper left corner. In the twelve component example, all the columns until the column for component 4 have no problem. Component 4 overlaps component 8 by one slot and there is no room to move component 4 up towards the edge. Thus, component 8 is moved down by one slot. Now there is no further overlap, in Y direction. The tentative location of component 8 is shown in FIG. 37B at 153.

Additional passes are carried out for sliding in the X direction and in the Y direction because a movement in the Y direction may have caused an overlap in the X direction. If at any one pass of X and Y sliding steps, there is no movement, then the next pass is not carried out. A maximum of three passes of sliding in X and Y direction is carried out to generate tentative locations for macro models (block 129). If at the end of three passes there is still an overlap, it is handled in the next phase where actual mapping of the two dimensional model is carried out.

It will also be noted that during sliding of components, if there are any preplaced or fixed components, then they are not moved and other components are permitted to slide across them. For example, in FIG. 36, if component 7 was preplaced and fixed, then in X direction movement, component 11 will slide across component 7 and will occupy the location currently occupied by component 7 (see FIG. 37A at 149).

Figures 38A, 38B:
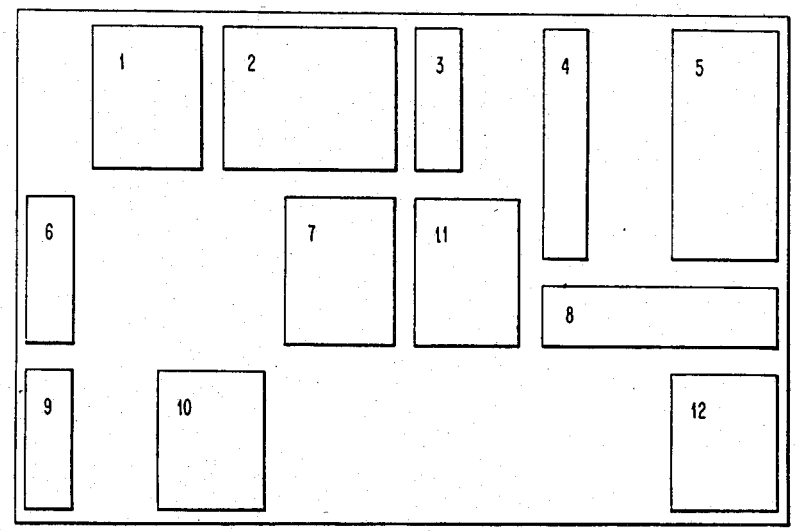
FIGS. 38A and 38B illustrate mapping of components onto a macro image.

Referring again to FIG. 34, the components are mapped onto the macro model (block 130). All the preplaced components are mapped down on the macro model image first. For example, if component 12 is preplaced, then it is mapped down from its location, as shown in FIG. 38A at 156. Then, components from the top left corner (origin) are mapped down one at a time based on their tentative locations generated earlier (FIG. 37B). The initial placement in mapping is from its tentative location created after the sliding steps. Thus, component 1 has tentative starting location of row=1, column=2 and a size of 2×2. Its mapping is shown in FIG. 38A at 154. If, in placing a component based on its tentative location, the component occupies an area already occupied by a mapped component, a search within a window near the tentative location is carried out. The window is formed by adding one unit in all directions from the tentative location and a search for a location within that window that is not already occupied by another component is made. If unsuccessful, the window is expanded by one unit in all directions and the search continues until a location is found. For example, suppose the starting location for component 2 was column=3, row=1, so it would occupy some of the area already occupied by component 1. Then, the search in −X, −Y, +X, +Y directions by one unit from its tentative location is carried out and it will permit component 2 to be placed as shown in FIG. 38A at 157. If a location is not found in the first search, then the window is expanded by one additional unit at a time until a location is found. As explained above, the search is permitted outside the desired macro model image into double the macro image because round off errors in macro modelling may have increased the size of components by half a macromodel unit.

All components from the origin (upper left corner) are placed one at a time. First all preplaced components are placed. Then, all components across the first row, then across the second row from the left edge and then the next row are mapped down one at a time until all components are placed and an initial solution is generated (see FIG. 34, block 131). An initial placement solution (block 131) for the components is shown in FIG. 38B.

It will be noted by those having skill in the art that instead of the steps outlined in FIG. 34, a technique based on attraction and repulsion of forces based on overlap can be used to generate initial placement for the macro model.

It will also be recognized by those having skill in the art that the macro model placement generated in FIG. 34, block 131 has been perturbed from the optimized final relational solution generated at the end of unit size placement (FIG. 22, block 84). This perturbation is exemplified by movement of component 7 toward the center of the macro image. Wider variation in component sizes can cause larger perturbation.

7. Placement Optimization: Macro Size

Referring again to FIG. 2, the initial solution for the macro model is optimized (block 24). The optimization process for the macro model includes many of the same steps as unit size placement optimization (FIG. 22). More particularly, as part of the initial placement, (block 81 in FIG. 22) the horizontal and vertical crossings and channel crossing utilizations performed for the unit model in FIG. 23, block 89, is also performed for the macro model. Also, the weighing factors, calculated for the unit model in FIG. 23, block 91, are also calculated for the macro model. Then, in the manner described for the unit model, placement is optimized via superpositioning (FIG. 22, block 82) and iterative improvement (FIG. 22, block 83), in order to obtain optimized placement for the macro model. Rather than describing each of these steps again, only the differences between unit model optimization and macro model optimization will be described.

As was done in blocks 89 and 91 of FIG. 23 for the unit model, wireability, horizontal and vertical channel utilizations, crossing cuts and horizontal and vertical weights are calculated for macro placement. The center of the macro model of components is taken as the point from which distances are calculated. Pin locations on the actual components can be transformed onto pin positions on the macro models and these pin locations can be used to calculate distances and generate wireability information. Locations on the periphery are assigned weights as outlined earlier for unit modelling. Then, improvement by superpositioning is carried out in a similar fashion as outlined earlier (FIG. 22, block 82). Improvement by superpositioning is more important at the macro model level, since the interchange of two components of uneven sizes becomes complex due to overlaps caused by the interchange of positions. For example, if component 2 (FIG. 38A at 157) wants to occupy an area occupied by component 11 and part of the area occupied by component 7, then their interchange becomes more complex e.g., slide component 7 towards the left, and then interchange components 11 and 2. This becomes more complex since component sizes to be interchanged vary widely. The superpositioning phase tends to facilitate the movement that would be done by the interchanging of components, since the positioning is based on cost, and no overlaps can occur during superpositioning because the components are being positioned on a blank image.

The wireability information (total horizontal and vertical channel crossings) stored for the unit model is compared to that for the macro model placement by comparing the sum of the two values for each phase. If the solution has been perturbed in the transformation to the macro model image, and the total channel crossings have increased by more than 10%, then one more pass of superpositioning improvement is carried out.

After superpositioning, the interchange techniques outlined earlier (FIG. 22, block 83) are employed, with the center of the macro models of components being used as the point from which distances associated with nets are calculated. The constants in Eqs. (8) and (9) are multiplied by the scaling factor since distances are increased by that amount. Weighting of locations on the periphery of the card is carried out in a manner similar to that on the unit image and is assigned the scaled-up weight (twice the original value because scaling is by 2 for the example being outlined). Also in the probability function for fitting (Eq. (16)), the weights are proportionately scaled up, by the scale factor.

Because the sizes of the macro components can vary considerably, the pairwise interchange process is different than as described for unit model optimization in the following manner. Cost is evaluated as shown earlier, i.e., Eq. (3). For each pair, the cost is calculated for the current locations, then each component is removed from the image and both components are mapped down in the other's location. Cost in these new positions is calculated and if improvement in the weighted distance occurs, the interchange is carried out. If during this interchange phase, components overlap some other components, the interchange is not carried out. For example, in FIG. 38A, component 2 should interchange with component 9. However, when component 2 is mapped down into the component 9 location, it overlaps component 10. Therefore, this interchange is not carried out.

As a second example, component 2 and component 1 can be interchanged by the process outlined above. Both areas occupied by 1 and 2 are blanked out and components 2 and 1 can be replaced in the same area without overlapping any other component. Thus, this interchange will be carried out.

As part of the interchange process, components are "interchanged" with free area (if it exists) inside the window to see if a cost reduction results, and if so, the component will be placed that new location. For example, component 7 can also fit one unit to the left or one unit down, so the cost of these two locations is computed, and the location with the least cost of the three is selected.

To summarize, pairwise interchange for the macro model involves the steps of evaluating cost in the current location for a component, calculating its zero center, checking the candidate location area, picking up a component in that area, if any, blanking out the current locations of both components, and if a swap is possible, calculating the costs of interchange and replacing if the weighted costs improve. The weighted costs are calculated as before in Eq. (3).

It will also be noted that the interchange algorithms for the macro model may be modified to permit faster interchange of the same size macro components. For example, the macro model of components 1, 7, 11, 10, 12 are the same size so they can be interchanged without going through the blanking out portion of the mapping phase and checking whether interchange is possible. Another advantage of macro modelling apart from the reduction in the size of the placement problem is that even though the actual dimensions of components 1, 7, 10, 11 and 12 are slightly different, their macro model dimensions are the same, allowing interchange of any of these components with each other to be easily accomplished at the macro model level.

Figure 39:
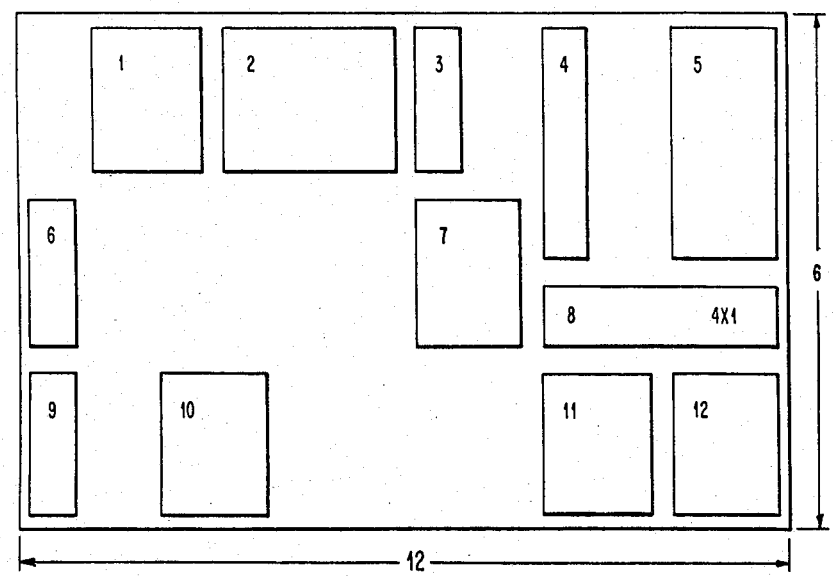
FIG. 39 illustrates a final placement of macro model components.
Figure 45B:
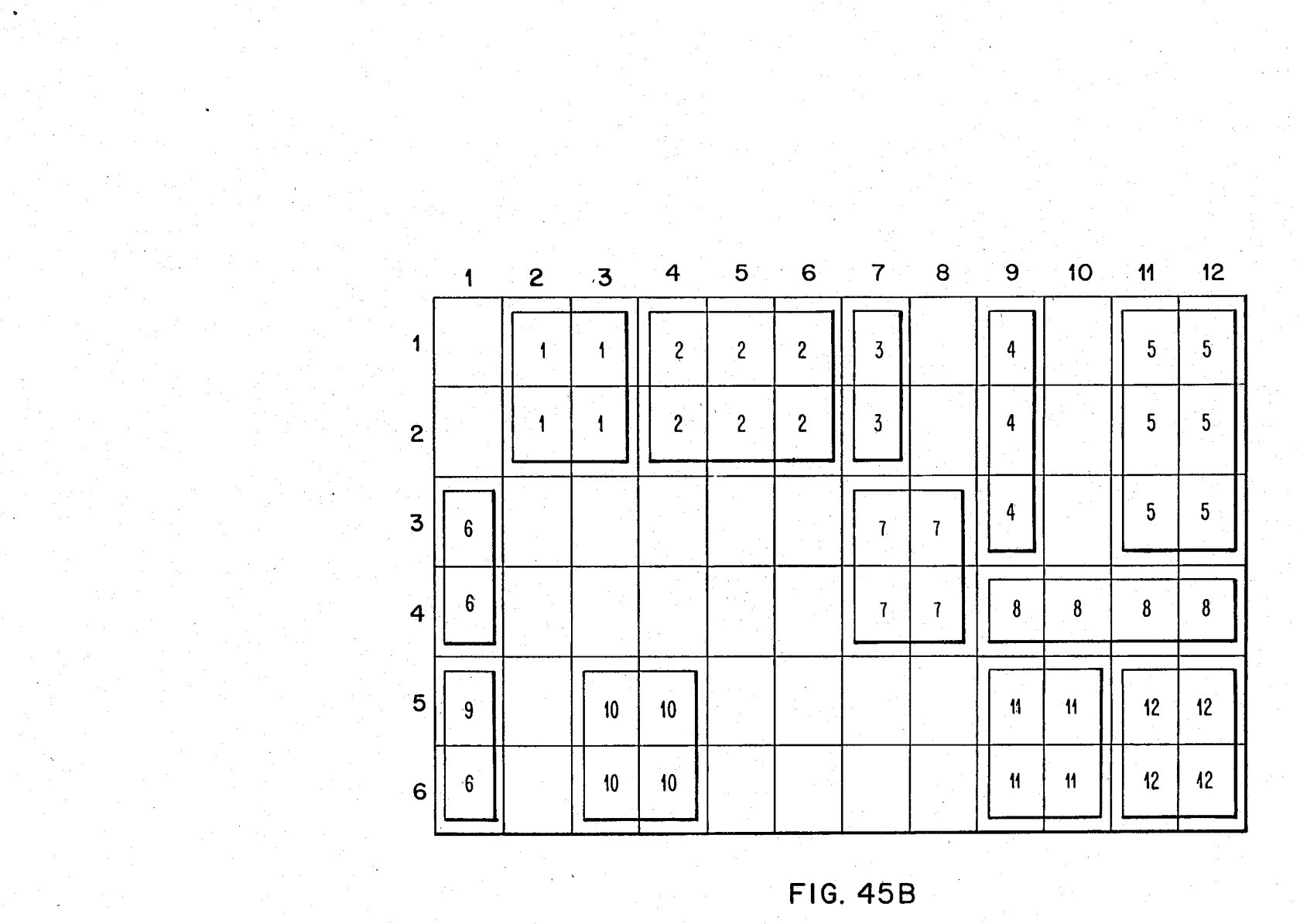

Several passes of pairwise interchange are carried out in the manner described above for unit size optimization (FIG. 31), and a final placement is obtained. Final placement for the twelve component example is shown in FIGS. 39 and 45B.

Figure 41:
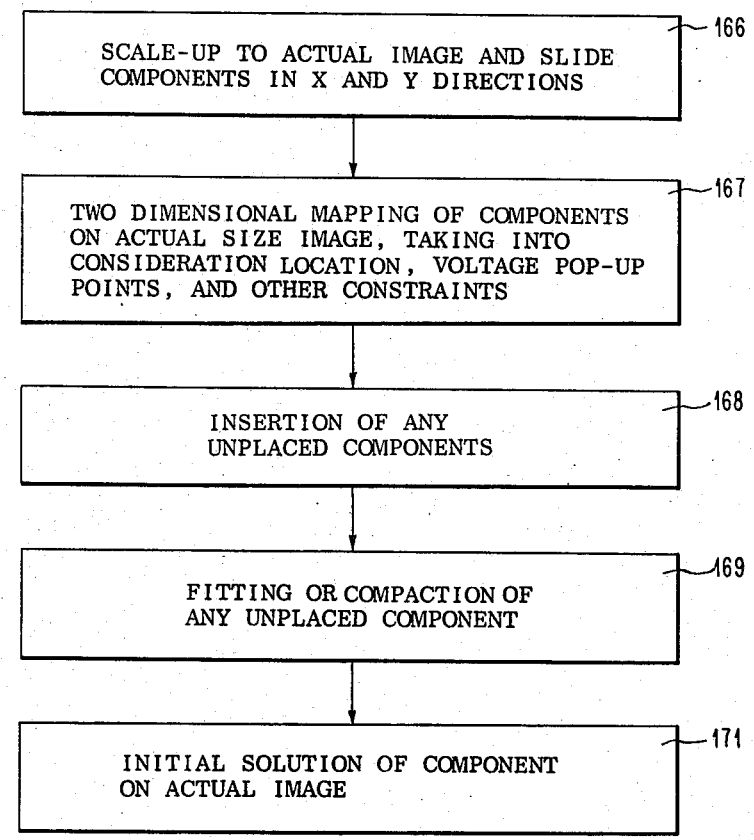
FIG. 41 illustrates location generation for actual model initial placement.

After iterative improvement, locations for actual size initial placement are generated, in a manner similar to that described in FIG. 22, block 84 for the macro model. FIG. 41 illustrates the steps for location generation for the actual model initial placement. Referring to FIG. 41, the steps include scaling up to the actual image and sliding in X and Y directions (block 166), two dimensional mapping on to the actual size image (block 167), insertion of unplaced components (block 168), fitting of uplaced components (block 169) and generating an initial solution (block 171). Since the steps of FIG. 41 have much in common with the steps performed during location generation for macro model initial placement (FIG. 34), only the differences will be described here.

During sliding in the X-Y direction in the macro model phase, components were permitted to have tentative locations fall outside the desired macro model image. However, during sliding in the X-Y direction in the actual image phase (FIG. 41, block 166), components are not permitted to have locations outside the actual image but are permitted to have overlaps. This overlap is handled during the mapping phase, or during insertion and fitting or compaction steps described subsequently with respect to blocks 167, 168, 169, respectively.

The tentative locations on the actual image are generated in a manner similar to those described above for the macro model. First, scaling up is carried out from macro model to actual image (block 166). The results are presented in FIG. 42A, and the locations are shown pictorially in FIG. 42B.

Figures 43, 44:
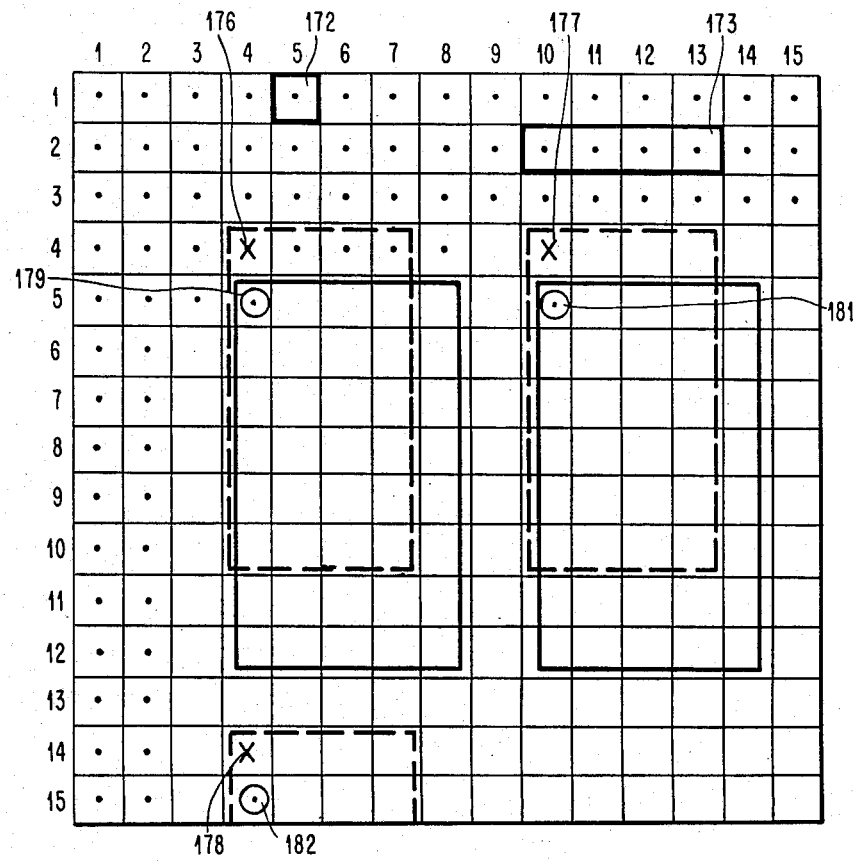
FIG. 43 illustrates sliding of actual size components.
FIG. 44 illustrates assigning an area to grid points on a card.

The next step is sliding in the X direction (block 166). As was done in block 127 (FIG. 34) for macro model sliding, a list of components across a row is generated, empty space and overlap conditions if any are generated and sliding in the X direction is carried out. For example, across the first row, the starting location of component 5 is column 41 in the X direction (FIG. 42A). Based on its actual dimension (FIGS. 24 and 43) of 10 units, part of component 5 lies outside the image, so inward sliding is performed. A new location is generated as shown in FIG. 43. Then subsequent rows are analyzed and components are moved as required.

Then, sliding in the Y direction is carried out. For this example, there are no overlaps in Y direction so the sliding process is terminated. Otherwise, steps similar to those outlined for macro model Y direction sliding (FIG. 34, block 128) are carried out. The final tentative locations are presented in FIG. 43.

Referring again to FIG. 41, the next step is two dimensional mapping of components on the actual image (block 167). This mapping is similar to macro model mapping as described with regard to block 129 of FIG. 34. During this mapping, test point areas and reserved areas (FIG. 9) are made unavailable for placement. Constraints related to preplaced components (FIG. 9) and voltage pop-up points (FIG. 7) on the image are taken into consideration as explained below. Also, as part of the input information, the user may have specified that certain size components can only be placed beginning in certain locations on the grid (FIG. 3 and FIG. 44). Algorithms for handling this constraint are described below.

Each grid point shown in FIG. 3 is assigned an area surrounding it by drawing lines halfway between each pair of grid points (see FIG. 44 at 172). Only obout one-fourth of the total image is shown in FIG. 44. When the component size is 1×1, it occupies an area as shown in FIG. 44 at 172. Similarly, for a component of size 4×1, the area highlighted in FIG. 44 at 173 (4 columns×1 row) is occupied.

Also, for a component, the user may have defined locations (see FIG. 44 at 176, 177, 178) where a particular size of component has to be placed. For different sizes of components, locations can be specified across the card. This location can be such that they can overlap other sized components' locations (e.g., FIG. 44 at 179, 181, 182). Mapping ensures that there is no overlap when the components are placed.

The steps involved in mapping are described below. Mapping involves generating an order of components based on row position on the macro model image and mapping the component onto the actual image without violating the constraints of placement by moving it within a boundary if necessary.

First, an order of components to be placed is generated. This is done by scanning across each row of the macro model image starting in the upper left corner and adding components to the list one by one. Since a component may occupy one or more rows above or below the row being scanned, the component is added to the list only once, i.e., the first time it is encountered during the scanning of some row. For example, referring to FIG. 45B, components 1, 2, 3, 4 and 5 are picked from the first row, then no new components appear in the second row. Components 6 and 7 are added across the third row, component 8 in the fourth row, components 9, 10, 11 and 12 in the fifth row, and no new components are added in the sixth row.

If there is any reserved area specified as part of the input, then that area on the image is marked as unavailable. Similarly, test point rows and columns are marked unavailable (see FIG. 9).

For mapping, all preplaced components are initially mapped down on the image based on their specified starting locations and their X-Y dimensions. All grid points occupied by preplaced components are flagged as to the number of that component. An example of two dimensional mapping on the grid is shown in FIG. 45A for component 1 based on its size. This two dimensional mapping helps reduce the computer time required to search for what is next to the component's four sides and is very useful in the steps of insertion and fitting described below.

Components are now selected one at a time from the ordered list of components to be placed generated above. Each component is given a location on the actual grid based on the tentative locations generated previously. Checking is performed to see if placing the component violates any constraints (preplaced components, voltage pop-ups, reserved areas, test points, etc.). If a violation occurs, then a search within a window for a valid location is performed. If no valid locations are found, the component will be placed during insertion and fitting, as described below.

Thus, from the ordered list outlined above, component 1 is to be assigned a location on the actual grid based on the tentative location generated earlier (FIG. 43). The upper left corner of component 1 is at column, row coordinate 5, 1 and the lower right corner is at 11, 9. The area on the image between these two opposite corners has to be available for placing the component. Except for blockages and any preplaced components, all the points are available initially on the grid. A search is carried out from the starting location to check all grid points to be occupied for availability.

If there are any voltage pop-up points then the following steps are carried out. First, the location of all the pins for the component are created based on the desired starting location for the component. Then, all these locations are checked against a list of locations associated with the voltage pop-up points. If any mismatch between voltage value associated with a grid location occurs, then the component cannot be placed based on tentative target location. Also, if any blocked area is encountered, then the component cannot be placed in the tentative target location.

If a list of desired locations has been specified as part of the user input information, then a check is made whether the nearest available location is within a window (described below). If there are several locations available within the window, the location nearest to the tentative location is picked. If a location is not available within the window, the component remains unplaced and is placed during the insertion and fitting phases described below (FIG. 41, blocks 168, 169).

If there is not enough available area based on the target location or if a component violates the voltage pop-up constraint, then a search is carried out in a window which extends one-half the X and Y dimension of the component in each direction. The window is enlarged in −X, −Y, +X, +Y directions by one unit at a time and each location is checked to see if placing a component at that location violates any of the constraints. If a valid location is found, it is the location from which the component is mapped. Otherwise, it is placed during the insertion and fitting phases described below.

The above steps are repeated for all the components based on their order. All unplaced components are placed during the insertion and fitting phases, described below.

Figure 45C:
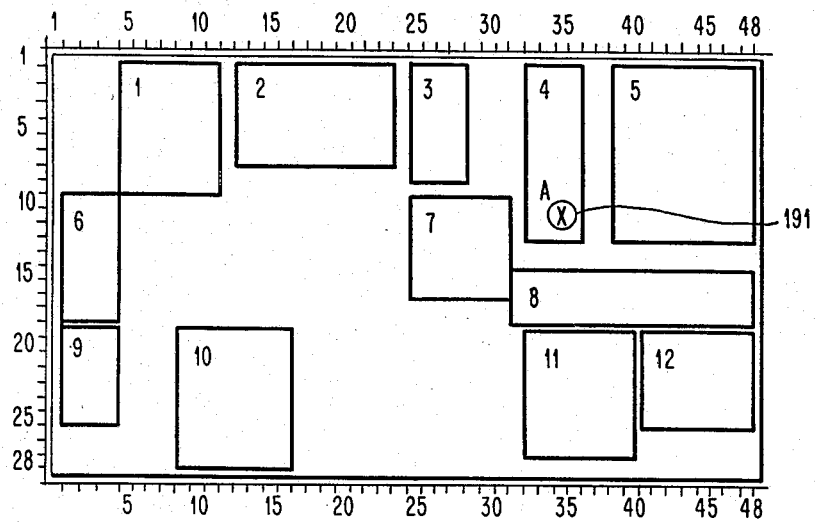
FIG. 45C illustrates the placement of components on the actual size image.

In the example of the twelve component problem, all components are placed based on their tentative locations according to the steps outlined above. The two dimensional mapping of three components is shown pictorially in FIG. 45A. Only about one-fourth of the actual image is shown. A grid free placement of all components on the actual image is shown in FIG. 45C. Initial placement for the twelve component problem is shown in FIG. 45C, accurately represents the actual sizes of components.

The insertion and fitting steps described with regard to FIG. 41, blocks 168 and 169, respectively, are used only if there are any unplaced components after the above described mapping steps (FIG. 41, block 167). The insertion and fitting steps are also used for placement of smaller components removed initially from the component mix. During insertion and fitting, all the constraints observed during two dimensional mapping are observed, e.g., all preplaced components are kept fixed and not moved. Cost calculations as described below are based on the pin positions of the components. Eq. (3) is used for the calculations, and as before, only those nets containing a connection to an already placed component or I/O are considered.

Figure 47:
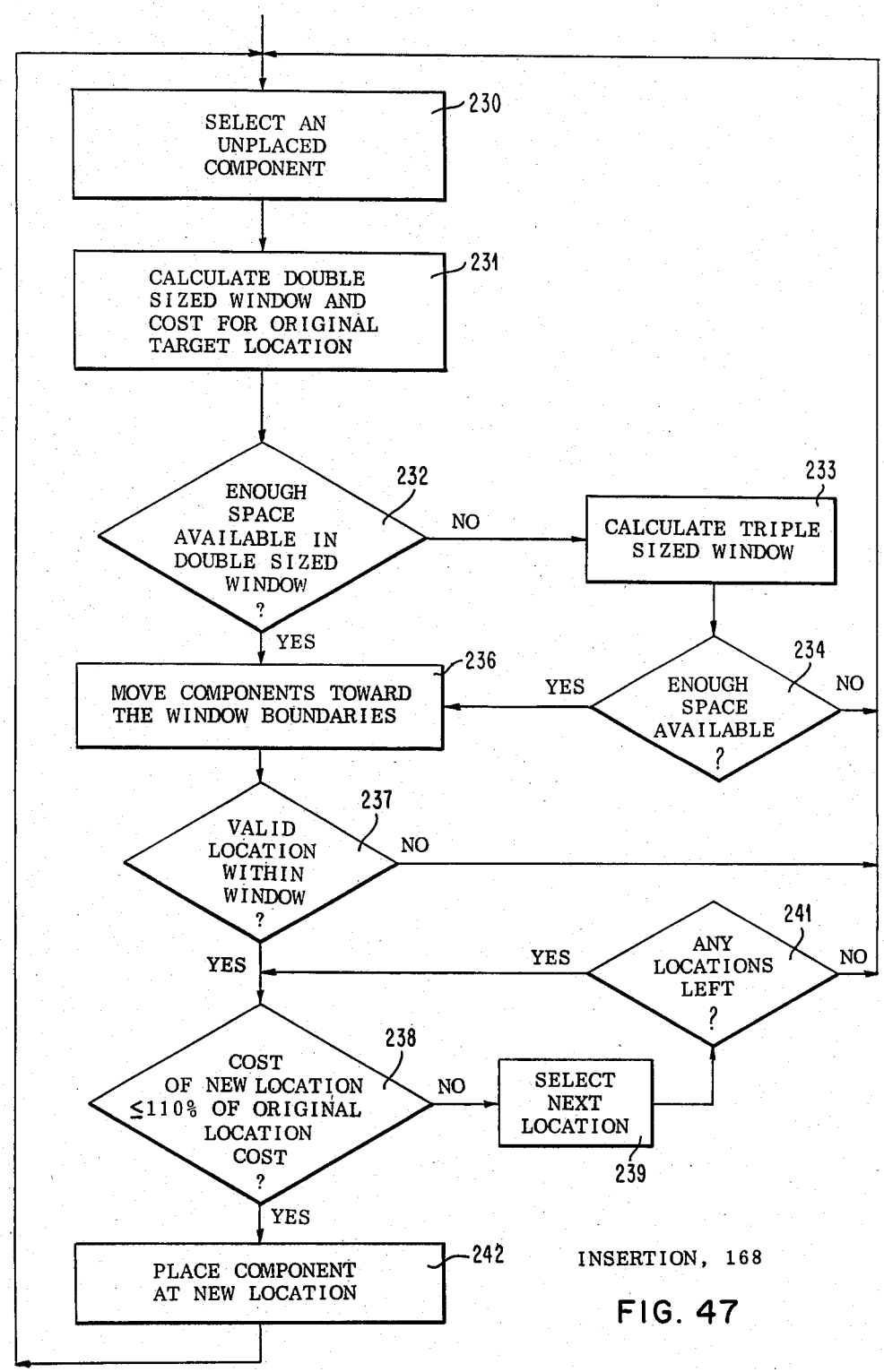
FIG. 47 illustrates the steps performed in insertion of components.

Referring to FIG. 47, insertion is the step of looking for available space in a window (described below) around the target location of an unplaced component and moving other components towards the boundary of the window, away from the target location to create space to place the component. The cost of moving components towards the boundary is determined to decide whether a component can move or not. If insertion for a component fails, then the next step of fitting or compaction is used, as described with regard to block 169.

The order in which the unplaced components are selected for placement (block 230) is the original order created during expansion from macro model placement to actual image placement. The first step in insertion is evaluating the cost of placing the unplaced component in its target location (block 231). The component is not actually placed, only its cost is calculated.

Figure 46A:
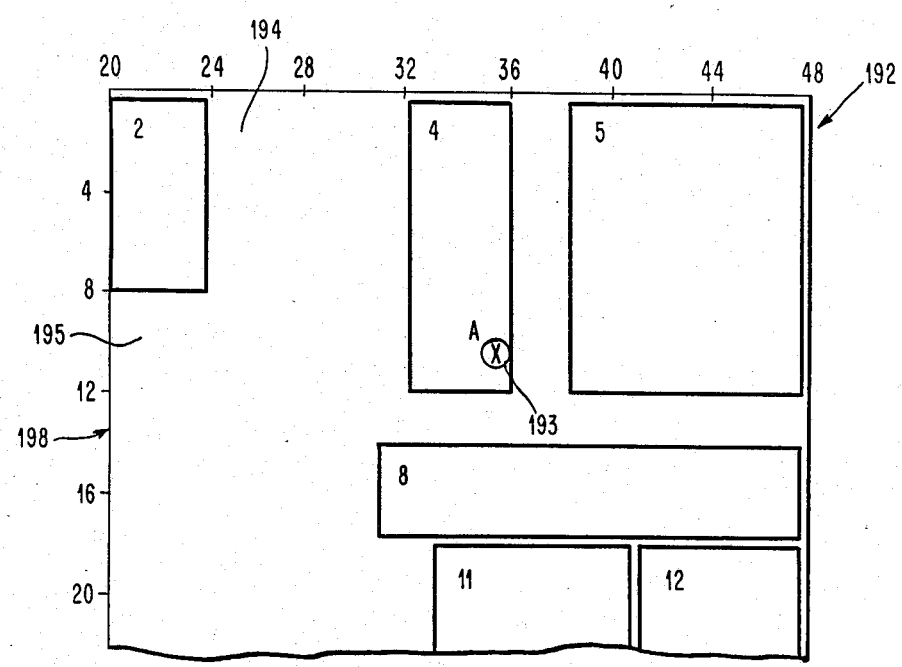
FIGS. 46A and 46B illustrate the removal and insertion of components.

To illustrate the above described first step, assume that component A with a size of 7×7 at target location column 36 and row 9, could not be placed during the above described initial mapping phase (see FIG. 45C at 191). Then, the cost of placing it in that target location is calculated based on its connections to placed components. A window twice the size of the component in the X-Y direction from its target location (FIG. 46A at 193) is generated. Thus, for the above example, the upper left corner of the window is at column 22, row 1 and the lower right corner is at column 48, row 23. The window is outlined in FIG. 46A at 192.

Referring again to FIG. 47, all available locations within the window are counted (block 232), and if the total number of available locations within the window is less than that required to place the component, the window is enlarged to three times the components dimension (block 233). If still there is insufficient space (block 234), the component remains unplaced for now (it will be placed during the fitting step described later) and the next component in the list is selected for processing (block 230).

If enough space was counted as available for placing the component, within either the double or triple sized window, a search is carried out (block 237) to determine whether the contiguous area required to place the component is available. If the required contiguous area is not available, then the steps outlined below for moving components toward the boundary (block 236) are carried out. If contiguous area is available and if the component can be placed there without violating any constraints, then the cost of placing the component in that location is calculated (block 238). If this cost is less than 110% of the cost calculated for the target location, the component is placed there (block 242) and the steps outlined in FIG. 47 for the next unplaced component are followed. If the cost is greater than 110% of the target location cost, then other locations within the window are processed similarly until none are left (block 241). If the component is still unplaced, then the steps outlined below for moving components toward the boundary are carried out.

Within the window 192, the components are moved toward the four boundaries, one boundary at a time to create space for the component to be placed (block 236). The first move is toward left boundary, then the right boundary, then the upper boundary and finally the lower boundary. Two lists are created as described below to facilitate the insertion of components.

In the movement toward left boundary (FIG. 46A at 198), a list of components placed to the left of target point (column 36) is generated. If half a component's area falls within that boundary, then it is included in the list. For example, in the boundary from FIG. 46A at 198 to 193, components 3, 4 and 7 (see FIG. 45B) are candidates for movement. Component A is also added to this list. This list will hereafter be called list Q.

Between the boundaries for the left side movement, each row is searched to create a list of components to be moved during the first pass. At the appearance of the first component that has not been moved during this pass, the search is terminated for that row, and the component is added to another list called list P. This list is for the components to be moved first toward the left boundary. Thus, for the above example, components 3 and 7 are in list P. The cost of their current placement is calculated and stored for comparison as shown later. The area occupied by them is blanked out, so any component in list Q can occupy these positions (see FIG. 46A at 194, 195).

The cost of placing components (block 238) in the first available position from the left most boundary of the window is calculated for the components in list Q. Eq. (3) is utilized and all locations as per placement after mapping are used. If sufficient area is available in the window for placing the components, the cost for them is calculated. Other components will be assigned twice the target location cost. To this cost from Eq. (3), the Manhattan distance cost between the pin positions of the target location and the new location is added. The purpose in adding this additional Manhattan distance cost is to keep the components as close as possible to their original location, since optimization has been done previously. The sum of these costs are hereinafter called the moving cost. These costs are divided by the component's original cost calculated earlier before moving. The component with the lowest value is picked as a candidate for occupying that position. Also, if the cost increase is greater than 10% (block 238) the move is rejected and the steps are repeated for the next available location (block 239) for the components in list Q. If a valid location for a component is found based on cost, then the component is placed. The above steps are repeated until the target location (column 36) is reached or earlier if all components are placed. If a component other than that in list P is placed, then the original area occupied by the component is blanked out.

Figure 46B:
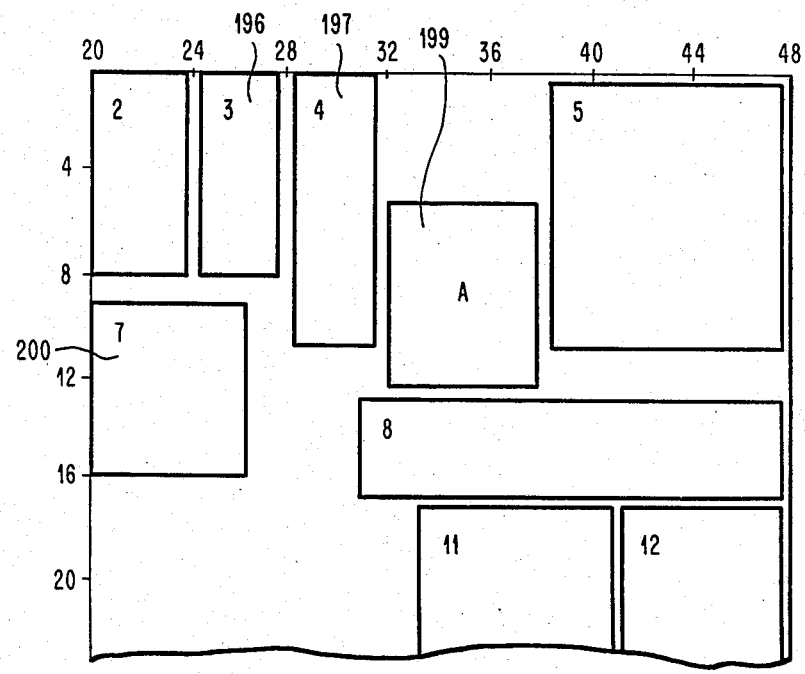

Based on the above process, component 7 occupies the position shown in FIG. 46B at 200. It is removed from the list Q and list P. Costs for the rest of the components in list Q are recalculated based on this new position of component 7.

These steps are then repeated for the components in list Q. Component 3 gets placed by similar steps in the location shown by FIG. 46B at 196. It is removed from list Q and list P. There are now no components in list P.

List P is again generated. Only component 4 is the candidate for movement toward left. From list Q (components 4 and A), the steps outlined above are repeated. Component 4 moves to the new location shown in FIG. 46B at 197. By this movement, enough space has been created for component A. Cost for placing it in the available location is calculated and if it is within 110% of the cost based on its tentative location, it is placed in that location. The location chosen for it is shown in FIG. 46B at 199.

Assume that component A was still unplaced. Then movement toward the right boundary starts. The steps similar to those outlined above for movement toward left boundary are carried out. If the component is still unplaced, then movements toward the upper and lower boundaries are carried out in a similar manner, if necessary.

At the end of the above described movement in four directions, if a component is still unplaced, then the window is enlarged to three times the component size. Components are also allowed to rotate in their permissible rotations and the lowest cost rotation is used. The increase in cost of moving is also permitted to go up to 15%. All the above steps are repeated once with this enlarged window. If all components are placed during the above described process, then the next step of fitting is not carried out.

Referring again to FIG. 41, fitting (block 169) is similar to insertion (block 168) except that the entire image on the card is the window. Rotation is carried out and cost per component movement is permitted to increase by 20%. Two passes of this technique are carried out, if necessary. Most of the time, the combination of insertion and fitting allows all components to be placed. If not, the steps from mapping (block 167) are repeated based on largest component first, and then the next smaller component, etc. The above steps are repeated and generally all components are placed by this procedure. If unplaced components remain, they will be handled during the final stages of actual size optimization described below.

The steps outlined in FIG. 41 have been completed and the results are as shown in FIG. 45C. An initial placement of all components considered through modelling has been achieved on the actual image (block 171).

8. Placement Optimization: Actual Size

Figure 48:
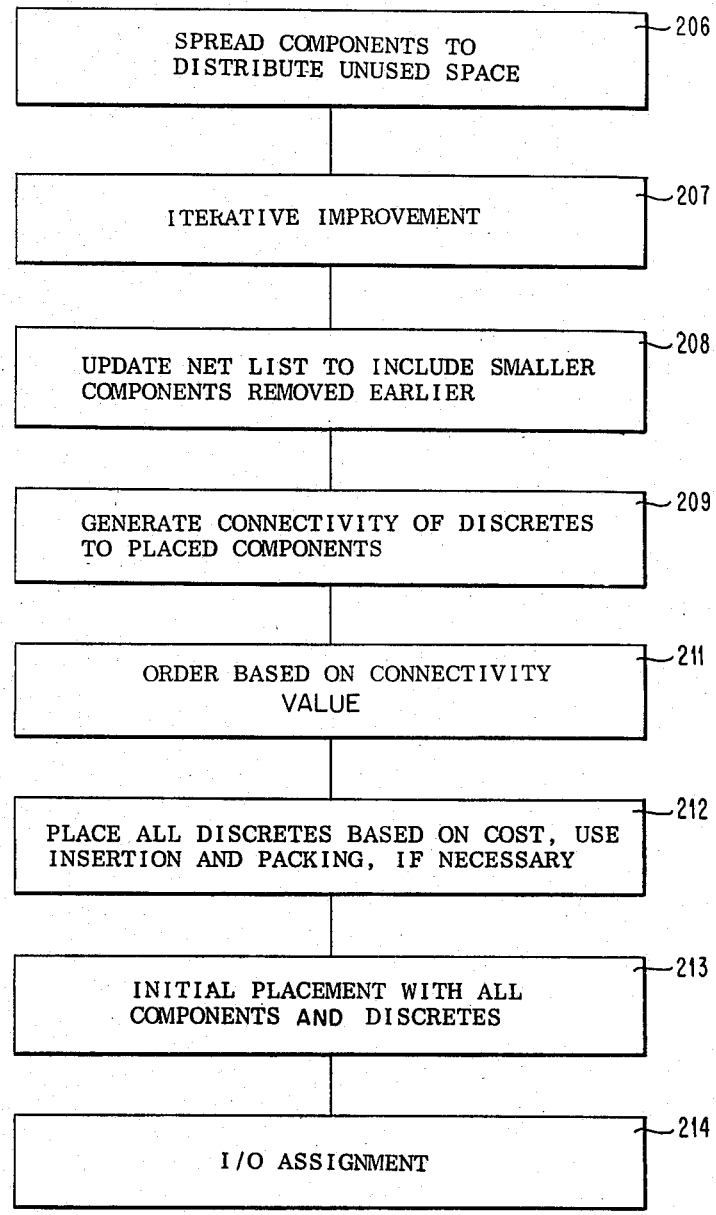
FIG. 48 illustrates steps for placement of optimization of the actual size model.

Referring again to FIG. 2, the initial solution for the actual size model is optimized. FIG. 48 describes the steps performed during actual size placement optimization. These steps include spreading of components (block 206), interchange of components (block 207), introducing the original net list to place smaller components (block 208), generating their order based on connectivity to placed components (blocks 209 and 211), placement based on cost and using insertion and fitting if required (block 212) and assignment of I/O's (block 214). Each step is described in detail below.

Spreading of components (block 206) is similar to the steps described with regard to sliding in X and Y direction (FIG. 34, blocks 127 and 128, respectively). Instead of removing the overlap as in sliding, the goal here is to distribute empty space between components based on their size and slide or rearrange locations of components based on moving cost. This step is repeated two times. All constraints observed during mapping are also observed here. Moving cost can be no greater than 115% of the cost in current location. Spreading helps in two ways. It helps in overall wiring at the final step by providing space where needed and also helps during placement of smaller components by providing room for them. The first direction is rowwise, and space in the X direction is distributed. The next direction is columnwise, and space in the Y direction is distributed.

More particularly, spreading is accomplished by determining the number of free slots available across a row and number of components in that row. For example, in FIG. 45C, there are twelve slots and five components. Then, the sum of their X sizes is evaluated (FIG. 49 at 204). Next, using the formula shown in FIG. 49 at 203, the empty space which needs to be associated with each component (FIG. 49 at 216) based on their sizes is calculated. The average desired space (FIG. 49 at 217) to be left empty for a boundary between two components based on empty space values (FIG. 49 at 216) is then calculated. These average values (FIG. 49 at 219) are summed. If the sum is less than the total available space then the leftover empty space is distributed to the components one at a time by adding it to the smallest value first and in case there is still a tie, it is allocated to a pair of components whose sum of X dimensions are greater and if there is a tie, then an arbitrary choice is made. The final desired distribution based on the above steps is shown in FIG. 49 at 218.

Moving cost in the desired location is calculated in the manner described above. If it is greater than 115% of the cost (Eq. (3)) in the current location, the move is rejected and the next location in the X direction is tried, until the cost is within desired limits. Then that move is accepted.

Thus, referring back to the twelve component example (FIG. 45C), component 1 will move to the corner based on moving cost, components 2 and 3 will also rearrange themselves with the desired space between them. If component 4 had to move four locations to the left, the movement would be blocked because component 7 will be in the way. Component 4 will move only one location to the left and will move again in the next pass after component 7 has moved to the left in the subsequent steps. Components moved during a pass are not moved again in that pass.

Figure 50:
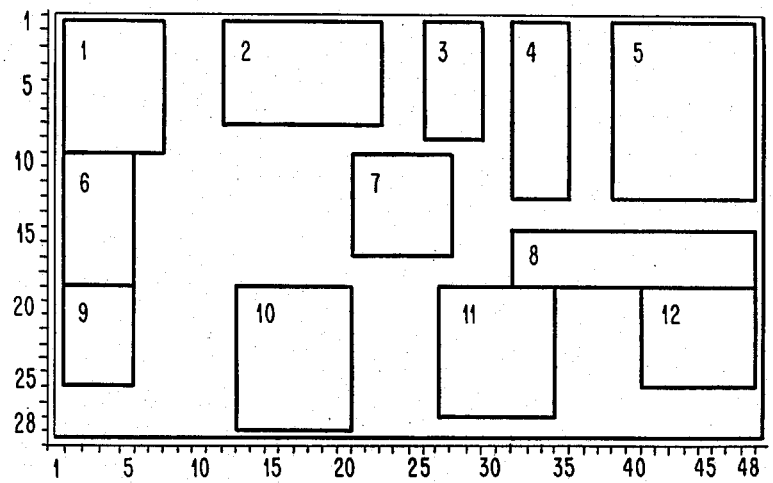
FIG. 50 illustrates a tentative placement of actual size components.

Proceeding one row at a time, components 6 and 7, which have not been moved are encountered. There are four components across that row, and the steps outlined above are carried out. Component 7 may move only four slots based on moving cost. Then components 9, 10, 11, 12 are analyzed and they are rearranged, based on cost of moving. A tentative placement after this move is shown in FIG. 50.

Figure 51:
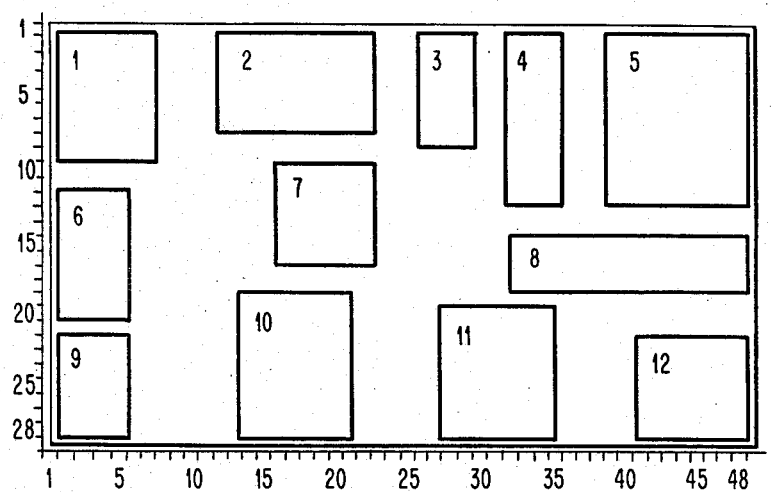
FIG. 51 illustrates a final placement of actual size components.

Similarly, movement in the Y direction will be carried out, then the movement in X and Y direction is repeated. The final placement after these steps is shown in FIG. 51.

Wireability evaluation of this placement is then carried out. Crossing cuts, total length, horizontal and vertical utilization, Hwt and Vwt are calculated as described above. This is carried out to evaluate the quality of placement. As mentioned above, all pin positions associated with components are used.

Referring again to FIG. 48, improvement by iterative technique is carried out (block 207). The techniques described above for the macro model are used. The type 1 formula is used for cost evaluation. Only one pass is carried out to optimize this placement. If the perturbation during mapping and insertion, fitting and spreading has increased the channel crossing utilizations by more than 10% as evaluated during the wireability analysis, then an additional pass with a type 2 interchange is carried out.

Referring again to FIG. 48, the net list is updated (block 208) to bring in any smaller components removed earlier (FIG. 10 at 37). Based on this original net list, a connectivity matrix (FIG. 18A) is generated in a similar fashion for components (FIG. 48 at 209). The rows in the connectivity matrix for placed components are discarded. Rows for unplaced components are analyzed and the maximum value (FIG. 18A at 58) and its highly connected component (FIG. 18A at 59) is generated. To this maximum value (FIG. 18A at 58), a value based on the size of the component is added to it, to give preference to larger components to be placed first since most of the area has already been used up by other components. This value is calculated by dividing the size of the component by the scale factor (4 in this case) used to generate the macro model of components (FIG. 14). Then, the list is sorted as shown in FIG. 18B, to accomplish the ordering step of block 211.

Referring to block 211, one component is picked at a time from the ordered list. The zero center of gravity (FIG. 30) for it is calculated as outlined above. The cost of placing the component at the zero center is calculated using a minimum spanning tree. A list of available positions is generated within a window (5×5) and enlarged if necessary as described above. The cost of placing the component in all permissible rotations in this list of locations is calculated. The location with the least cost is picked as the target location. This least cost is compared with the zero center location cost calculated above. If this cost is higher by more than 25%, then the steps of insertion and fitting are used as necessary to find a better location for the component.

Figure 52:
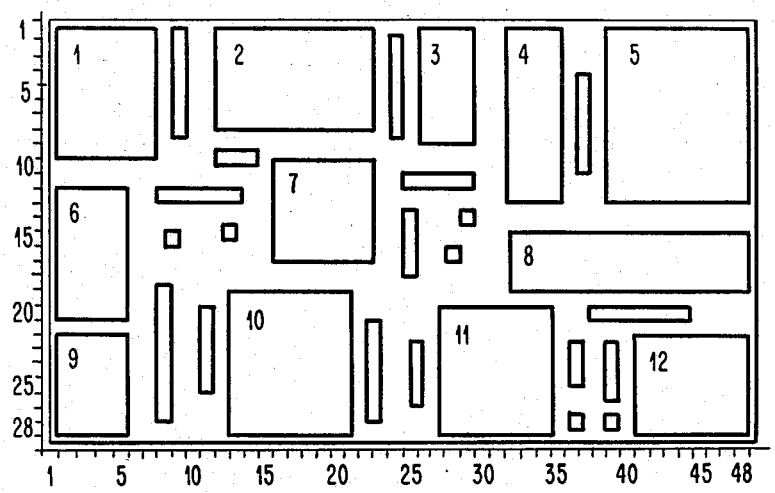
FIG. 52 illustrates a tentative placement with all components placed.

Using this technique, all ordered smaller components are placed (FIG. 48, block 212). This provides an initial placement with all components placed (FIG. 48, block 213). A pictorial view is shown in FIG. 52.

Now the next step of I/O assignment (FIG. 48, block 214) is carried out using a linear assignment technique. The principle behind linear assignment is to find the solution to the assignment problem such that the total cost (i.e., the sum of the costs of each individual assignment) is minimized.

Some nets need to be connected to voltage I/O's (I/O's that will plug into a voltage on the next level package). Groups of such I/O's are formed and each net requiring a voltage I/O is assigned an I/O from these groups. Whenever a net has been assigned an I/O, the I/O is used in all cost calculations (see Eq. (3)) for determining wireability.

This completes the steps outlined in FIG. 48. Placement optimization for the actual size model continues with the steps described in FIG. 53. These steps include spreading (block 221), iterative improvement (block 222), and generating information for final placement (block 226). Each of these steps is described in detail below.

Referring now to FIG. 53, spreading of components to distribute empty space (block 221) is carried out only if the fitting procedure was utilized. This spreading technique has been described above. Wireability analysis is carried out to evaluate crossing cuts, etc. I/O locations assigned during linear assignment are used.

Then, iterative improvement is utilized (block 222). One pass of type 1 and type 2 interchanges as outlined during macro model optimization are used. This is carried out because the smaller components have been introduced in the previous steps (FIG. 48) and the placement has to be optimized based on the expanded net list and I/O assignments. After each pass of interchange, the I/O's are linearly assigned.

Referring again to FIG. 53, the final step (block 226) is that of generating information on a final output data set to be used in subsequent steps described in FIG. 1. The output file consists of row and column locations and rotation codes for each component, and physical I/O locations associated with each net requiring an I/O. This information is used for wiring the card based on placement and in the automatic or manual insertion used to place components on cards.

An element placement program which produces a final placement of a plurality of different size electronic elements on a next level electronic package has been described. The element placement program of the present invention is superior to known element placement programs in that the final placement obtained is indeed optimal in terms of component fit and conformance to design rules, while at the same time the final placement is efficiently obtained, in terms of computer running time, even for a large number of elements. Optimal placement and computer utilization efficiency are obtained as a result of the multiple pass process described above because the element placement program need not take all the dimensional characteristics of the elements into account at once. Rather, in the unit model stage, the dimensional characteristics of the elements are disregarded. Then, at the macro model stage, the dimensional characteristics are approximated. Finally, the exact dimensional characteristics are taken into account at the actual size model stage.

It will be recognized by those having skill in the art that improved placement and improved computer utilization efficiency may be obtained with a two pass element placement method. Thus, for example, a two pass method may employ a macro model which roughly approximates the dimensional characteristics, and an actual size model. Alternatively, a two pass method may include a unit model which disregards dimensional differences, and an actual size model. While a two pass placement method will not be as efficient as a three pass method (unit, macro and actual model) it will still be an improvement over prior art single pass techniques.

It will also be recognized by those having skill in the art that many of the optimization techniques which are used at each modelling stage of the element placement program, (e.g., the techniques of constructive placement, pairwise interchange, etc.) are well known techniques which have been heretofore used for element placement optimization. In the preferred embodiment these techniques are modified and combined as described herein, in order to obtain improved placements with the three pass method. However, it will be recognized that at each pass, well known optimization techniques can be employed in lieu of or in addition to the optimization techniques described herein. Further, any known placement optimization technique may be improved by employing the technique in a three pass process including unit, macro and actual size models according to the invention.

Finally, it will be recognized by those having skill in the art that although the invention has been described with regard to the placement of different size electronic elements on a next level electronic package, it is also applicable to many commercial and industrial situations wherein a plurality of interrelated elements are formed into a structural pattern within the confines of a predetermined array. In any such application, the use of unit, macro and actual size models will improve the final placement and improve efficiency.

While the present invention has been particularly shown and described with reference to the preferred embodiments thereof, it will be understood by those skilled in the art that various changes in form and details may be made therein without departing from the spirit and scope of the invention.

We claim:

1. A method of assigning a plurality of different size elements having predetermined interconnection requirements thereamong to element positions in an array of element positions, comprising the steps of:

forming unit and actual size models of said plurality of different size elements, and unit and actual size models of said array of element positions, each unit size model element having an identical size, each actual size model element having the same size as its corresponding one of said plurality of different size elements, the unit size model array being sufficiently large to accommodate all the unit size model elements, and the actual size model array being the same size as said array of element positions;

assigning said unit size model elements to element positions on the unit size model array according to said predetermined interconnection requirements;

replacing the assigned unit size model elements with corresponding actual size model elements, assigned to corresponding positions on said actual size model array; and rearranging the assigned positions of said actual size model elements on said actual size model array to accommodate the actual sizes thereof.

2. A method of assigning a plurality of different size elements having predetermined interconnection requirements thereamong to element positions in an array of element positions, comprising the steps of:

forming macro and actual size models of said plurality of different size elements, and macro and actual size models of said array of element positions, each macro size model element having a size which is approximately proportional to that of the corresponding one of said plurality of different size elements, each actual size model element having the same size as the corresponding one of said plurality of different size elements, the macro size model array being sufficiently large to accommodate all the macro size model elements, and the actual size model array being the same size as said array of element positions;

assigning said macro size model elements to element positions on the macro size model array according to said predetermined interconnection requirements;

replacing the assigned macro size model elements with corresponding actual size model elements, assigned to corresponding positions on said actual size model array; and rearranging the assigned positions of said actual size model elements on said actual size model array to accommodate the actual sizes thereof.

3. The method of claim 1 or 2 wherein the step of rearranging the assigned positions of said actual size model elements is followed by steps of:

placing said plurality of different size elements on said array of element positions in the rearranged positions of said actual size model elements on said actual size model array.

4. The method of claim 1 or 2 wherein said method is practiced by an element placement program operating in conjunction with a digital computer.

5. The method of claim 1 or 2 wherein said plurality of different size elements are electronic elements and wherein said array of element positions is on a next level electronic package.

6. A method of assigning a plurality of different size elements having predetermined interconnection requirements thereamong, to element positions in an array of element positions, comprising the steps of:

forming unit, macro and actual size models of said plurality of different size elements, and unit, macro and actual size models of said array of element positions, each unit size model element having an identical size, each macro size model element having size which is roughly proportional to that of the corresponding one of said plurality of different size elements, each actual size model element having the same size as the corresponding one of said plurality of different size elements, the unit size model array being sufficiently large to accommodate all the unit size model elements, the macro size model array being sufficiently large to accommodate all the macro size model elements, and the actual size model array being the same size as said array of element positions;

assigning said unit size model elements to element positions on the unit size model array according to said predetermined interconnection requirements;

replacing the assigned unit size model elements with corresponding macro size model elements, assigned to corresponding positions on said macro size model array;

rearranging the assigned positions of said macro size model elements on said macro size model array to accommodate the macro sizes thereof;

replacing the assigned macro size model elements with actual size model elements, assigned to corresponding positions on said actual size model array; and rearranging the assigned positions of said actual size model elements on said actual size model array to accommodate the acutal sizes thereof.

7. The method of claim 6 wherein the step of rearranging the assigned positions of said actual size model elements is followed by the steps of:

placing said plurality of different size elements on said array of element positions in the rearranged positions of said actual size model elements on said actual size model array.

8. The method of claim 6 wherein said method is practiced by an element placement program operating in conjunction with a digital computer.

9. The method of claim 6 wherein said plurality of different size elements are electronic elements and wherein said array of element positions is on a next level electronic package.

10. A method of assigning a plurality of different size elements having a predetermined relationship thereamong to element positions in an array of element positions, comprising the steps of:

forming a plurality of identical unit size elements each corresponding to one of said plurality of different size elements;

assigning said unit size elements to element positions in said array of element positions in accordance with said predetermined relationship;

replacing said assigned unit size elements with said corresponding different size elements; and rearranging the assigned different size element positions in said array of element positions to accommodate the exact sizes of said different size elements.

11. A method of assigning a plurality of different size elements having a predetermined relationship thereamong to element positions in an array of element positions, comprising the steps of:

forming a plurality of macro size elements each having a size approximately proportional to that of a corresponding one of said different size elements;

assigning said macro size elements to element positions in said array of element positions in accordance with said predetermined relationship;

replacing said assigned macro size elements with said corresponding different size elements; and rearranging the assigned different size element positions in said array of element positions to accommodate the exact sizes of said different size elements.

12. A method of assigning a plurality of different size elements having a predetermined relationship thereamong to element positions in an array of element positions, comprising the steps of:

forming a plurality of identical unit size elements each corresponding to one of said plurality of different size elements;

assigning said unit size elements to element positions in said array of element positions in accordance with said predetermined relationship;

replacing said assigned unit size elements with a plurality of macro size elements each having a size approximately proportional to that of a corresponding one of said different size elements;

rearranging the assigned unit size element positions in said array of element positions to accommodate said macro size elements; and rearranging the assigned macro size element positions in said array of element positions to accommodate the exact sizes of said different size elements.

13. The method of claim 10, 11, or 12 wherein said method is practiced by an element placement program operating in conjunction with a digital computer.

14. The method of claim 10, 11 or 12 wherein said plurality of different size elements are electronic elements and wherein said array of element positions is on a next level electronic package.

15. A method of placing a plurality of different size electronic elements having predetermined interconnection requirements thereamong, on a next level electronic package having a plurality of element positions thereon, comprising the steps of:

forming unit and actual size models of said electronic elements, and unit and actual size models of said next level electronic package, each unit size element having an identical size, each actual size element having the same size as its corresponding electronic element, the unit size model of said next level package being sufficiently large to accommodate all the unit size elements, and the actual size model of said next level package being the same size as said next level electronic package;

optimizing the placement of said unit size elements on the unit size model of said next level package;

placing the actual size elements on the actual size model of said next level package in element positions corresponding to the optimized placement positions of the unit size elements of the unit size model of said next level package; and optimizing the placement of said actual size elements on said actual size model of said next level package.

16. A method of placing a plurality of different size electronic elements having predetermined interconnection requirements thereamong, on a next level electronic package having a plurality of element positions thereon, comprising the steps of:

forming macro and actual size models of said electronic elements, and macro and actual size models of said next level electronic package, each macro size element having a size which is approximately proportional to that of the corresponding electronic element, each actual size element having the same size as its corresponding electronic element, the macro size model of said next level package being sufficiently large to accommodate all the macro size elements, and the actual size model of said next level package being the same size as said next level package;

optimizing the placement of said macro size elements on the macro size model of said next level package;

placing the actual size elements on the actual size model of said next level package in element positions corresponding to the optimized placement positions of the macro size elements on the macro size model of said next level package; and optimizing the placement of said actual size elements on said actual size model of said next level package.

17. The method of claim 15 or 16 wherein the step of optimizing the placement of said actual size elements is followed by the step of:

placing said plurality of different size electronic elements on said next level electronic package in element positions corresponding to the optimized positions of said actual size elements on said actual size model of said next level package.

18. The method of claim 15 or 16 wherein said method is practiced by an element placement program operating in conjunction with a digital computer.

19. The method of claim 15 or 16 wherein said plurality of different size electronic elements are discrete and integrated circuit electronic components and wherein said next level electronic package is a single or multiple layer card.

20. The method of claim 15 or 16 wherein said plurality of different size electronic elements are single or multiple layer cards upon which discrete and integrated circuits are mounted and wherein said next level electronic package is a motherboard.

21. The method of claim 15 or 16 wherein said plurality of different size electronic elements are groups of interrelated electronic circuits and wherein said next level electronic package is an integrated circuit chip.

22. The method of claim 15 or 16 wherein said plurality of different size electronic elements are groups of interrelated electronic circuits and wherein said next level electronic package is a semiconductor wafer.

23. A method of placing a plurality of different size electronic elements having predetermined interconnection requirements thereamong, on a next level electronic package having a plurality of element positions thereon, comprising the steps of:

forming unit, macro and actual size models of said electronic elements, and unit, macro and actual size models of said next level electronic package, each unit size element having an identical size, each macro size element having a size which is approximately proportional to that of the corresponding electronic element, each actual size element having the same size as its corresponding electronic element, the unit size model of said next level package being sufficiently large to accommodate all the unit size elements, the macro size model of said next level package being sufficiently large to accommodate all the macro size elements, and the actual size model of said next level package being the same size as said next level package;

optimizing the placement of said unit size elements on the unit size model of said next level package;

placing the macro size elements on the macro size model of said next level package in element positions corresponding to the optimized placement positions of the unit size elements on the unit size model of said next level package;

optimizing the placement of said macro size elements on said macro size model of said next level package;

placing the actual size elements on the actual size model of said next level package in element positions corresponding to the optimized placement positions of the macro size elements on the macro size model of said next level package; and optimizing the placement of said actual size elements on said actual size model of said next level package.

24. The method of claim 23 wherein the step of optimizing the placement of said actual size elements is followed by the step of:

placing said plurality of different size electronic elements on said next level electronic package in element positions corresponding to the optimized positions of said actual size elements on said actual size model of said next level package.

25. The method of claim 23 wherein said method is practiced by an element placement program operating in conjunction with a digital computer.

26. The method of claim 23 wherein said plurality of different size electronic elements are discrete and integrated circuit electronic components and wherein said next level electronic package is a single or multiple layer card.

27. The method of claim 23 wherein said plurality of different size electronic elements are single or multiple layer cards upon which discrete and integrated circuits are mounted and wherein said next level electronic package is a motherboard.

28. The method of claim 23 wherein said plurality of different size electronic elements are groups of interrelated electronic circuits and wherein said next level electronic package is an integrated circuit chip.

29. The method of claim 23 wherein said plurality of different size electronic elements are groups of interrelated electronic circuits and wherein said next level electronic package is a semiconductor wafer.

30. The method of claim 23 wherein the actual size model of said next level electronic package is formed from input data including the horizontal and vertical dimensions of said next level electronic package, and the location of input/output vias in a grid, the grid of vias defining said plurality of element placement positions on the next level electronic package, and wherein the actual size model of each electronic element is formed from input data including the horizontal and vertical dimensions and pin locations for each electronic element.

31. The method of claim 23 wherein the step of placing the macro size elements on the macro size model of said next level package is followed by the step of sliding the placed macro size elements in the horizontal and vertical directions to eliminate overlap of adjacent macro size elements.

32. The method of claim 23 wherein the step of optimizing the placement of said macro size elements on said macro size model of said next level package comprises the step of rearranging the initial placement of the macro size elements by means of superpositioning and pairwise interchange iterative improvement techniques.

33. The method of claim 23 wherein the step of optimizing the placement of said actual size elements on said actual size model of said next level package comprises the step of rearranging the initial placement of the actual size elements by means of pairwise interchange iterative improvement techniques.

34. The method of claim 33 wherein the step of forming unit, macro and actual size models of said electronic elements, and unit, macro and actual size models of said next level electronic package are preceded by the step of:

deleting small elements from the set of actual size elements from which the unit and macro size models of said electronic elements are formed.

35. The method of claim 34 wherein the step of optimizing the placement of said actual size elements on said actual size model of said next level package includes the step of optimizing the placement of said small elements along with the actual size elements on said actual size model of said next level package.

36. The method of claim 23 wherein the step of placing the actual size elements on the actual size model of said next level package is followed by the step of sliding the placed actual size elements in the horizontal and vertical directions to eliminate overlap of adjacent actual size elements.

37. The method of claim 36 wherein the sliding step is followed by the step of spreading the actual size elements to distribute unused space therebetween.

38. The method of claim 23 wherein the unit size model for each electronic element is formed by assigning each unit size element the horizontal and vertical dimension of one unit, and wherein the unit size model for said next level electronic package is formed by dividing the horizontal and vertical dimension of the actual size next level electronic package by the average horizontal and vertical dimension, respectively, of the actual size electronic elements.

39. The method of claim 38 wherein the macro size model for each electronic element is formed by assigning each macro size element the horizontal and vertical dimensions of its corresponding actual size electronic element, divided by a scale factor, and wherein the macro size model for said next level electronic package is formed by multiplying the horizontal and vertical dimensions of said unit size model of said next level package by the average horizontal and vertical dimension, respectively, of the macro size elements.

40. The method of claim 39 wherein said scale factor is the most common horizontal or vertical dimension of said actual size elements.

41. The method of claim 23 wherein the step of optimizing the placement of said unit size elements on the unit size model of said next level package comprises the steps of:
   ordering the unit size elements as a function of their connectivity to other elements; and
   constructively placing the unit size elements on the unit size model of said next level package in the order of their connectivity, with the most highly connected element being placed first.

42. The method of claim 41 wherein the step of constructively placing the unit size elements comprises the steps of:
   placing the most highly connected element at a predetermined location on the unit size model of said next level package;
   calculating the cost of placing the second most highly connected element at an element position near the already placed element;
   placing the second most highly connected element at the element position where cost is lowest; and
   repeating the calculating and placing steps for the remaining unit size elements; in the order of their connectivity.

43. The method of claim 41 wherein the step of optimizing the placement of said unit size model of said elements on the unit size next level package further comprises the step of:
   rearranging the constructive placement by means of superpositioning.

44. The method of claim 43 wherein the step of superpositioning comprises performing the following steps for each unit size element, in the order of their connectivity:
   forming a window on a blank unit image, the window being centered around the zero center of gravity of the placed unit size element on the unit size model of said next level package;
   calculating the cost of placing the unit size element at element positions in said window; and
   placing the unit size element at the element position where cost is lowest.

45. The method of claim 43 wherein the step of optimizing the placement of said unit size elements on the unit size model of said next level package further comprises the step of:
   rearranging the constructive placement by means of pairwise interchange iterative improvement.

* * * * *